(12) United States Patent
Seo et al.

(10) Patent No.: US 11,024,364 B2
(45) Date of Patent: Jun. 1, 2021

(54) SENSE AMPLIFIERS FOR SENSING MULTILEVEL CELLS AND MEMORY DEVICES INCLUDING THE SAME

(71) Applicant: Samsung Electronics Co., Ltd., Suwon-si (KR)

(72) Inventors: Young-Hun Seo, Hwaseong-si (KR); Dong-Il Lee, Hwaseong-si (KR); Hye-Jung Kwon, Seoul (KR)

(73) Assignee: Samsung Electronics Co., Ltd.

( * ) Notice: Subject to any disclaimer, the term of this patent is extended or adjusted under 35 U.S.C. 154(b) by 96 days.

(21) Appl. No.: 16/555,089

(22) Filed: Aug. 29, 2019

(65) Prior Publication Data
US 2020/0143869 A1 May 7, 2020

(30) Foreign Application Priority Data

Nov. 7, 2018 (KR) .................. 10-2018-0136036
Mar. 12, 2019 (KR) .................. 10-2019-0028258

(51) Int. Cl.
| | | |
|---|---|---|
| *G11C 11/40* | (2006.01) | |
| *G11C 11/4091* | (2006.01) | |
| *G11C 11/56* | (2006.01) | |
| *G11C 11/4093* | (2006.01) | |
| *G11C 7/06* | (2006.01) | |

(52) U.S. Cl.
CPC ........ *G11C 11/4091* (2013.01); *G11C 11/565* (2013.01); *G11C 7/06* (2013.01); *G11C 7/065* (2013.01); *G11C 11/4093* (2013.01)

(58) Field of Classification Search
CPC ... G11C 11/4091; G11C 11/4093; G11C 7/06; G11C 7/065; G11C 7/10
See application file for complete search history.

(56) References Cited

U.S. PATENT DOCUMENTS

| | | |
|---|---|---|
| 5,917,748 A | 6/1999 | Chi et al. |
| 7,133,311 B2 | 11/2006 | Liu |
| 7,460,387 B2 | 12/2008 | Matick et al. |
| 7,567,452 B2 | 7/2009 | Song et al. |
| 7,821,858 B2 | 10/2010 | Matick et al. |
| 7,835,208 B2 | 11/2010 | Song |
| 7,969,794 B2 | 6/2011 | Kang et al. |
| 8,773,925 B2 | 7/2014 | Koya et al. |
| 9,478,277 B1 | 10/2016 | Liu |
| 9,728,243 B2 | 8/2017 | Kato |

(Continued)

*Primary Examiner* — Han Yang
(74) *Attorney, Agent, or Firm* — Myers Bigel, P.A.

(57) ABSTRACT

There are provided a sense amplifier for sensing a multilevel cell and a memory device including the same. The sense amplifier is configured to sense the most significant bit (MSB) and the least significant bit (LSB) of 2-bit data a cell voltage stored in a memory cell as the most significant bit (MSB) and the least significant bit (LSB) of 2-bit data. The sense amplifier senses the MSB of the 2-bit data in a state in which a bit line is electrically disconnected from a holding bit line of the sense amplifier and senses the LSB of the 2-bit data in a state in which the cell bit line is electrically connected to the holding bit line. The sense amplifier is configured to equalize a pair of bit lines of the sense amplifier before sensing the MSB and the LSB of the 2-bit data. The sense amplifier is configured to restore to the memory cell the cell voltage corresponding to the sensed MSB and LSB of the 2-bit data.

20 Claims, 65 Drawing Sheets

(56) References Cited

U.S. PATENT DOCUMENTS

| | | |
|---|---|---|
| 10,049,720 B2 | 8/2018 | Tanaka et al. |
| 2007/0195619 A1* | 8/2007 | Rhie .................... G11C 11/404 |
| | | 365/200 |
| 2008/0080260 A1* | 4/2008 | Seong ................. G11C 7/1048 |
| | | 365/189.05 |
| 2019/0189192 A1* | 6/2019 | Kim .................... G11C 11/4093 |

* cited by examiner

SENSE AMPLIFIERS FOR SENSING MULTILEVEL CELLS AND MEMORY DEVICES INCLUDING THE SAME

CROSS-REFERENCE TO RELATED APPLICATIONS

This application claims the benefit of Korean Patent Application Nos. 10-2018-0136036 and 10-2019-0028258, respectively filed on Nov. 7, 2018 and Mar. 12, 2019, in the Korean Intellectual Property Office, the disclosures of which are incorporated by reference herein in their entireties.

TECHNICAL FIELD

The present disclosure relates to semiconductor memory devices, and more particularly, to sense amplifiers configured to sense a cell voltage stored in a memory cell as multi-bit data, and memory devices including the same.

BACKGROUND

Dynamic random access memories (DRAM) write and read data as charges stored in a cell capacitor of memory cell. Increasing demands for high capacity of the DRAM has generated interest in the development of a multilevel cell for storing data of no less than 2 bits, that is, multi-bit data in a single DRAM cell.

SUMMARY

The inventive concepts provide a sense amplifier configured to sense a cell voltage that is stored in a memory cell as multi-bit data, and memory devices including the same.

Some aspects of the inventive concepts provide a sense amplifier including at least one sense amplifying circuit for sensing a least significant bit (LSB) and a most significant bit (MSB) of 2-bit data corresponding to a cell voltage stored in a memory cell, latching the sensed LSB to a pair of first sensing bit lines, and latching the sensed MSB to a pair of second sensing bit lines; and a switching circuit for selectively connecting a cell bit line to which the memory cell is connected, bit lines of the pair of first sensing bit lines, and bit lines of the pair of second sensing bit lines. The sense amplifier is configured to sense the MSB of the 2-bit data using a charge stored in a holding bit line of the sense amplifier in a state in which the cell bit line is electrically disconnected from the holding bit line, and is configured to sense the LSB of the 2-bit data using charges stored in the cell bit line and the holding bit line in a state in which the cell bit line is electrically connected to the holding bit line.

Some aspects of the inventive concepts, provide a sense amplifier including at least one sense amplifying circuit for sensing a LSB and a MSB of 2-bit data corresponding to a cell voltage stored in a memory cell, latching the sensed LSB to a pair of first sensing bit lines, and latching the sensed MSB to a pair of second sensing bit lines; and also including a switching circuit connected to a cell bit line to which the memory cell is connected and the at least one sense amplifying circuit, with the switching circuit including a bit line switch for selectively connecting the cell bit line and a holding bit line, a complementary bit line switch for selectively connecting a complementary bit line and a complementary holding bit line, a first switch for selectively connecting the holding bit line and a first sensing bit line, a second switch for selectively connecting the complementary holding bit line and a first complementary sensing bit line, a third switch for selectively connecting the holding bit line and the first complementary sensing bit line, a fourth switch for selectively connecting the complementary holding bit line and the first sensing bit line, a fifth switch for selectively connecting the first sensing bit line and a second sensing bit line, and a sixth switch for selectively connecting the first complementary sensing bit line and a second complementary sensing bit line.

Some aspects of the inventive concept, provide a sense amplifier including a first sense amplifying circuit for sensing a LSB and a MSB of 2-bit data corresponding to a cell voltage stored in a memory cell, latching the sensed LSB to a pair of first sensing bit lines, and latching the sensed MSB to a pair of second sensing bit lines; and a switching circuit for selectively connecting bit lines of the pair of first sensing bit lines and bit lines of the pair of second sensing bit lines. The sense amplifier is configured to equalize the pair of first sensing bit lines to a pre-charge voltage level corresponding to half of a power voltage level provided to the sense amplifier before sensing the MSB of the 2-bit data, and is configured to equalize the pair of first sensing bit lines to the pre-charge voltage level before sensing the LSB of the 2-bit data.

According to an aspect of the inventive concept, there is provided a sense amplifier including at least one sense amplifying circuit for sensing a least significant bit (LSB) and a most significant bit (MSB) of 2-bit data corresponding to a cell voltage stored in a memory cell, latching the sensed LSB to a pair of first sensing bit lines, and latching the sensed MSB to a pair of second sensing bit lines; and also including a switching circuit including a first switch for selectively connecting a cell bit line to which a memory cell is connected and a first sensing bit line, a second switch for selectively connecting a complementary bit line and a first complementary sensing bit line, a third switch for selectively connecting the cell bit line and the first complementary sensing bit line, a fourth switch for selectively connecting the complementary bit line and the first sensing bit line, a fifth switch for selectively connecting the first sensing bit line and a second sensing bit line, and a sixth switch for selectively connecting the first complementary sensing bit line and a second complementary sensing bit line.

According to some aspects of the inventive concepts, a memory device may include a memory cell configured to store a cell voltage represented as 2-bit data, a sense amplifier connected between a cell bit line to which the memory cell is connected and a complementary bit line and configured to sense from the cell voltage a MSB and a LSB of the 2-bit data, and data output circuitry configured to output the sensed MSB and LSB of the 2-bit data through at least one data pad. The sense amplifier may configured to sense the MSB of the 2-bit data in a state in which the cell bit line is electrically disconnected from a holding bit line of the sense amplifier using a charge stored in the holding bit line, and may be configured to sense the LSB of the 2-bit data in a state in which the cell bit line is electrically connected to the holding bit line using charges stored in the cell bit line and the holding bit line.

According to some aspects of the inventive concepts, a memory device may include a memory cell configured to store a cell voltage represented as 2-bit data, a sense amplifier connected between a cell bit line to which the memory cell is connected and a complementary bit line and configured to sense from the cell voltage a MSB and a LSB of the 2-bit data, and data output circuitry configured to output the sensed MSB and LSB of the 2-bit data through at least one data pad. The sense amplifier may be configured to equalize a pair of sensing bit lines of the sense amplifier to a pre-charge voltage level before sensing the MSB and LSB of the 2-bit data.

BRIEF DESCRIPTION OF THE DRAWINGS

Embodiments of the inventive concepts will be more clearly understood from the following detailed description taken in conjunction with the accompanying drawings in which.

DETAILED DESCRIPTION

Figure 1:
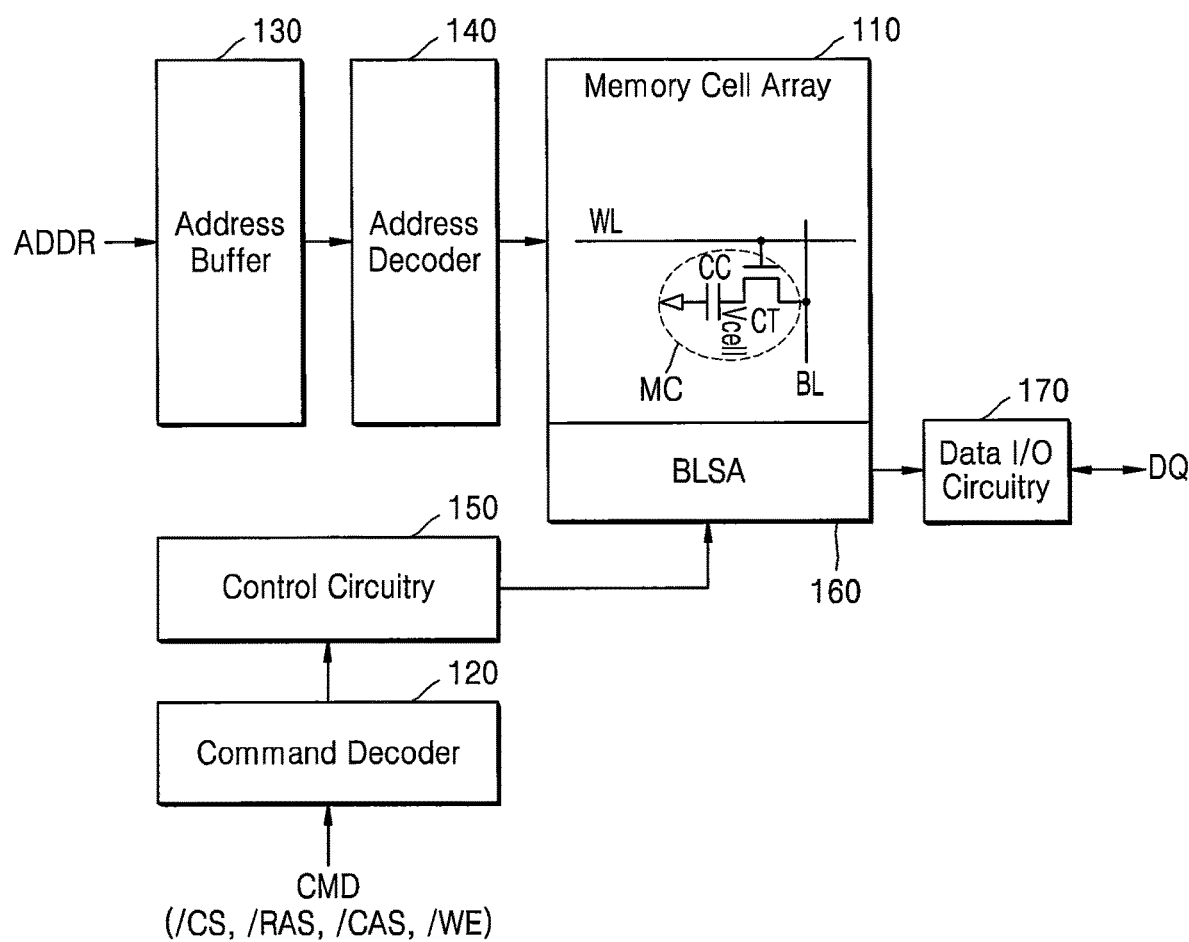
FIG. 1 is a view illustrating a memory device according to some embodiments of the inventive concepts.

FIG. 1 is a view illustrating a memory device 100 according to some embodiments of the inventive concepts.

Referring to FIG. 1, the memory device 100 may be implemented by dynamic random access memory (DRAM) configured to sense a cell voltage Vcell stored in a memory cell MC as multi-bit data. The memory device 100 may be referred to as multilevel DRAM. The multilevel DRAM may be applied to a memory device such as synchronous DRAM (SDRAM), double data rate SDRAM (DDR SDRAM), low power double data rate SDRAM (LPDDR SDRAM), graphics double data rate SDRAM (GDDR SDRAM), DDR2 SDRAM, DDR3 SDRAM, or DDR4 SDRAM.

The memory device 100 may input and output data DQ in response to a command CMD and an address ADDR received from an external device, for example, a central processing unit (CPU) or a memory controller. For example, the memory device 100 may be controlled by the external device, CPU, or the memory controller to input and output data DQ. The memory device 100 may include a memory cell array 110, a command decoder 120, an address buffer 130, an address decoder 140, a control circuitry 150, a sense amplifier 160, and a data input and output circuitry 170.

The memory cell array 110 includes a plurality of memory cells MCs, which may be for example provided in a two-dimensional matrix arranged in rows and columns. The memory cell array 110 includes a plurality of word lines WLs and a plurality of bit lines BLs that are connected to the memory cells MCs. Each of the memory cells MCs includes a cell transistor CT and a cell capacitor CC. A gate of the cell transistor CT is connected to one of the word lines WLs arranged in a row direction of the memory cell array 110. One end of the cell transistor CT is connected to one of the bit lines BLs arranged in a column direction of the memory cell array 110. The other end of the cell transistor CT is connected to the cell capacitor CC. The cell capacitor CC may store charges of various capacities corresponding to multi-bit data, for example, 2-bit data. The cell capacitor CC may be restored with an amount of charge that corresponds to a capacity of each of the multi-bit data items, that is, the cell capacitor CC may be restored to the cell voltage Vcell.

The memory cell MC may store the cell voltage Vcell having a magnitude that specifies the 2-bit data in the cell capacitor CC. The cell voltage Vcell may represent 2-bit data formed of a first bit, which may be a most significant bit (MSB), and a second bit, which may be a least significant bit (LSB). Although the present disclosure primarily provides examples of 2-bit data, in some embodiments, the memory cell MC may store multi-bit data of more than 2 bits, and may store n-bit data, where n is a number greater than 2.

The command decoder 120 determines the command CMD input with reference to a chip selection signal/CS, a low address strobe signal/RAS, a column address strobe signal/CAS, and a write enable signal/WE that are applied from the external device. The command decoder 120 may generate control signals corresponding to the command CMD. The command CMD may include an active command, a read command, a write command, and a pre-charge command, as examples.

The address buffer 130 receives the address ADDR applied from the external device. The address ADDR includes a row address for addressing a row of the memory cell array 110 and a column address for addressing a column of the memory cell array 110. The address buffer 130 may transmit the row address and the column address to the address decoder 140.

The address decoder 140 may include a row decoder and a column decoder for selecting a word line WL and a bit line BL of the memory cell MC that is to be accessed in response to the input address ADDR. The row decoder decodes the row address and may enable the word line WL of the memory cell MC corresponding to the row address. The column decoder decodes the column address and may provide a column selection signal CSL (FIG. 17A) for selecting the bit line BL of the memory cell MC corresponding to the column address.

The control circuitry 150 controls the sense amplifier 160 in accordance with control of the command decoder 120. The control circuitry 150 may control the sense amplifier 160 during a sequence of operations in which the sense amplifier 160 senses the cell voltage Vcell of the memory cell MC. The control circuitry 150 may control the sense amplifier 160 and accordingly, the sense amplifier 160 may sequentially perform a pre-charging operation, an offset removing operation, an MSB sense operation, an LSB sense operation, and a restoring operation. The control circuitry 150 may selectively turn on/off components of the sense amplifier 160, such as those illustrated in the example embodiment of FIG. 4, that is, first and second sense amplifying circuits 410 and 420 and a plurality of switches SWa, SWb, SW10, and SW1 to SW6 in accordance with operation of the sense amplifier 160.

The sense amplifier 160 may sense a charge that is stored in the memory cell MC as the 2-bit data. The sense amplifier 160 senses the LSB of the 2-bit data, senses the MSB of the 2-bit data, and may restore the bit line voltage generated in accordance with a combination of the sensed MSB and LSB in the memory cell as the cell voltage. In addition, the sense amplifier 160 may transmit the sensed 2-bit data externally from the memory device 100 via the data input and output circuitry 170 through data DQ pad(s).

The data input and output circuitry 170 may receive the data DQ to be written in the memory cells MCs from the external device (for example) and may transmit the received data DQ to the memory cell array 110. The data input and output circuitry 170 may output the 2-bit data sensed by the sense amplifier 160 as read data through the data DQ pad(s). According to an embodiment, the data input and output circuitry 170 may serially output the MSB and then the LSB of the sensed 2-bit data to the outside through one data DQ pad. In some embodiments, the LSB and then the MSB of the 2-bit data may be serially output through the data DQ pad. In some embodiments, the data input and output circuitry 170 may output the sensed 2-bit data in parallel through two data DQ pads. For example, the MSB may be output through a first data DQ_MSB pad and the LSB may be output through a second data DQ_LSB pad.

Hereinafter, a configuration and operation of the sense amplifier 160 will be described in detail through various example embodiments.

Figure 2:
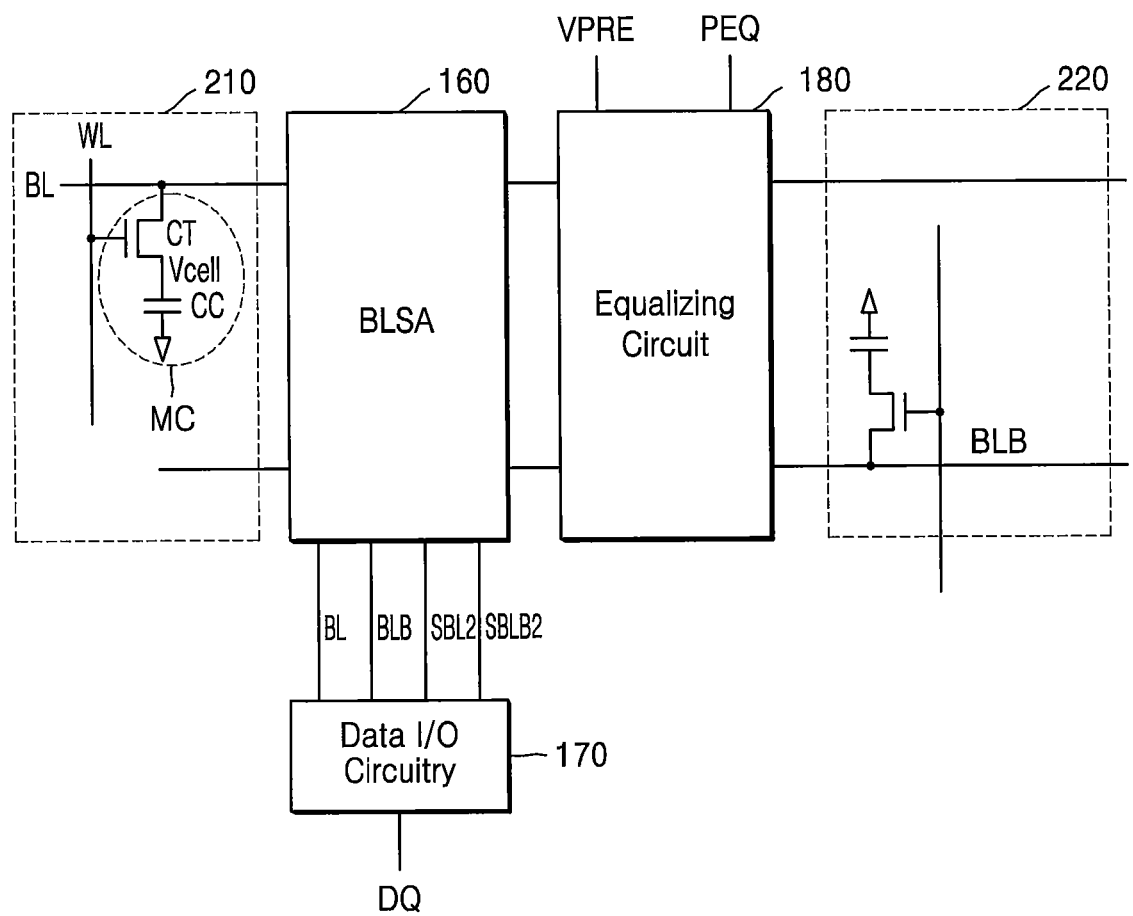
FIG. 2 is a view illustrating a memory cell of FIG. 1 and a sense amplifier of an open bit line structure.

FIG. 2 is a view illustrating the memory cell of FIG. 1 and a sense amplifier 160 of an open bit line structure.

Referring to FIG. 2, the sense amplifier 160 may be connected to the memory cell MC and an equalizing circuit 180 through a pair of bit lines BL and BLB. As described further herein, the equalizing circuit 180 may be configured to equalize the pair of bit lines BL and BLB (FIG. 4) or a pair of first sensing bit lines SBL1 and SBSB1 (FIG. 15A) with a pre-charge voltage VPRE in response to an equalizing signal PEQ. The equalizing signal PEQ may be provided by the control circuitry 150 in accordance with a pre-charge command (e.g., a pre-charge command CMD decoded by the command decoder 120). The pre-charge voltage VPRE may be set to have a level corresponding to a half of a level of a power voltage VINTA driving the sense amplifier 160. For example, when the power voltage VINTA is 1.0 V, the pre-charge voltage VPRE may be set as about 0.5 V.

The sense amplifier 160 is configured in an open bit line structure and is connected to the memory cell MC. In the open bit line structure, the pair of bit lines BL and BLB are separately positioned in different adjacent main cell blocks 210 and 220. In the open bit line structure, when the word line WL of the selected memory cell MC is enabled, the data of the memory cell MC may be read or written through the selected bit line BL. At this time, while the data of the memory cell MC is accessed via the selected bit line BL, since the selected memory cell is not on the complementary bit line BLB, the level of the pre-charge voltage VPRE is maintained as a reference voltage level. Therefore, the sense amplifier 160 may sense the cell voltage Vcell of the memory cell MC by using charges shared through the bit line BL. Herein, the bit line BL may be referred to as a cell bit line, in view of its connection to the memory cell MC.

The sense amplifier 160 may be configured to sense the cell voltage Vcell stored in the memory cell MC as the MSB and LSB of the 2-bit data and, after sensing, may be configured to restore the cell voltage Vcell corresponding to the sensed MSB and LSB in the memory cell MC. For example, the sense amplifier 160 may perform first to third charge sharing operations by using a cell capacitance of the memory cell MC, a bit line capacitance of each of the pair of bit lines BL and BLB, a bit line capacitance of each of a pair of holding bit lines HBL and HBLB (FIG. 4), a bit line capacitance of each of the pair of first sensing bit lines SBL1 and SBLB1 (FIG. 4), and a bit line capacitance of each of a pair of second sensing bit lines SBL2 and SBLB2 (FIG. 4) and changes in the bit line capacitances. The sense amplifier 160 senses the MSB and LSB of the 2-bit data by performing the first to third charge sharing operations, and may restore the cell voltage Vcell corresponding to the sensed MSB and LSB in the memory cell MC.

In the sense amplifier 160, a first charge sharing operation may include charge sharing generated between the charges stored in the cell capacitor CC having the cell capacitance and charges stored in the bit line BL and in the holding bit line HBL having the bit line capacitances. The sense amplifier 160 may sense the MSB of the memory cell MC by performing the first charge sharing operation.

In the sense amplifier 160, a second charge sharing operation may include charge sharing generated between the charges stored in the bit line BL, in the holding bit line HBL, and in the first complementary sensing bit line SBLB1, and may also include charge sharing generated between charges stored in the complementary bit line BLB, in a complementary holding bit line HBLB and in the first sensing bit line SBL1. The sense amplifier 160 may sense the LSB of the memory cell MC by performing the second charge sharing operation.

In the sense amplifier 160, the third charge sharing operation may include charge sharing generated among the charges stored in the bit line BL of the memory cell MC, the charges stored in the holding bit line HBL storing the LSB of the memory cell MC, charges stored in a second sensing bit line SBL2 storing the MSB of the memory cell MC, the charges stored in the first sensing bit line SBL1, the charges stored in the complementary bit line BLB and the complementary holding bit line HBLB, and the charges stored in the first complementary sensing bit line SBLB1. The sense amplifier 160 may combine the sensed MSB and LSB by performing the third charge sharing operation. The sense amplifier 160 may restore the cell voltage Vcell generated in accordance with the combination of the sensed MSB and LSB in the memory cell MC.

Figure 17A:
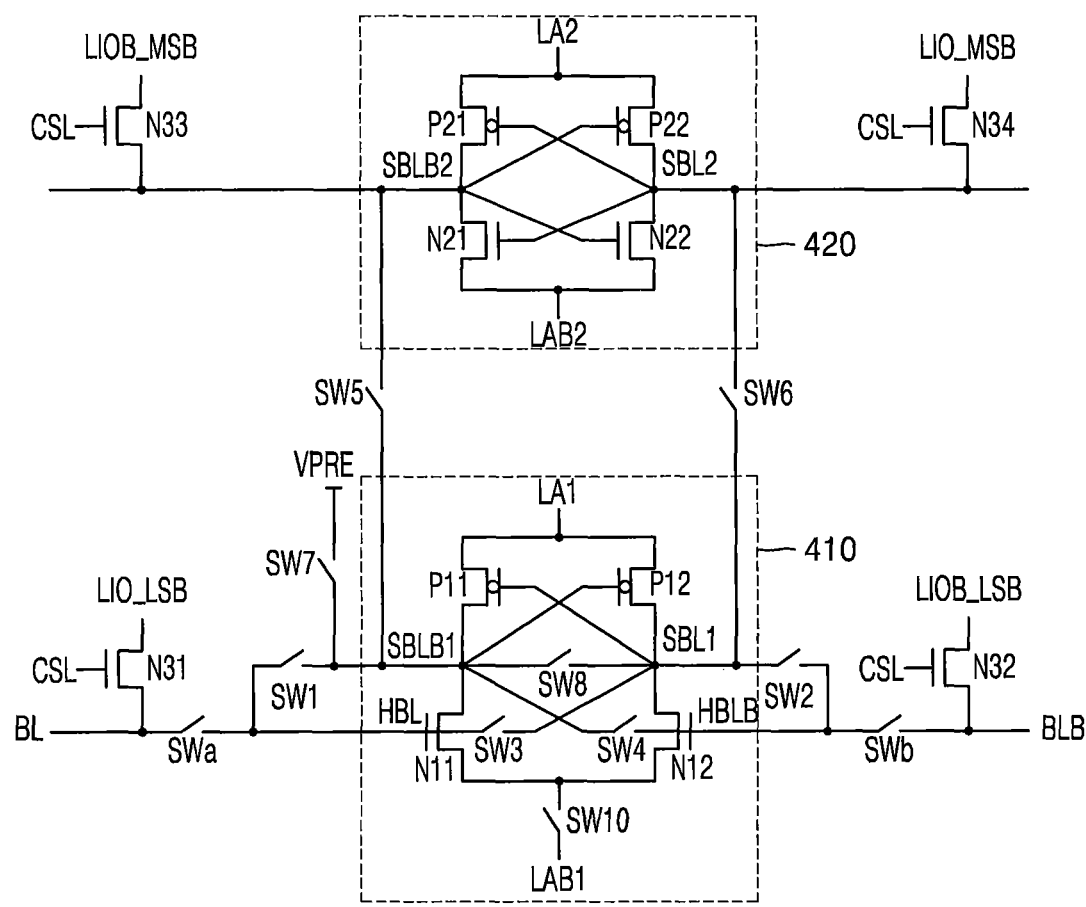
FIGS. 17A to 17F and 18A to 18C are circuit diagrams and operation timing diagrams illustrating sense amplifiers according to some embodiments of the inventive concepts.

In a read mode of the memory device 100, the sense amplifier 160 may electrically connect the pair of second sensing bit lines SBL2 and SBLB2 for storing the MSB of the memory cell MC sensed by first and second charge sharing operations and the pair of bit lines BL and BLB for storing the LSB to the data input and output circuitry 170 in response to the column selection signal CSL (FIG. 17A).

The data input and output circuitry 170 may serially output the MSB and the LSB in either order through the data DQ pad (FIG. 18B), or may output the MSB and the LSB in parallel through two data pads, that is, the first and second data DQ_MSB and DQ_LSB pads.

Figure 3:
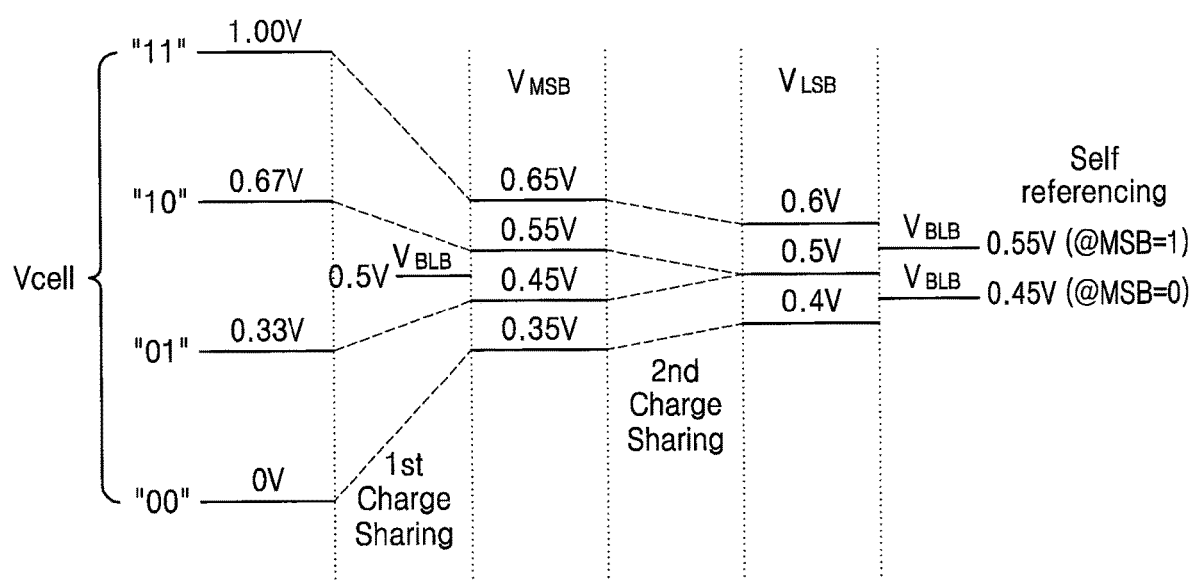
FIG. 3 is a view illustrating multi-bit data of a memory cell sensed by the sense amplifier of FIG. 2.

FIG. 3 is a view illustrating multi-bit data of a memory cell sensed by the sense amplifier 160 of FIG. 2.

Referring to FIG. 3, the cell voltage Vcell of the memory cell MC represent the MSB and the LSB of the 2-bit data. Different cell voltage Vcell stored in the memory cell MC may represent a different respective one of the bit combinations "00", "01", "10", or "11". For example, when the power voltage VINTA is 1.0 V, it may be set so that a voltage difference of about 330 mV to 340 mV is provided between bit combinations. That is, the cell voltage Vcell of 0 V may represent the bit combination "00", the cell voltage Vcell of 0.33 V may represent the bit combination "01", the cell voltage Vcell of 0.67 V may represent the bit combination "10", and the cell voltage Vcell of 1.0 V may represent the bit combination "11".

In the sense amplifier 160 for sensing the MSB of the memory cell MC, when the first charge sharing operation is performed including charge sharing between the charges stored in the cell capacitor CC and the charges stored in the bit line BL and in the holding bit line HBL, the bit line BL and the holding bit line HBL are captured to have a prescribed MSB voltage $V_{MSB}$. The bit line BL may be transited from the pre-charge voltage VPRE level, that is, 0.5 V to the MSB voltage $V_{MSB}$. At this time, the complementary bit line BLB may maintain the level of the pre-charge voltage VPRE.

For example, a voltage level of the bit line BL may be captured as the MSB voltage $V_{MSB}$ of about 0.35 V by the first charge sharing operation for the cell voltage Vcell of 0 V of the bit combination "00". The voltage level of the bit line BL may be captured as the MSB voltage $V_{MSB}$ of about 0.45 V by the first charge sharing operation for the cell voltage Vcell of 0.33 V of the bit combination "01". The voltage level of the bit line BL may be captured as the MSB voltage $V_{MSB}$ of about 0.55 V by the first charge sharing operation for the cell voltage Vcell of 0.67 V of the bit combination "10". The voltage level of the bit line BL may be captured as the MSB voltage $V_{MSB}$ of about 0.65 V by the first charge sharing operation for the cell voltage Vcell of 1.0 V of the bit combination "11".

The voltage level of the bit line BL of each of the bit combinations "00", "01", "10", and "11" in accordance with the first charge sharing operation thus may be captured as the MSB voltage $V_{MSB}$ of about 0.35 V, 0.45 V, 0.55 V, or 0.65 V, respectively. At this time, the complementary bit line BLB maintains the pre-charge voltage VPRE of 0.5 V. A prescribed voltage difference, that is, −150 mV, −50 mV, 50 mV, or 150 mV, may lie between the MSB voltage $V_{MSB}$ of the bit line BL and a complementary bit line voltage $V_{BLB}$ of 0.5 V, with the different prescribed voltage differences corresponding respectively to the bit combinations "00", "01", "10", and "11".

In the sense amplifier 160 for sensing the LSB of the memory cell MC, when the second charge sharing operation is performed including charge sharing generated between the charges stored in the bit line BL and the holding bit line HBL and the charges stored in the first complementary sensing bit line SBLB1, and also charge sharing generated between the charges stored in the complementary bit line BLB and the complementary holding bit line HBLB and the charges stored in the first sensing bit line SBL1, the bit line BL is captured as a prescribed LSB voltage $V_{LSB}$. The bit line BL may be transited from the MSB voltage $V_{MSB}$ to the LSB voltage $V_{LSB}$.

For example, for the bit combination "00", the voltage level of the bit line BL having the MSB voltage $V_{MSB}$ of about 0.35 V may be captured as the LSB voltage $V_{LSB}$ of about 0.4 V in the second charge sharing operation. At this time, the voltage level of the complementary bit line BLB may be captured as the complementary bit line voltage $V_{BLB}$ of about 0.45 V. For the bit combination "01", the voltage level of the bit line BL having the MSB voltage $V_{MSB}$ of about 0.45 V mat be captured as the LSB voltage $V_{LSB}$ of about 0.5 V in the second charge sharing operation, and the complementary bit line voltage $V_{BLB}$ may be captured as 0.45 V. For the bit combination "10", the voltage level of the bit line BL having the MSB voltage $V_{MSB}$ of 0.55 V may be captured as the LSB voltage $V_{LSB}$ of about 0.5 V in the second charge sharing operation, and the complementary bit line voltage $V_{BLB}$ may be captured as 0.55 V. For the bit combination "11", the voltage level of the bit line BL having the MSB voltage $V_{MSB}$ of 0.65 V may be captured as the LSB voltage $V_{LSB}$ of about 0.6 V in the second charge sharing operation, and the complementary bit line voltage $V_{BLB}$ may be captured as 0.55 V.

The voltage level of the bit line BL of each of the bit combinations "00" and "01" in accordance with the second charge sharing operation is captured as the LSB voltage $V_{LSB}$ of about 0.4 V and 0.5 V, respectively, and the level of the complementary bit line voltage $V_{BLB}$ is captured as about 0.45 V. The voltage level of the bit line BL of each of the bit combinations "10" and "11" is captured as the LSB voltage $V_{LSB}$ of about 0.5 V and 0.6 V, respectively, and the level of the complementary bit line voltage $V_{BLB}$ is captured as about 0.55 V. A prescribed voltage difference, corresponding to each of the bit combinations "00", "01", "10", and "11", that is, −50 mV, 50 mV, −50 mV, or 50 mV, lies between the LSB voltage $V_{LSB}$ of the bit line BL and the complementary bit line voltage $V_{BLB}$, which means that the LSB voltage $V_{LSB}$ corresponding to each of the bit combinations "00", "01", "10", and "11" operates as a self-reference that does not require an additional reference voltage for sensing the LSB voltage $V_{LSB}$.

When the cell voltage Vcell of the memory cell MC is sensed as the 2-bit combination MSB and LSB by the sense amplifier 160, the voltage level of each of the bit line BL and the holding bit line HBL having the LSB voltage level operates as a self-reference having a prescribed voltage difference in comparison with the voltage level of each of the complementary bit line BLB and the complementary holding bit line HBLB. Therefore, since the sense amplifier 160 does not require an additional reference voltage for sensing the LSB, a signal line connection configuration of the sense amplifier 160 may be simplified.

Figure 4:
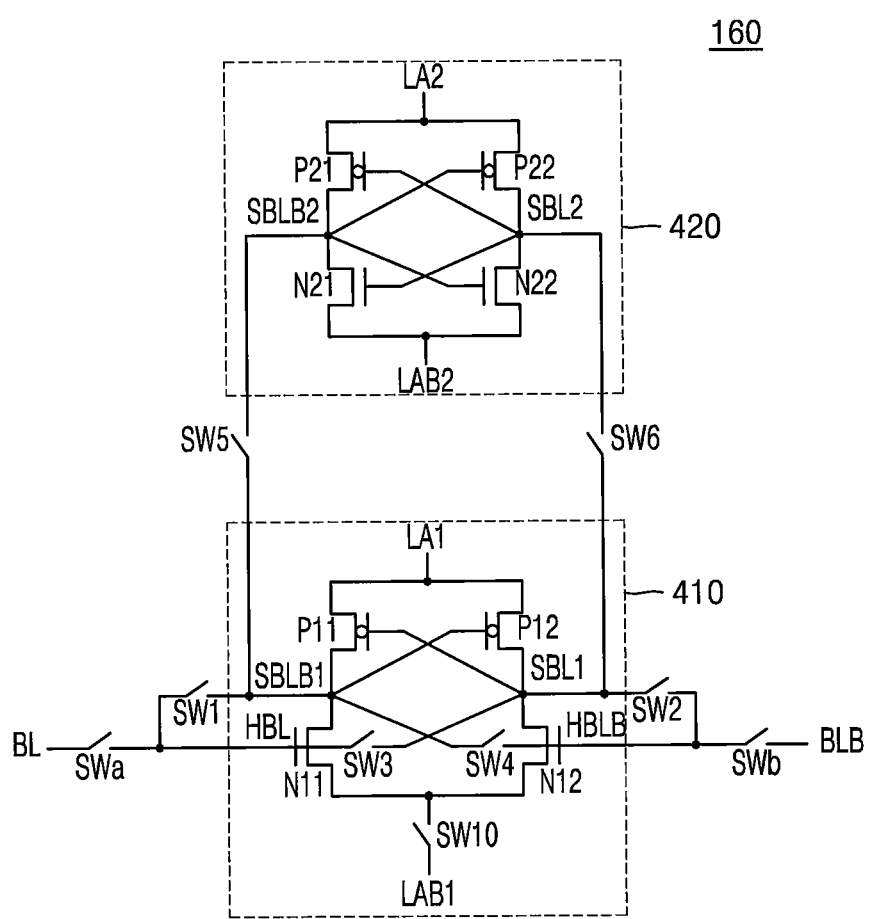
FIG. 4 is a circuit diagram illustrating a sense amplifier according to some embodiments of the inventive concepts.

FIG. 4 is a circuit diagram illustrating a sense amplifier 160 according to some embodiments of the inventive concepts. The sense amplifier 160 of FIG. 4 corresponds to the sense amplifier 160 of FIG. 2.

Referring to FIG. 4, the sense amplifier 160 includes the first sense amplifying circuit 410, the second sense amplifying circuit 420, and a switching circuit including a bit line switch SWa, a complementary bit line switch SWb, a power switch SW10, and first to sixth switches SW1 to SW6.

The first sense amplifying circuit 410 is connected to a first sensing driving signal LA1 and a second sensing driving signal LAB1 and includes first and second p-type metal-oxide-semiconductor (PMOS) transistors P11 and P12 and first and second n-type metal-oxide-semiconductor (NMOS) transistors N11 and N12. The power voltage VINTA, a ground voltage VSS, or the pre-charge voltage VPRE may be applied to each of the first and second sensing driving signals LA1 and LAB1 in accordance with control of the control circuitry 150 (FIG. 1) for controlling an operation of the sense amplifier 160.

One end of the first PMOS transistor P11 is connected to a line of the first sensing driving signal LA1, the other end of the first PMOS transistor P11 is connected to the first complementary sensing bit line SBLB1, and a gate of the first PMOS transistor P11 is connected to the first sensing bit line SBL1. One end of the second PMOS transistor P12 is connected to the line of the first sensing driving signal LA1, the other end of the second PMOS transistor P12 is connected to the first sensing bit line SBL1, and a gate of the second PMOS transistor P12 is connected to the first complementary sensing bit line SBLB1.

One end of the first NMOS transistor N11 is connected to the power switch SW10, the other end of the first NMOS transistor N11 is connected to the first complementary sensing bit line SBLB1, and a gate of the first NMOS transistor N11 is connected to the holding bit line HBL. One end of the second NMOS transistor N12 is connected to the power switch SW10, the other end of the second NMOS transistor N12 is connected to the first sensing bit line SBL1, and a gate of the second NMOS transistor N12 is connected to the complementary holding bit line HBLB.

The bit line switch SWa is connected between the bit line BL and the holding bit line HBL and is turned on or off in accordance with the control of the control circuitry 150. The complementary bit line switch SWb is connected between the complementary bit line BLB and the complementary holding bit line HBLB and is turned on or off in accordance with the control of the control circuitry 150. The power switch SW10 is connected between one end of each of the first and second NMOS transistors N11 and N12 and a line of the second sensing driving signal LAB1 and is turned on or off in accordance with the control of the control circuitry 150.

The first switch SW1 is connected between the holding bit line HBL and the first complementary sensing bit line SBLB1 and is turned on or off in accordance with the control of the control circuitry 150. The second switch SW2 is connected between the complementary holding bit line HBLB and the first sensing bit line SBL1 and is turned on or off in accordance with the control of the control circuitry 150. The third switch SW3 is connected between the holding bit line HBL and the first sensing bit line SBL1 and is turned on or off in accordance with the control of the control circuitry 150. The fourth switch SW4 is connected between the complementary holding bit line HBLB and the first complementary sensing bit line SBLB1 and is turned on or off in accordance with the control of the control circuitry 150.

The second sense amplifying circuit 420 is connected to a third sensing driving signal LA2 and a fourth sensing driving signal LAB2 and includes third and fourth PMOS transistors P21 and P22 and third and fourth NMOS transistors N21 and N22.

One end of the third PMOS transistor P21 is connected to a line of the third sensing driving signal LA2, the other end of the third PMOS transistor P21 is connected to a second complementary sensing bit line SBLB2, and a gate of the third PMOS transistor P21 is connected to the second sensing bit line SBL2. One end of the fourth PMOS transistor P22 is connected to the line of the third sensing driving signal LA2, the other end of the fourth PMOS transistor P22 is connected to the second sensing bit line SBL2, and a gate of the fourth PMOS transistor P22 is connected to the second complementary sensing bit line SBLB2.

One end of the third NMOS transistor N21 is connected to a line of the fourth sensing driving signal LAB2, the other end of the third NMOS transistor N21 is connected to the second complementary sensing bit line SBLB2, and a gate of the third NMOS transistor N21 is connected to the second sensing bit line SBL2. One end of the fourth NMOS transistor N22 is connected to the line of the fourth sensing driving signal LAB2, the other end of the fourth NMOS transistor N22 is connected to the second sensing bit line SBL2, and a gate of the fourth NMOS transistor N22 is connected to the second complementary sensing bit line SBLB2.

The fifth switch SW5 is connected between the first complementary sensing bit line SBLB1 and the second complementary sensing bit line SBLB2 and is turned on or off in accordance with the control of the control circuitry 150. The sixth switch SW6 is connected between the first sensing bit line SBL1 and the second sensing bit line SBL2 and is turned on or off in accordance with the control of the control circuitry 150.

Figure 5:
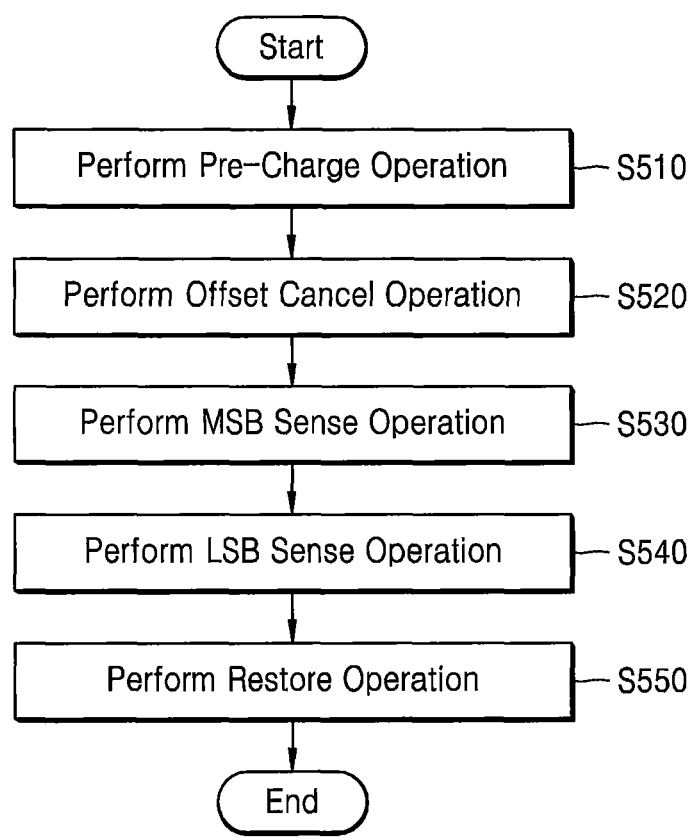
FIG. 5 is a flowchart conceptually illustrating an operation of the sense amplifier of FIG. 4.

FIG. 5 is a flowchart conceptually illustrating an operation of the sense amplifier 160 of FIG. 4.

Referring to FIG. 5, in operation S510, the sense amplifier 160 performs a pre-charging operation. The sense amplifier 160 pre-charges the bit line BL, the holding bit line HBL, the complementary bit line BLB, the complementary holding bit line HBLB, the first complementary sensing bit line SBLB1, the first sensing bit line SBL1, the second complementary sensing bit line SBLB2, the second sensing bit line SBL2, the first and second sensing driving signals LA1 and LAB1, and the third and fourth sensing driving signals LA2 and LAB2 to the pre-charge voltage VPRE.

In operation S520, the sense amplifier 160 performs the offset removing operation. In the sense amplifier 160 having the open bit line structure illustrated in FIG. 2, noise that results from, for example process variations, temperatures, or differences in threshold voltage between transistors may vary in the pair of bit lines BL and BLB. The noise of the pair of bit lines BL and BLB may operate as offset noise during a sense operation of the sense amplifier 160 and may reduce a valid sensing margin of the sense amplifier 160. Therefore, the sense amplifier 160 may be configured to perform the offset removing operation before the sense operation in order to increase the valid sensing margin.

In operation S530, the sense amplifier 160 senses the MSB of the 2-bit combination represented by the cell voltage Vcell stored in the memory cell MC. The MSB sense operation may include the first charge sharing operation, which may include charge sharing generated between the charges stored in the memory cell MC and the charges stored in the bit line BL and the holding bit line HBL.

The first charge sharing operation may include charge sharing generated between charges stored in a cell capacitor having a cell capacitance CC and charges stored in the bit line BL and the holding bit line HBL having bit line capacitances. The voltage level of each of the bit line BL and the holding bit line HBL may be represented as the MSB voltage $V_{MSB}$ (FIG. 3) corresponding to each of the bit combinations "00", "01", "10", and "11" by the first charge sharing operation. The MSB voltage $V_{MSB}$ operates as a self-reference generated by a prescribed voltage difference in comparison with the complementary bit line voltage $V_{BLB}$ (FIG. 3). The sense amplifier 160 sense amplifies a difference between the MSB voltage $V_{MSB}$ of the bit line BL and the holding bit line HBL and the complementary bit line voltage $V_{BLB}$ of the complementary bit line BLB and may latch the MSB of logic "1" or logic "0", respectively having a level of the power voltage VINTA or the ground voltage VSS.

In operation S540 the sense amplifier 160 may sense the LSB of the 2-bit combination represented by the cell voltage Vcell stored in the memory cell MC. The LSB sense operation may include the second charge sharing operation.

The second charge sharing operation may include charge sharing generated between the charges stored in the bit line BL and the holding bit line HBL and the charges stored in the first complementary sensing bit line SBLB1, and may also include charge sharing generated between the charges stored in the complementary bit line BLB and the complementary holding bit line HBLB and the charges stored in the first sensing bit line SBL1.

The voltage level of each of the bit line BL and the holding bit line HBL may be represented as the LSB voltage $V_{LSB}$ (FIG. 3) corresponding to each of the bit combinations "00", "01", "10", and "11" by the second charge sharing operation. The LSB voltage $V_{LSB}$ operates as a self-reference generated by a prescribed voltage difference in comparison with the complementary bit line voltage $V_{BLB}$ (FIG. 3). The sense amplifier 160 sense amplifies a difference between the LSB voltage $V_{LSB}$ of the bit line BL and the holding bit line HBL and the complementary bit line voltage $V_{BLB}$ of the complementary holding bit line HBLB and may latch the LSB of logic "1" or logic "0", respectively having the level of the power voltage VINTA or the ground voltage VSS.

In operation S550, the sense amplifier 160 performs the restoring operation of rewriting to the memory cell MC the cell voltage Vcell generated by the combination of the sensed MSB and LSB. The restoring operation may include the third charge sharing operation.

By the sense operations S530 and S540 of the MSB and LSB, the LSB of a corresponding logic level is stored in the bit line BL and the holding bit line HBL, and the MSB of a corresponding logic level is stored in the first complementary sensing bit line SBLB1, the complementary bit line BLB, the complementary holding bit line HBLB, and the first sensing bit line SBL1.

The third charge sharing operation may be performed by using the cell capacitance of the memory cell MC, the bit line capacitance of each of the pair of bit lines BL and BLB, the bit line capacitance of each of the pair of holding bit lines HBL and HBLB, the bit line capacitance of each of the first pair of sensing bit lines SBL1 and SBLB1, and a change in capacitances. The sensed MSB and LSB may be combined by the third charge sharing operation. The sense amplifier 160 may restore in the memory cell MC the cell voltage Vcell generated by the combination of the sensed MSB.

Figure 6:
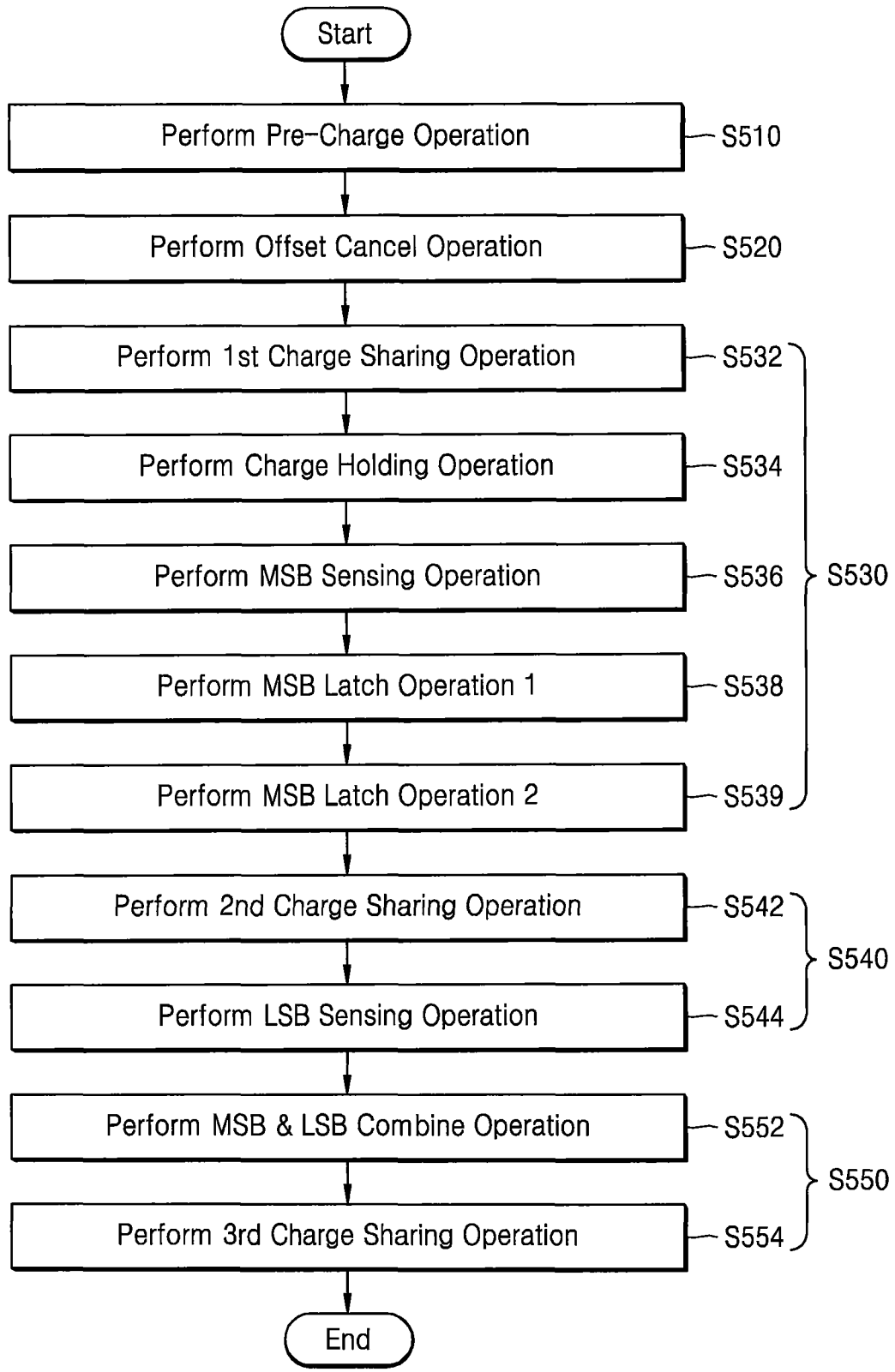
FIG. 6 is a flowchart sequentially illustrating operations of the sense amplifier of FIG. 5.

FIG. 6 is a flowchart sequentially illustrating operations of the sense amplifier illustrated in FIG. 5. FIGS. 7A to 7K are equivalent circuits illustrating an operation of the sense amplifier illustrated in FIG. 6. FIG. 8 is a timing diagram in accordance with operations of the equivalent circuits illustrated in FIGS. 7A to 7K. For the sake of convenience, the operations of FIG. 6 will be described in connection with FIGS. 7A to 7K and 8. To simplify the illustrations, switches that are turned on in FIGS. 7A through 7K are illustrated as short circuits and switches that are being turned off are illustrated as being open. FIGS. 7A to 7K illustrate an operation of the sense amplifier for sensing the cell voltage Vcell of 0 V stored in the memory cell MC, that is, the 2-bit data "00".

1. The Pre-Charge Operation

Figure 7A:
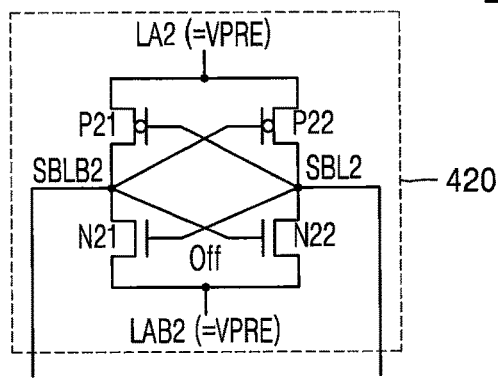
FIGS. 7A to 7K and 8 are equivalent circuits and a timing diagram illustrating an operation of a sense amplifier for sensing 2-bit data "00" corresponding to a cell voltage of 0 V stored in a memory cell.
Figure 7A:
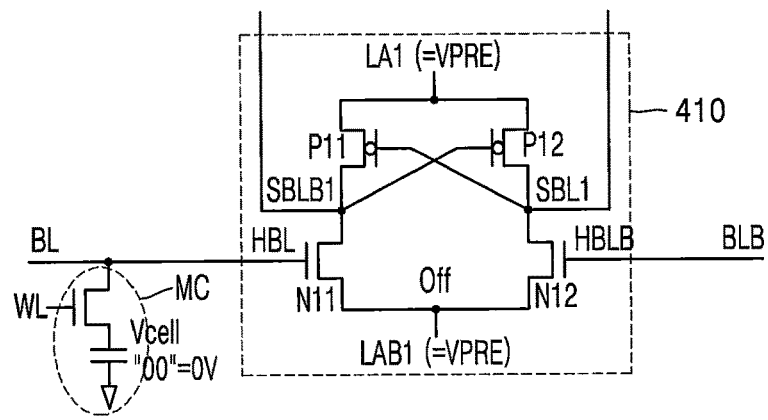
Figure 8:
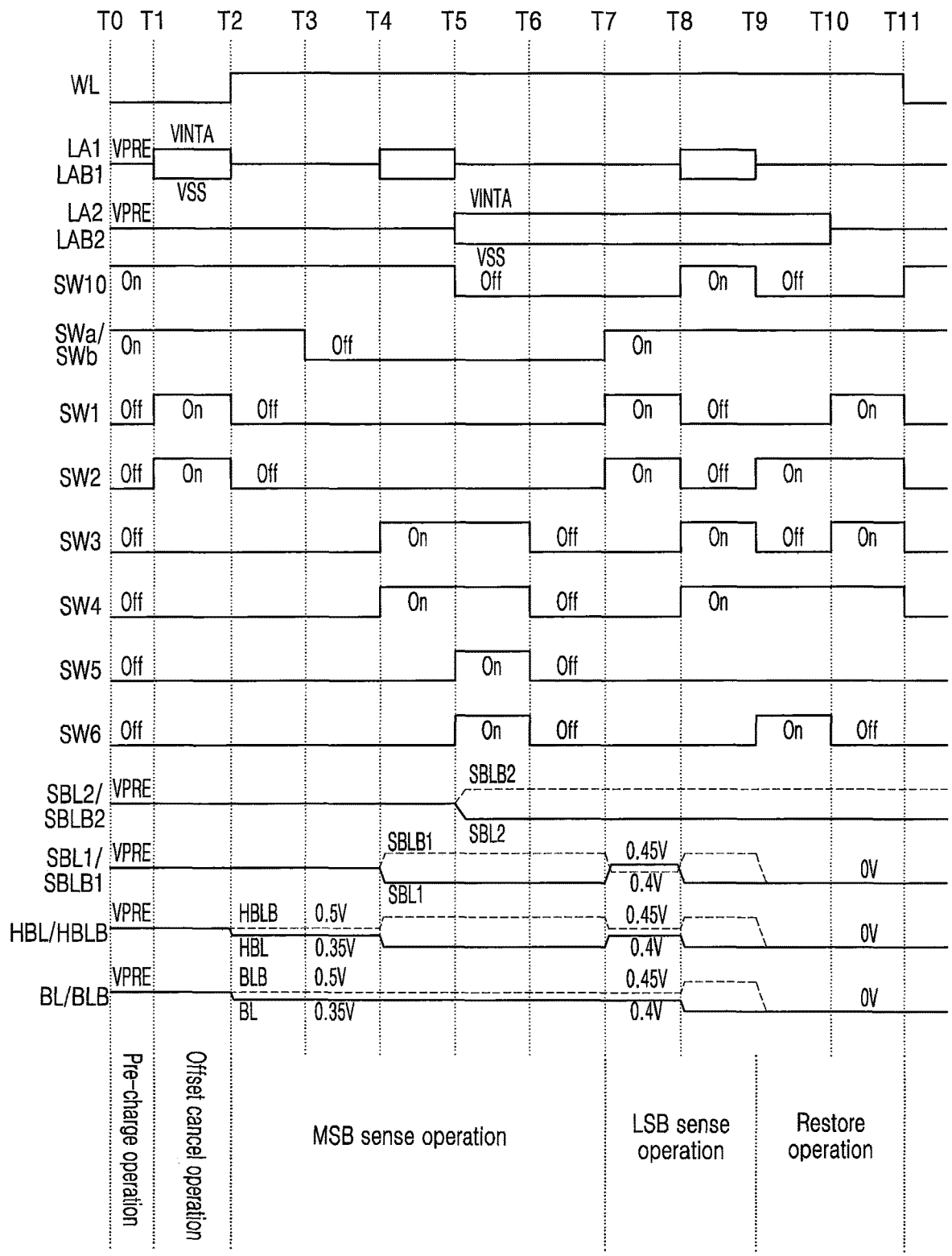

Referring to FIGS. 6 and 7A and the point in time T0 of FIG. 8, in operation S510, the sense amplifier 160 pre-charges the bit line BL, the holding bit line HBL, the complementary bit line BLB, the complementary holding bit line HBLB, the first complementary sensing bit line SBLB1, the first sensing bit line SBL1, the second complementary sensing bit line SBLB2, the second sensing bit line SBL2, the first and second sensing driving signals LA1 and LAB1, and the third and fourth sensing driving signals LA2 and LAB2 to the pre-charge voltage VPRE.

The pre-charge voltage VPRE may be set to have the voltage level corresponding to the half of the level of the power voltage VINTA. For example, when the power voltage VINTA is 1 V, the pre-charge voltage VPRE may be set to 0.5 V. For example, the bit line BL and the complementary bit line BLB may be charged to the pre-charge voltage VPRE in the equalizing circuit 180 of FIG. 2. According to an embodiment, the sense amplifier 160 further includes a pre-charge circuit and the pre-charge circuit may charge the holding bit line HBL, the complementary holding bit line HBLB, the first complementary sensing bit line SBLB1, the first sensing bit line SBL1, the second complementary sensing bit line SBLB2, the second sensing bit line SBL2, the first and second sensing driving signals LA1 and LAB1, and the third and fourth sensing driving signals LA2 and LAB2 to the pre-charge voltage VPRE.

In the pre-charge operation, the first sense amplifying circuit 410 and the second sense amplifying circuit 420 are in off states, the bit line switch SWa, the complementary bit line switch SWb, and the power switch SW10 are in on states, and the first to sixth switches SW1 to SW6 are in off states. Hereinafter, when the first sense amplifying circuit 410 is in the off state, the pre-charge voltage VPRE is applied to the first and second sensing driving signals LA1 and LAB1 and, when the second sense amplifying circuit 420 is in the off state, the pre-charge voltage VPRE is applied to the third and fourth sensing driving signals LA2 and LAB2.

2. The Offset Removing Operation

Figure 7B:
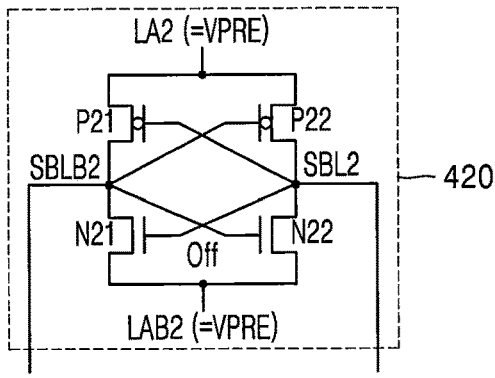
Figure 7B:
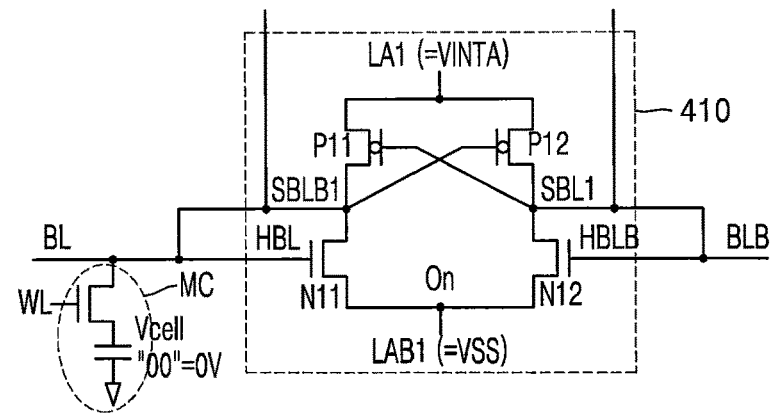

Referring to FIGS. 6 and 7B and the point in time T1 of FIG. 8, in operation S520, the sense amplifier 160 performs the offset removing operation. As illustrated in FIG. 2, the sense amplifier 160 has the open bit line structure in which the sense amplifier 160 is connected to the pair of bit lines BL and BLB that are separately positioned in the adjacent cell blocks 210 and 220. In the open bit line structure, offset noise of the pair of bit lines BL and BLB may be maximized during the sense operation of the sense amplifier 160 and accordingly, the valid sensing margin of the sense amplifier 160 may be reduced.

In order to increase the valid sensing margin of the sense amplifier 160, the sense amplifier 160 turns on the first sense amplifying circuit 410 and turns on the first and second switches SW1 and SW2 to perform the offset removing operation. The power voltage VINTA is applied to the first sensing driving signal LA1 of the first sense amplifying circuit 410 and the ground voltage VS S is applied to the second sensing driving signal LAB1.

In the first sense amplifying circuit 410, the complementary bit line BLB is increased or reduced to a prescribed level in comparison with the bit line BL by the offset noise of the pair of bit lines BL and BLB and accordingly, a prescribed voltage difference lies between the bit line BL and the complementary bit line BLB. The voltage difference may be interpreted as the offset voltage in accordance with the offset noise, which means that the bit line BL and the complementary bit line BLB are set to have a difference by the offset voltage and accordingly, the offset noise of the sense amplifier 160 is removed. That is, the sense amplifier 160 may compensate for offset through the offset removing operation.

3. The First Charge Sharing Operation

Figure 7C:
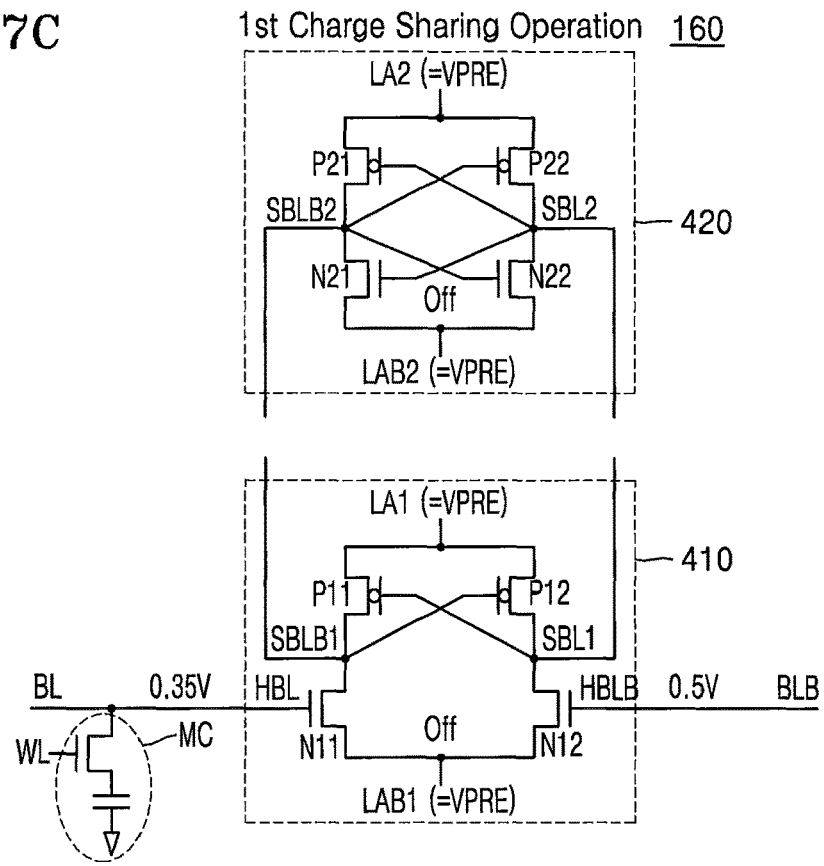

Referring to FIGS. 6 and 7C and the point in time T2 of FIG. 8, in operation S532, the sense amplifier 160 performs the first charge sharing operation between the memory cell MC and the bit line BL. The sense amplifier 160 turns off the first sense amplifying circuit 410 and the first and second switches SW1 and SW2. At this time, the word line WL connected to the memory cell MC is enabled and charge sharing is generated between the charges stored in the capacitor of the memory cell MC and the charges stored in the bit line BL and the holding bit line HBL.

When the cell voltage Vcell of 0 V is stored in the memory cell MC, during the charge sharing operation, the voltage level of each of the bit line BL and the holding bit line HBL is reduced by a prescribed level from the level of the pre-charge voltage VPRE. That is, the voltage level of each of the bit line BL and the holding bit line HBL is reduced from 0.5 V to about 0.35 V. At this time, each of the complementary bit line BLB and the complementary holding bit line HBLB maintains the level of the pre-charge voltage VPRE, that is, 0.5 V.

4. The Charge Holding Operation

Figure 7D:
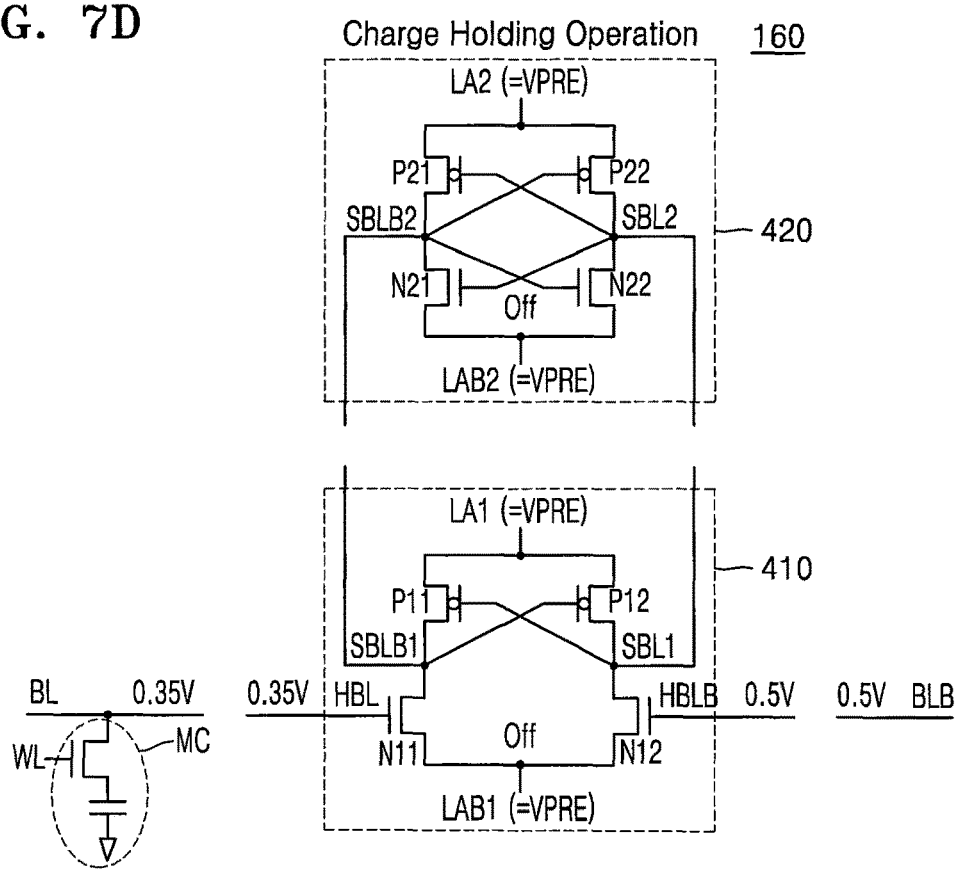

Referring to FIGS. 6 and 7D and the point in time T3 of FIG. 8, in operation S534, the sense amplifier 160 holds the charges of the bit line BL and the holding bit line HBL in accordance with the first charge sharing operation. The sense amplifier 160 turns off the bit line switch SWa and the complementary bit line switch SWb. Each of the bit line BL and the holding bit line HBL maintains the voltage level of about 0.35 V and each of the complementary bit line BLB and the complementary holding bit line HBLB maintains the voltage level of about 0.5 V.

5. The MSB Sense operation

Figure 7E:
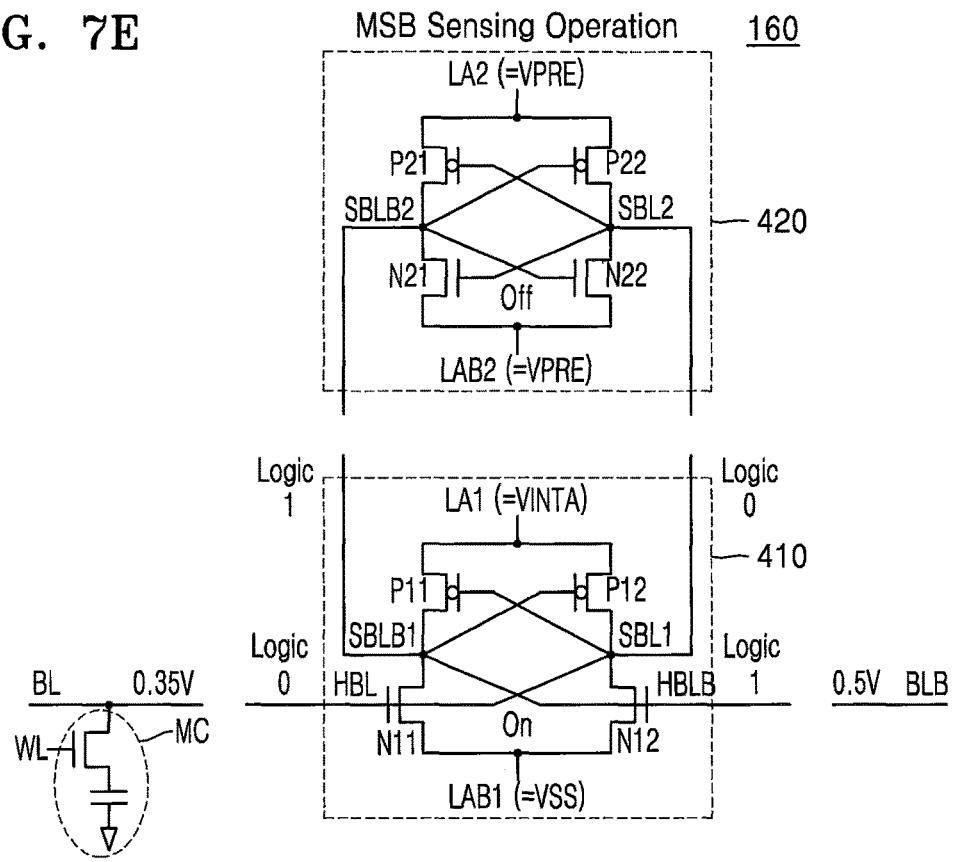

Referring to FIGS. 6 and 7E and the point in time T4 of FIG. 8, in operation S536, the sense amplifier 160 performs the MSB sense operation of sensing the MSB of the 2-bit combination represented by the cell voltage Vcell stored in the memory cell MC. The sense amplifier 160 turns on the first sense amplifying circuit 410 and the third and fourth switches SW3 and SW4 to perform the MSB sense operation. The power voltage VINTA is applied to the first sensing driving signal LA1 of the first sense amplifying circuit 410 and the ground voltage VSS is applied to the second sensing driving signal LAB1. The holding bit line HBL and the first sensing bit line SBL1 are connected by the third switch SW3 and the complementary holding bit line HBLB and the first complementary sensing bit line SBLB1 are connected by the fourth switch SW4.

The first sense amplifying circuit 410 may increase the voltage of the first complementary sensing bit line SBLB1 to the logic "1" level and may reduce the voltage of the first sensing bit line SBL1 to the logic "0" level by sensing the MSB of the 2-bit combination based on a difference between a holding bit line HBL voltage of 0.35 V and a complementary holding bit line HBLB voltage of 0.5 V that are respectively applied to gates of the first and second NMOS transistors N11 and N12. The voltage of the complementary holding bit line HBLB connected to the first complementary sensing bit line SBLB1 is increased to the logic "1" level and the voltage of the holding bit line HBL connected to the first sensing bit line SBL1 is reduced to the logic "0" level.

6. The First MSB Latching Operation

Figure 7F:
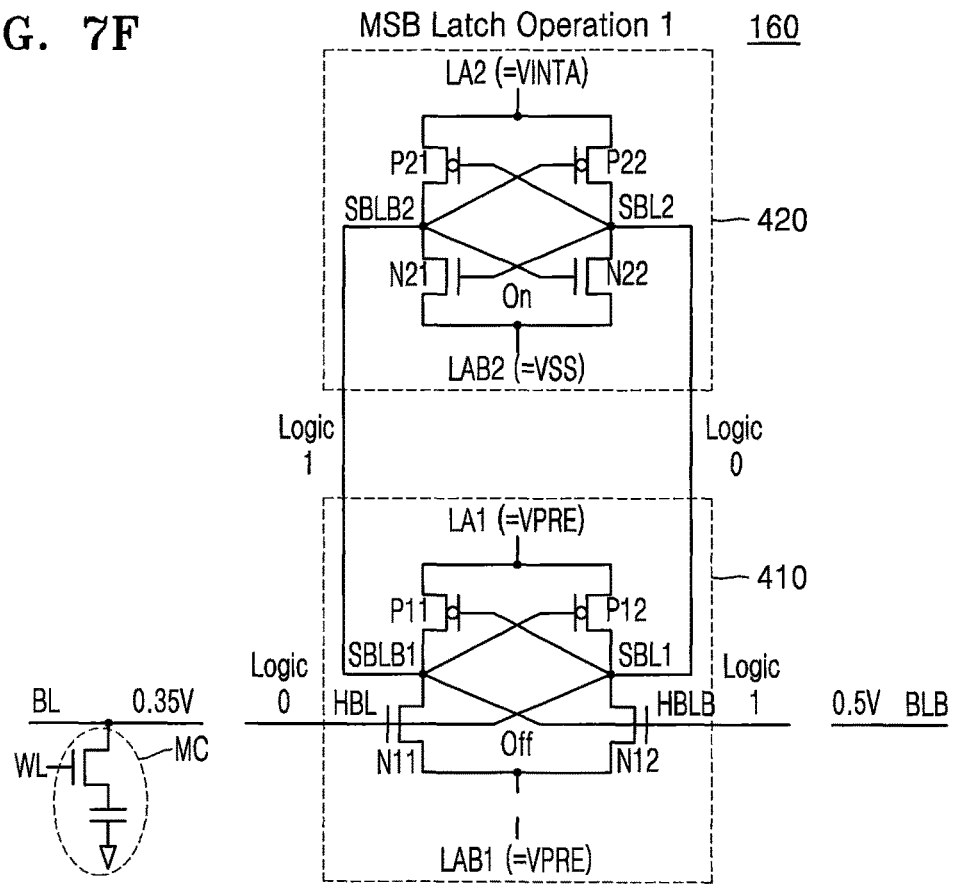

Referring to FIGS. 6 and 7F and the point in time T5 of FIG. 8, in operation S538, the sense amplifier 160 performs the first MSB latching operation of latching the MSB of the 2-bit data. The sense amplifier 160 performs the first MSB latching operation by turning off the first sense amplifying circuit 410, turning on the second sense amplifying circuit 420, turning off the power switch SW10, and turning on the fifth and sixth switches SW5 and SW6. The power voltage VINTA is applied to the third sensing driving signal LA2 of the second sense amplifying circuit 420 and the ground voltage VSS is applied to the fourth sensing driving signal LAB2. The first complementary sensing bit line SBLB1 and the second complementary sensing bit line SBLB2 are connected by the fifth switch SW5 and the first sensing hit line SBL1 and the second sensing bit line SBL2 are connected by the sixth switch SW6. The power switch SW10 may be turned off in order to block a leakage current path that prohibits operation of the second sense amplifying circuit 420 in an on state.

The second sense amplifying circuit 420 may increase the voltage of the second complementary sensing bit line SBLB2 to the logic "1" level and may reduce the voltage of the second sensing bit line SBL2 to the logic "0" level by sensing the 2-bit combination MSB based on a voltage difference between the second complementary sensing bit line SBLB2 and the second sensing bit line SBL2. The voltage of each of the first complementary sensing bit line SBLB1 and the complementary holding bit line HBLB connected to the second complementary sensing bit line SBLB2 is at the logic "1" level. The voltage of each of the first sensing bit line SBL1 and the holding bit line HBL connected to the second sensing bit line SBL2 is at the logic "0" level.

7. The Second MSB Latching Operation

Figure 7G:
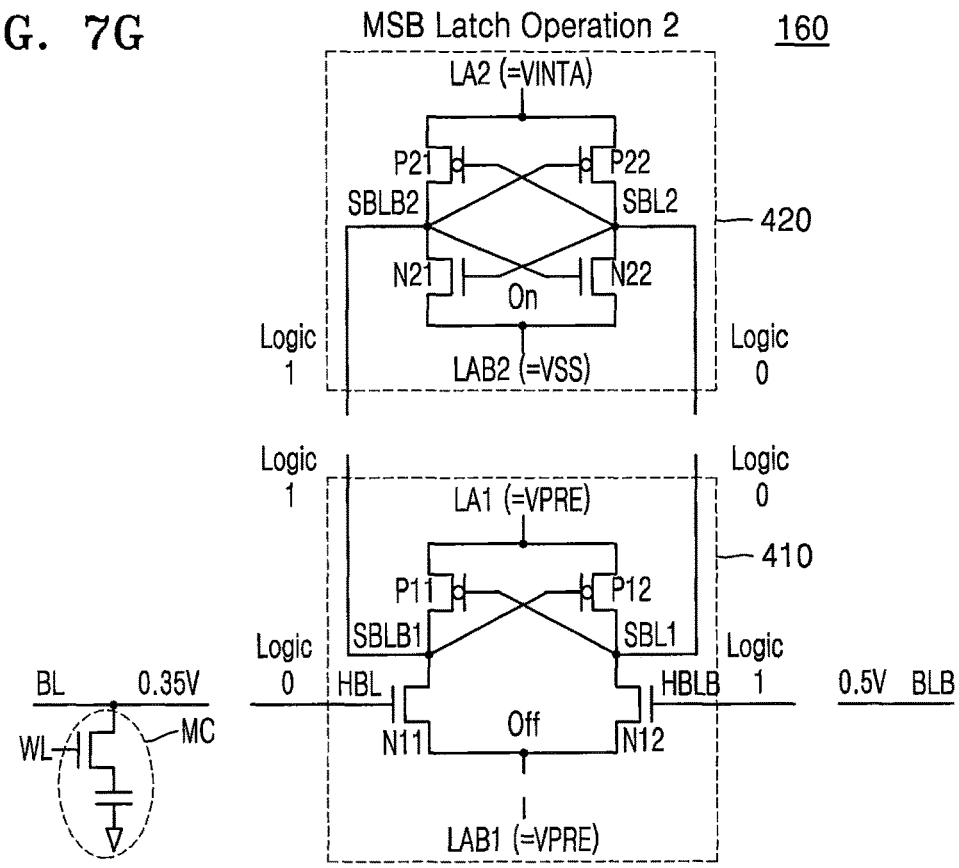

Referring to FIGS. 6 and 7G and the point in time T6 of FIG. 8, in operation 5539, the sense amplifier 160 performs the second MSB latching operation. The sense amplifier 160 performs the second MSB latching operation by turning off the third to sixth switches SW3 to SW6. The voltage of the second complementary sensing bit line SBLB2 maintains the logic "1" level, the voltage of the second sensing bit line SBL2 maintains the logic "0" level, the voltage of the first complementary sensing bit line SBLB1 maintains the logic "1" level, the voltage of the first sensing bit line SBL1 maintains the logic "0" level, the voltage of the holding bit line HBL maintains the logic "0" level, and the voltage of the complementary holding bit line HBLB maintains the logic "1" level.

The logic "0" level may be latched to the second sensing bit line SBL2 of the second sense amplifying circuit 420 as the MSB of the memory cell MC.

8. The Second Charge Sharing Operation

Figure 7H:
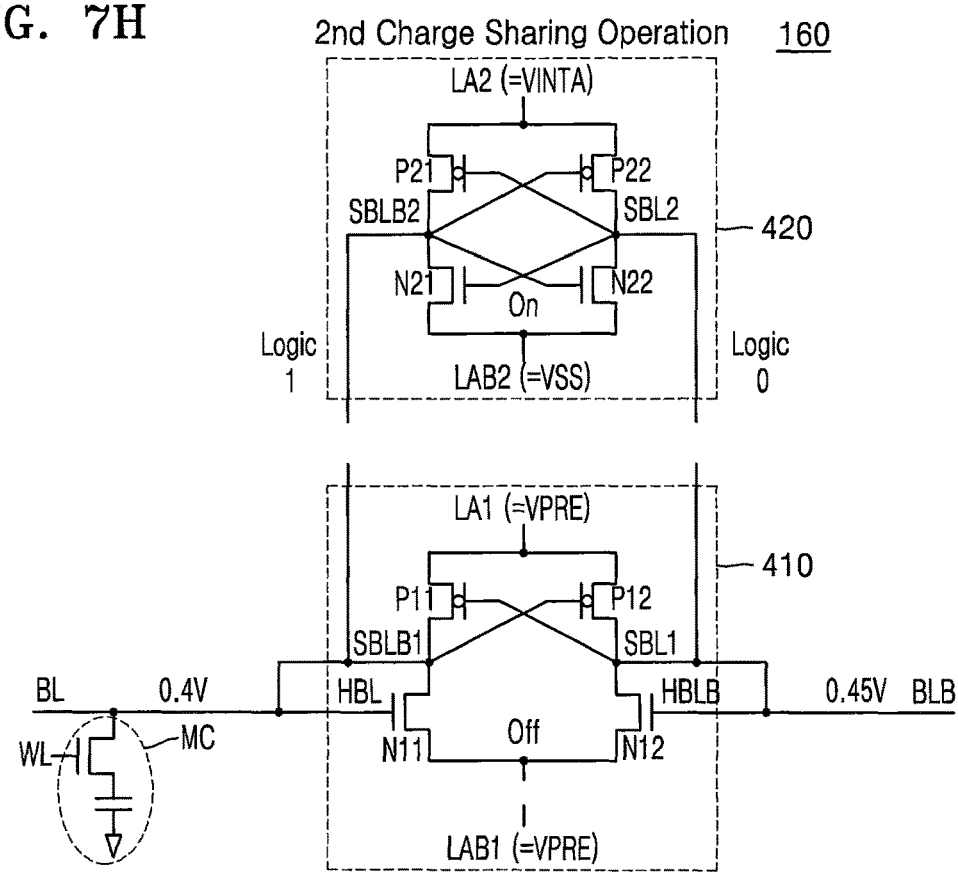

Referring to FIGS. 6 and 7H and the point in time T7 of FIG. 8, in operation S542, the sense amplifier 160 performs the second charge sharing operation among the first complementary sensing bit line SBLB1, the holding bit line HBL, and the bit line BL and among the first sensing bit line SBL1, the complementary holding bit line HBLB, and the complementary bit line BLB. The sense amplifier 160 turns on the bit line switch SWa, the complementary bit line switch SWb, and the first and second switches SW1 and SW2.

The bit line BL, the holding bit line HBL, and the first complementary sensing bit line SBLB1 are connected by the bit line switch SWa and the first switch SW1. The complementary bit line BLB, the complementary holding bit line HBLB, and the first sensing bit line SBL1 are connected by the complementary bit line switch SWb and the second switch SW2.

Charge sharing is generated among the charges stored in the bit line BL, the charges stored in the holding bit line HBL, and the charges stored in the first complementary sensing bit line SBLB1. Charge sharing is also generated among the charges stored in the complementary bit line BLB, the charges stored in the complementary holding bit line HBLB, and the charges stored in the first sensing bit line SBL1.

In the second charge sharing operation, the voltage of each of the bit line BL, the holding bit line HBL, and the first complementary sensing bit line SBLB1 is captured as about 0.4 V and the voltage of each of the complementary bit line BLB, the complementary holding bit line HBLB, and the first sensing bit line SBL1 is captured as about 0.45 V.

9. The LSB Sense Operation

Figure 7I:
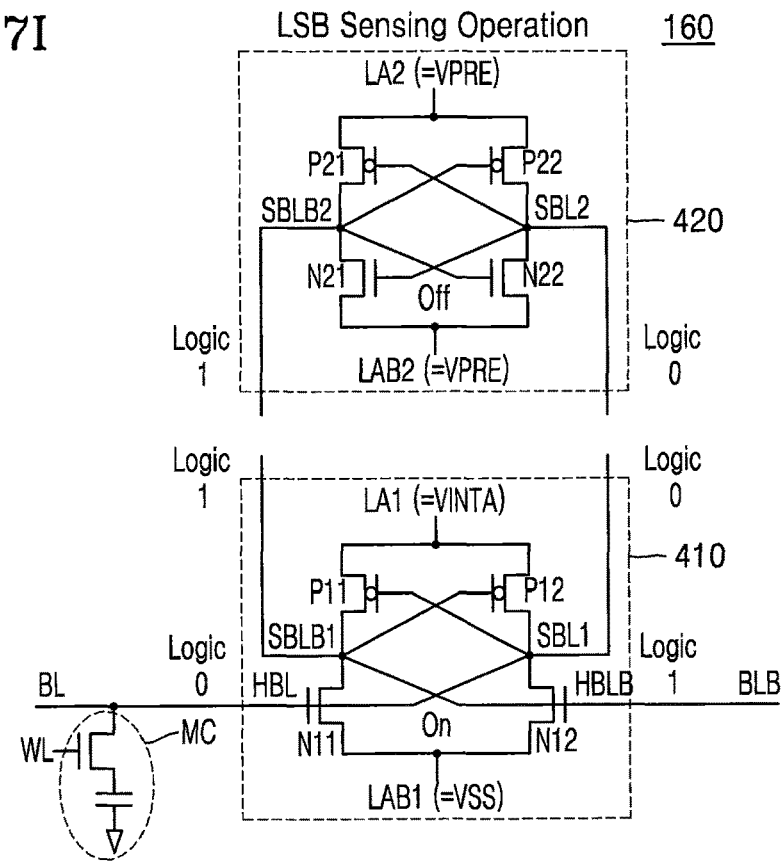

Referring to FIGS. 6 and 7I and the point in time T8 of FIG. 8, in operation S544, the sense amplifier 160 performs the LSB sense operation of sensing the LSB of the 2-bit combination represented by the cell voltage Vcell stored in the memory cell MC. The sense amplifier 160 performs the LSB sense operation by turning on the first sense amplifying circuit 410 and the power switch SW10, turning off the first and second switches SW1 and SW2, and turning on the third and fourth switches SW3 and SW4.

The power voltage VINTA is applied to the first sensing driving signal LA1 of the first sense amplifying circuit 410 and the ground voltage VSS is applied to the second sensing driving signal LAB1. The bit line BL, the holding bit line HBL, and the first sensing bit line SBL1 are connected by the bit line switch SWa and the third switch SW3. The complementary bit line BLB, the complementary holding bit line HBLB, and the first complementary sensing bit line SBLB1 are connected by the complementary bit line switch SWb and the fourth switch SW4.

The first sense amplifying circuit 410 may increase the voltage of the first complementary sensing bit line SBLB1 to the logic "1" level and may reduce the voltage of the first sensing bit line SBL1 to the logic "0" level by sensing the 2-bit combination LSB based on a difference between a bit line BL voltage of 0.4 V applied to each of gates of the first PMOS and NMOS transistors P11 and N11 and a complementary bit line BLB voltage of 0.45 V applied to each of gates of the second PMOS and NMOS transistors P12 and N12.

The voltage of each of the complementary bit line BLB and the complementary holding bit line HBLB connected to the first complementary sensing bit line SBLB1 is increased to the logic "1" level and the voltage of each of the bit line BL and the holding bit line HBL connected to the first sensing bit line SBL1 is reduced to the logic "0" level.

The logic "0" level may be latched to the bit line BL of the first sense amplifying circuit 410 as the LSB of the memory cell MC.

10. Combining the MSB and the LSB

Figure 7J:
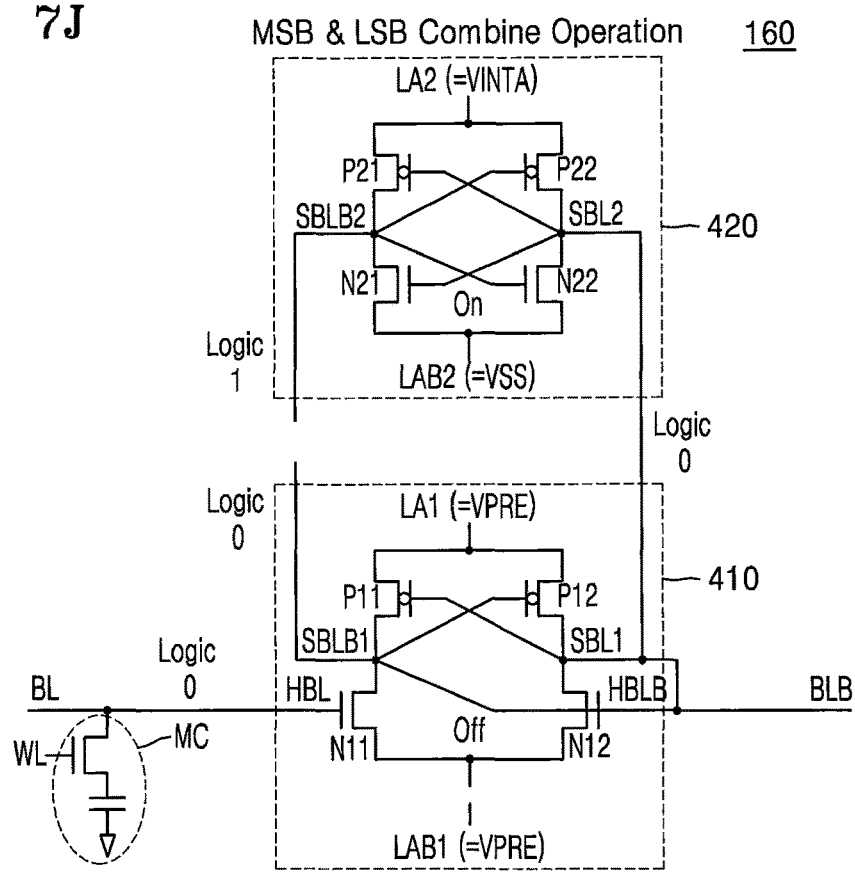

Referring to FIGS. 6 and 7J and the point in time T9 of FIG. 8, in operation S552, the sense amplifier 160 may perform an operation of combining the sensed MSB and LSB of the memory cell MC. The sense amplifier 160 may combine the sensed MSB and LSB by turning off the first sense amplifying circuit 410 and the power switch SW10, turning on the second switch SW2, turning off the third switch SW3, and turning on the sixth switch SW6.

The MSB of the logic "0" level is latched to the second sensing bit line SBL2 of the second sense amplifying circuit 420 and the LSB of the logic "0" level is latched to the first sensing bit line SBL1 of the first sense amplifying circuit 410.

The second sensing bit line SBL2, the first pair of sensing bit lines SBL1 and SBLB1, the complementary holding bit line HBLB, and the complementary bit line BLB may be connected by the complementary bit line switch SWb and the second, fourth, and sixth switches SW2, SW4, and SW6. The voltage of each of the first pair of sensing bit lines SBL1 and SBLB1, the complementary holding bit line HBLB, and the complementary bit line BLB connected to the second sensing bit line SBL2 is reduced to the logic "0" level. At this time, the voltage of each of the bit line BL and the holding bit line HBL maintains the logic "0" level.

11. The Third Charge Sharing Operation

Figure 7K:
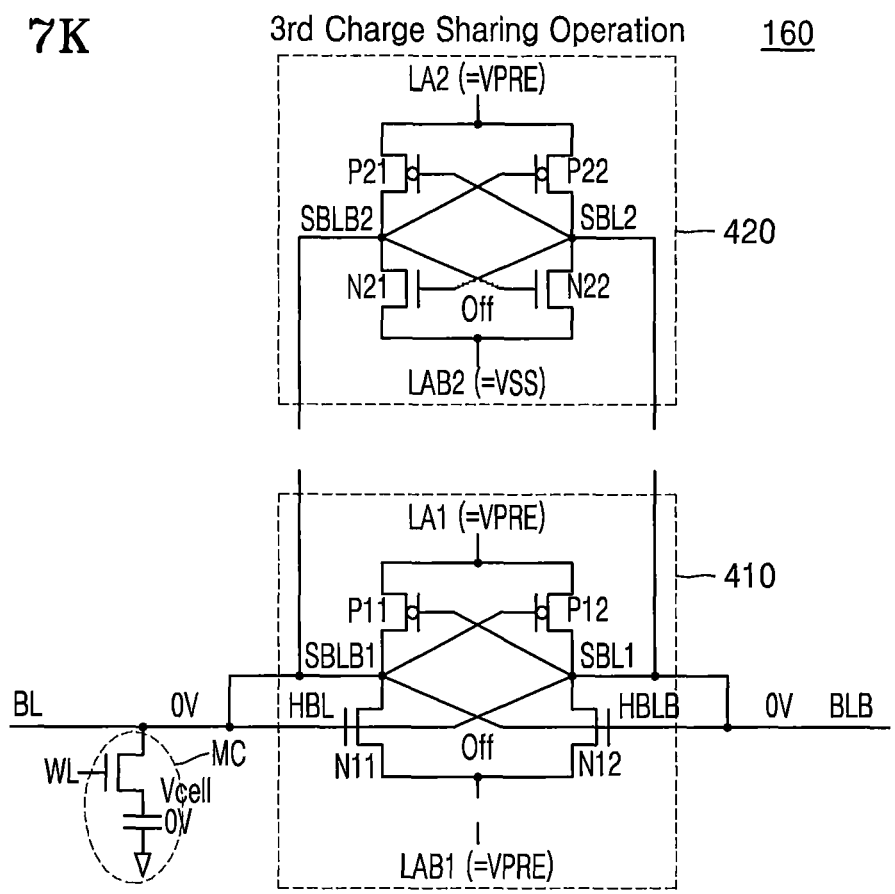

Referring to FIGS. 6 and 7K and the point in time T10 of FIG. 8, in operation S554, the sense amplifier 160 performs the third charge sharing operation among the first pair of sensing bit lines SBL1 and SBLB1, the pair of holding bit lines HBL and HBLB, and the pair of bit lines BL and BLB. The sense amplifier 160 may perform the third charge sharing operation by turning off the first sense amplifying circuit 410, turning on the first and third switches SW1 and SW3, and turning off the sixth switch SW6.

The pair of bit lines BL and BLB, the pair of holding bit lines HBL and HBLB, and the first pair of sensing bit lines SBL1 and SBLB1 may be connected by the bit line switch SWa, the complementary bit line switch SWb, and the first to fourth switches SW1 to SW4.

The sense amplifier 160 may perform the third charge sharing operation by using the cell capacitance of the memory cell MC, the bit line capacitance of each of the pair of bit lines BL and BLB, the bit line capacitance of each of the pair of holding bit lines HBL and HBLB, the bit line capacitance of each of the first pair of sensing bit lines SBL1 and SBLB1, and a change in capacitances. In the third charge sharing operation, the voltage of each of the pair of bit lines BL and BLB, the pair of holding bit lines HBL and HBLB, and the first pair of sensing bit lines SBL1 and SBLB1 has the ground voltage VSS level. The bit line BL voltage of the ground voltage VSS level is restored in the memory cell MC as the cell voltage Vcell of 0 V.

The sense amplifier 160 described above senses the cell voltage Vcell of 0 V, which is stored in the memory cell MC, as the MSB and LSB bits "00" and restores the bit line BL voltage of 0 V corresponding to the sensed MSB and LSB bits "00" in the memory cell MC as the cell voltage Vcell.

FIGS. 9A to 9K and 10 are equivalent circuits and a timing diagram illustrating an operation of a sense amplifier for sensing 2-bit data "01" corresponding to the cell voltage Vcell of 0.33 V stored in the memory cell MC. Hereinafter, description will be made based on a difference between FIGS. 7A to 7K and 8 and FIGS. 9A to 9K and 10.

1. The Pre-Charge Operation

Figure 9A:
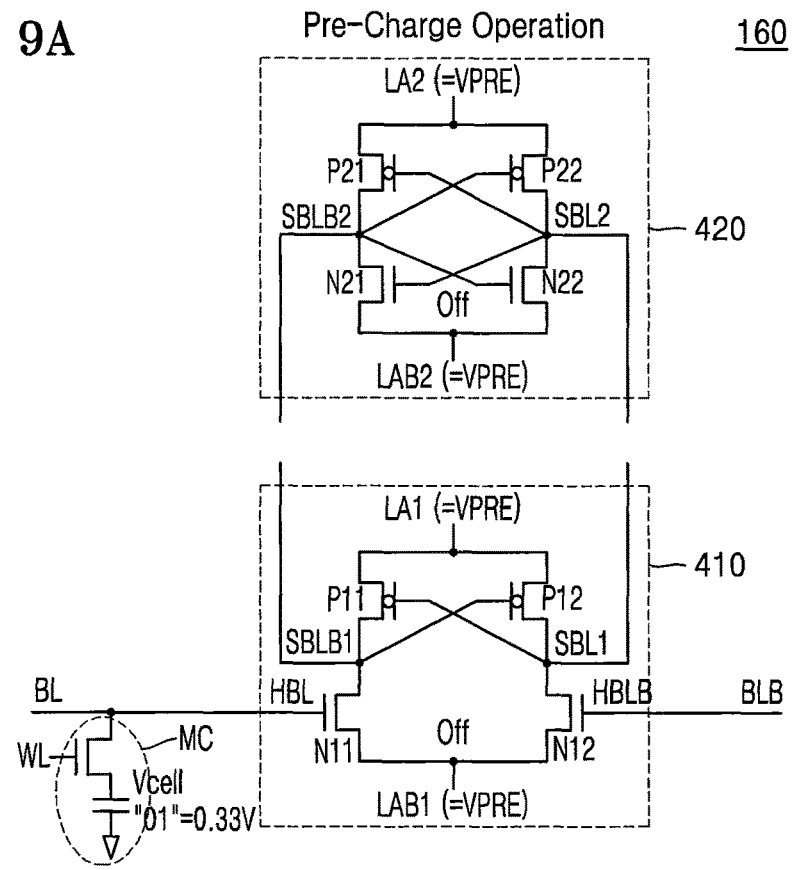
FIGS. 9A to 9K and 10 are equivalent circuits and a timing diagram illustrating an operation of a sense amplifier for sensing 2-bit data "01" corresponding to a cell voltage of 0.33 V stored in a memory cell.
Figure 10:
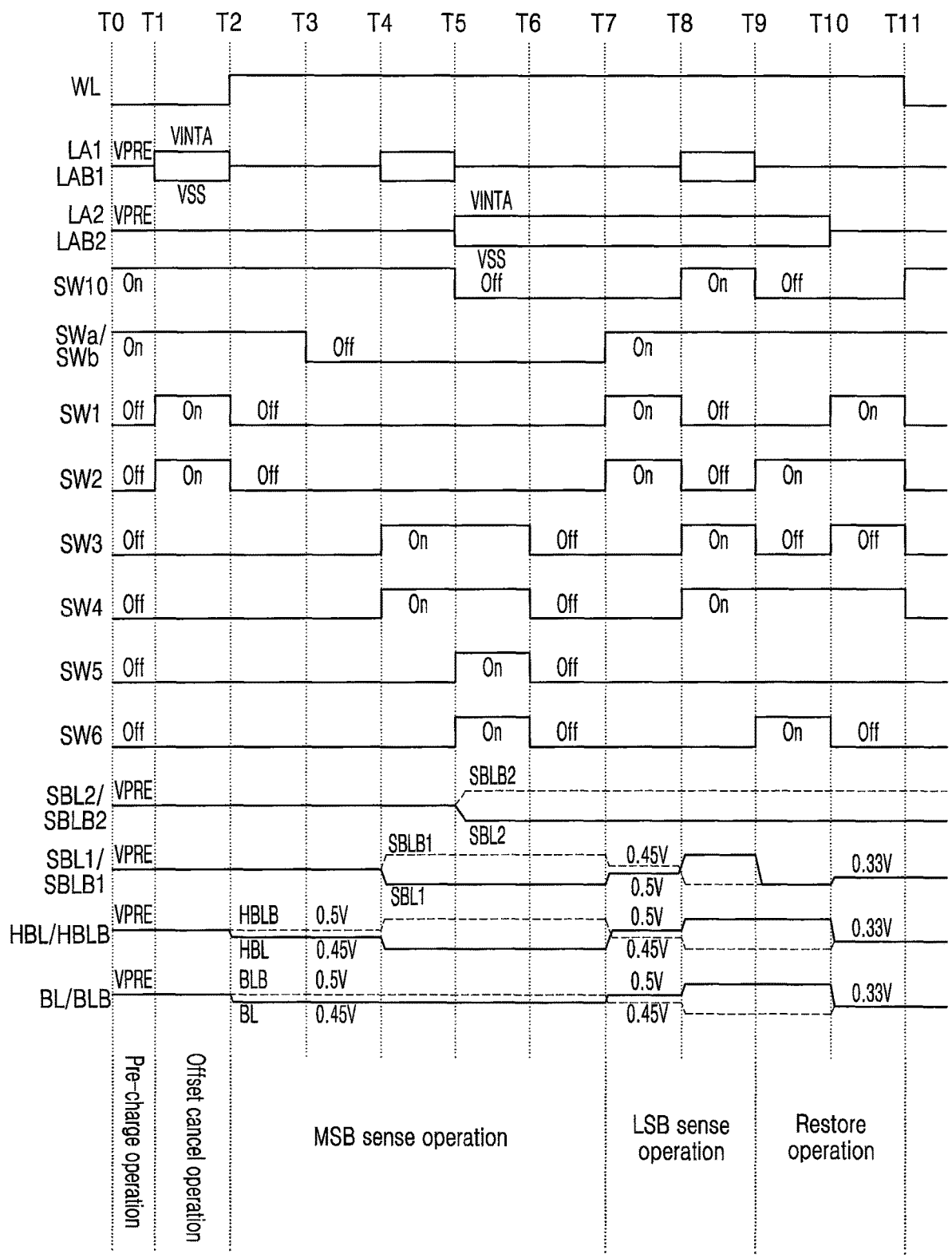

Referring to FIG. 9A and the point in time T0 of FIG. 10, the sense amplifier 160 pre-charges the bit line BL, the holding bit line HBL, the complementary bit line BLB, the complementary holding bit line HBLB, the first complementary sensing bit line SBLB1, the first sensing bit line SBL1, the second complementary sensing bit line SBLB2, the second sensing bit line SBL2, the first and second sensing driving signals LA1 and LAB1, and the third and fourth sensing driving signals LA2 and LAB2 to the pre-charge voltage VPRE.

2. The Offset Removing Operation

Figure 9B:
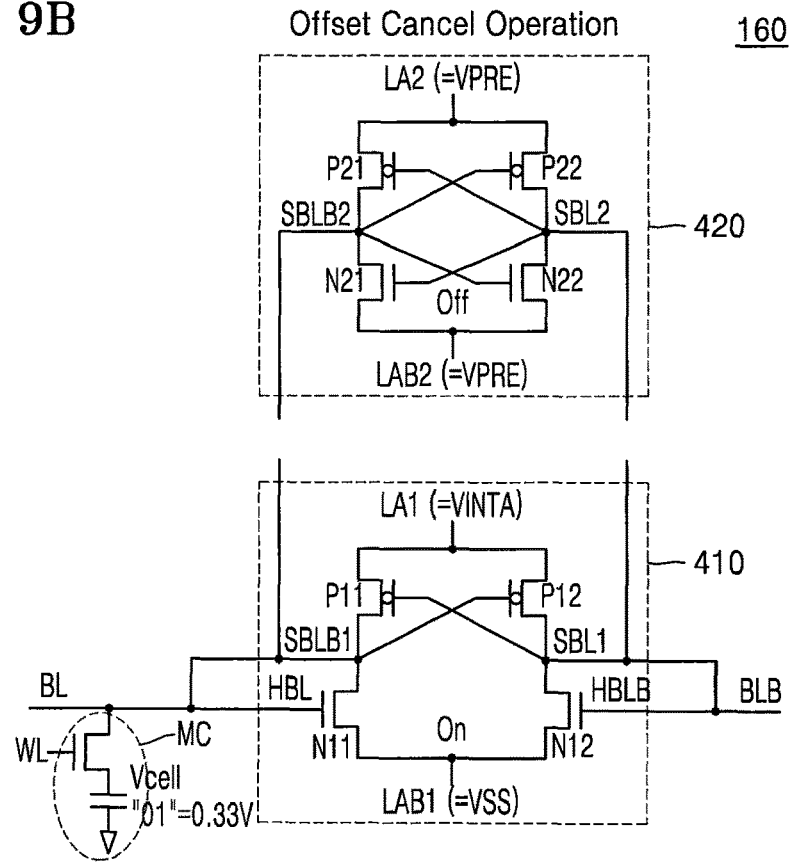

Referring to FIG. 9B and the point in time T1 of FIG. 10, the sense amplifier 160 performs the offset removing operation. In the first sense amplifying circuit 410, the complementary bit line BLB is increased or reduced to a prescribed level in comparison with the bit line BL by the offset noise of the pair of bit lines BL and BLB and accordingly, a prescribed voltage difference lies between the bit line BL and the complementary bit line BLB. The bit line BL and the complementary bit line BLB are set to have a difference by offset voltage and accordingly, the offset noise of the sense amplifier 160 may be reduced or removed.

3. The First Charge Sharing Operation

Figure 9C:
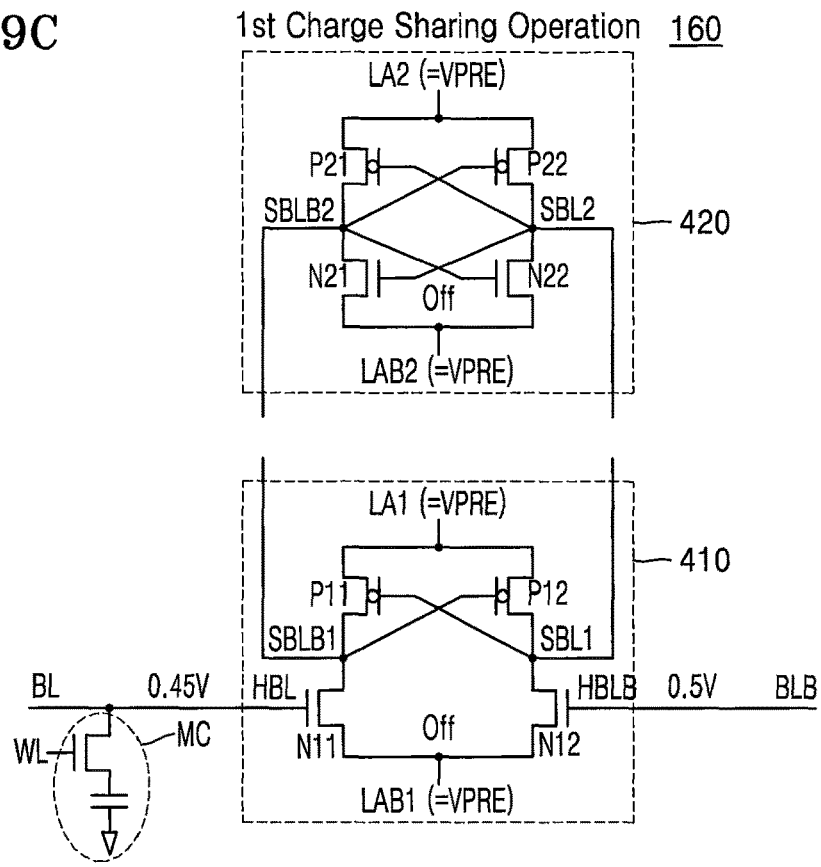

Referring to FIG. 9C and the point in time T2 of FIG. 10, the sense amplifier 160 performs the first charge sharing operation between the memory cell MC and the bit line BL. When the cell voltage Vcell of 0.33 V is stored in the memory cell MC, by the first charge sharing operation, the voltage level of each of the bit line BL and the holding bit line HBL is reduced from 0.5 V that is the pre-charge voltage VPRE to about 0.45 V. At this time, each of the complementary bit line BLB and the complementary holding bit line HBLB maintains the level of the pre-charge voltage VPRE, that is, 0.5 V.

4. The Charge Holding Operation

Figure 9D:
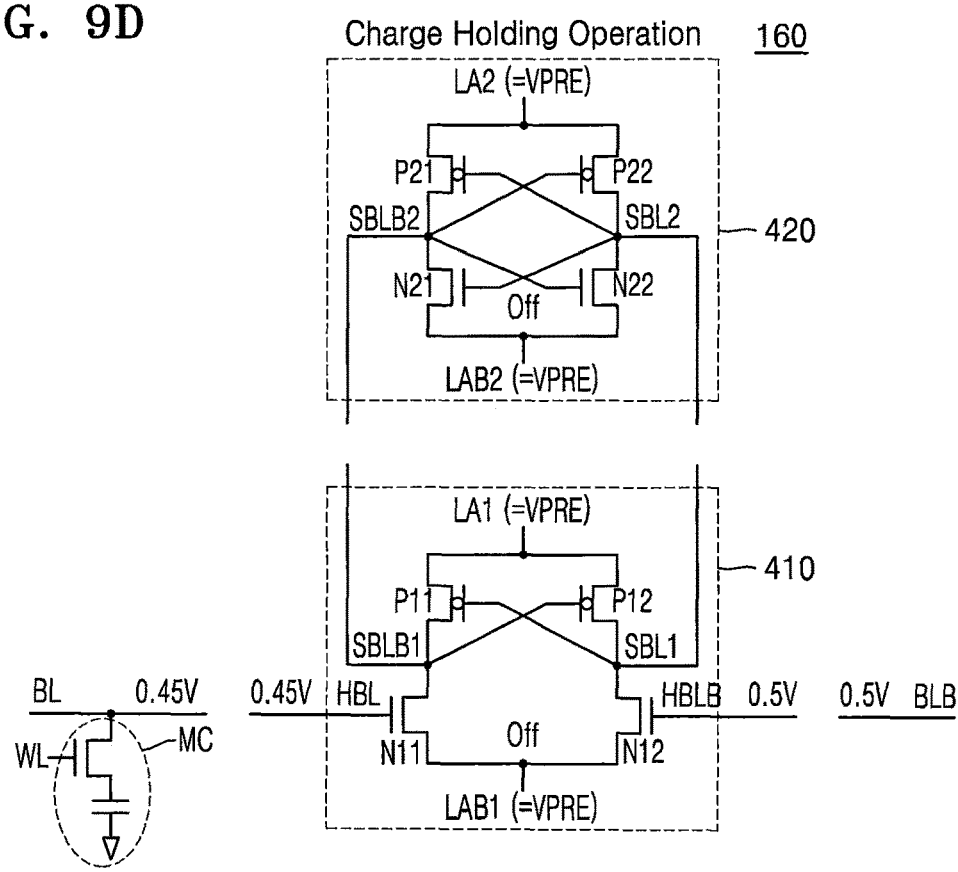

Referring to FIG. 9D and the point in time T3 of FIG. 10, the sense amplifier 160 holds the charges of the bit line BL and the holding bit line HBL in accordance with the first charge sharing operation. Each of the bit line BL and the holding bit line HBL maintains the voltage level of about 0.45 V and each of the complementary bit line BLB and the complementary holding bit line HBLB maintains the voltage level of about 0.5 V.

5. The MSB Sense Operation

Figure 9E:
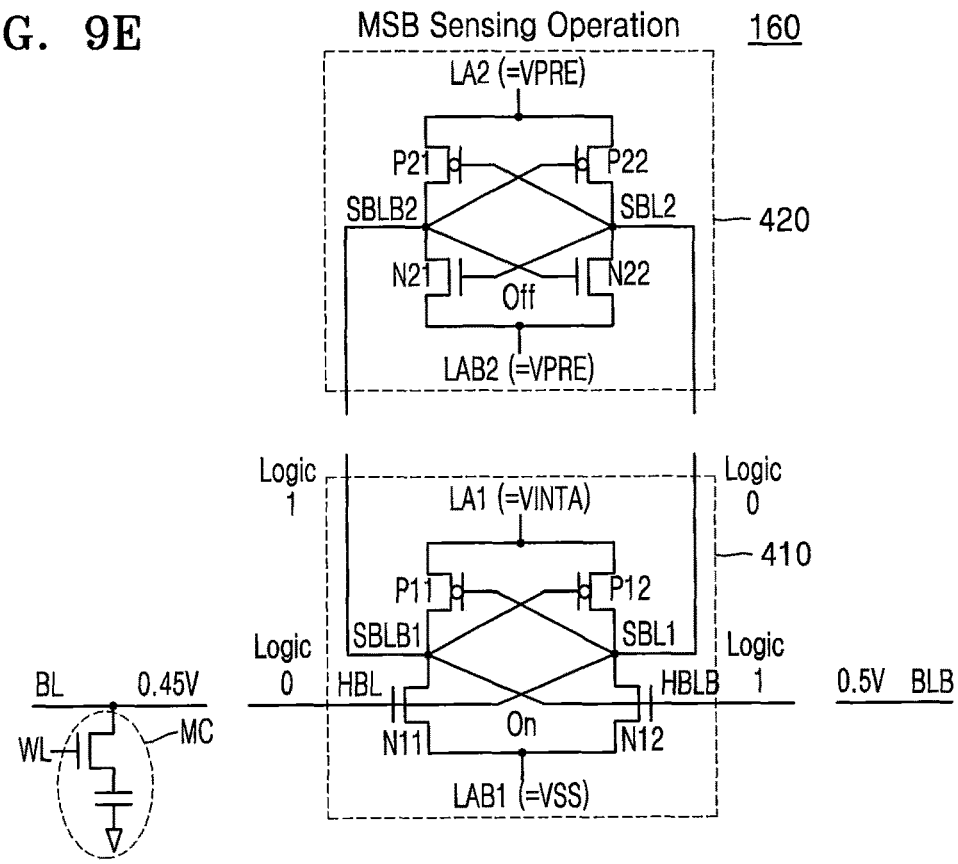

Referring to FIG. 9E and the point in time T4 of FIG. 10, the sense amplifier 160 performs the MSB sense operation of sensing the MSB of the 2-bit combination represented by the cell voltage Vcell stored in the memory cell MC.

The first sense amplifying circuit 410 may increase the voltage of the first complementary sensing bit line SBLB1 to the logic "1" level and may reduce the voltage of the first sensing bit line SBL1 to the logic "0" level by sensing the MSB of the 2-bit combination based on a difference between a holding bit line HBL voltage of 0.45 V and a complementary holding bit line HBLB voltage of 0.5 V that are respectively applied to the gates of the first and second NMOS transistors N11 and N12. The voltage of the complementary holding bit line HBLB connected to the first complementary sensing bit line SBLB1 is increased to the logic "1" level and the voltage of the holding bit line HBL connected to the first sensing bit line SBL1 is reduced to the logic "0" level.

6. The First MSB Latching Operation

Figure 9F:
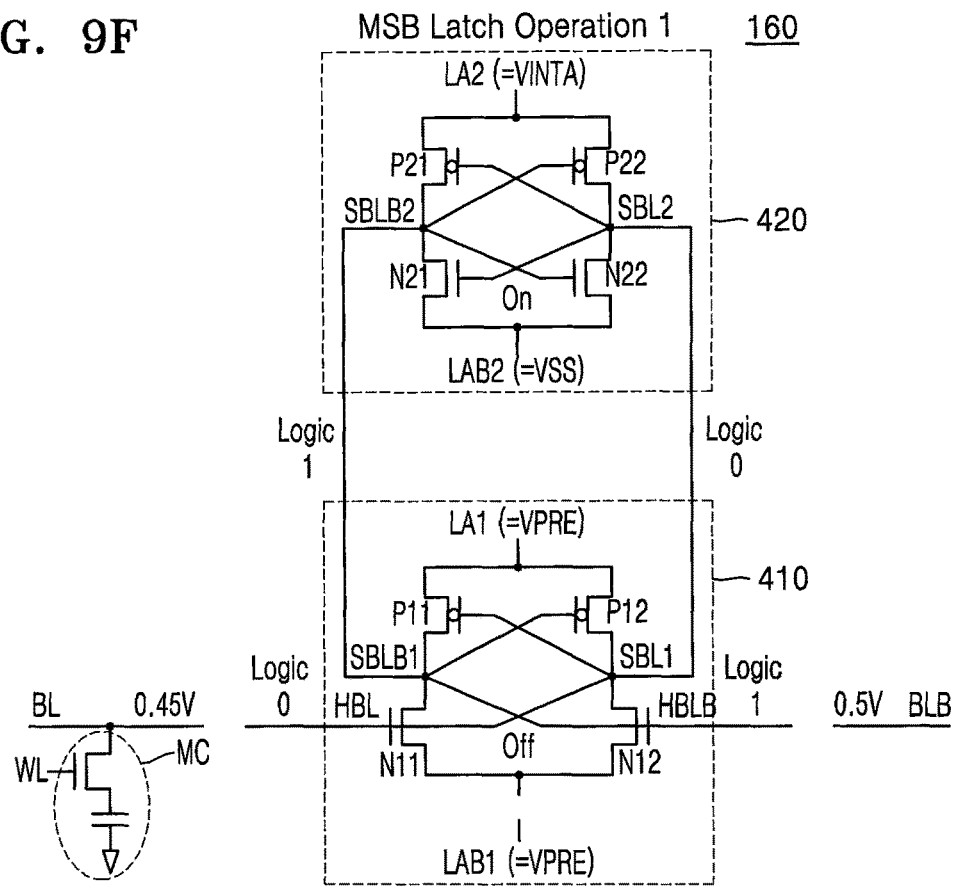

Referring to FIG. 9F and the point in time T5 of FIG. 10, the sense amplifier 160 performs the first MSB latching operation of latching the MSB of the 2-bit data.

The second sense amplifying circuit 420 may increase the voltage of the second complementary sensing bit line SBLB2 to the logic "1" level and may reduce the voltage of the second sensing bit line SBL2 to the logic "0" level by sensing the MSB of the 2-bit combination based on a voltage difference between the second complementary sensing bit line SBLB2 and the second sensing bit line SBL2. The voltage of each of the first complementary sensing bit line SBLB1 and the complementary holding bit line HBLB connected to the second complementary sensing bit line SBLB2 is at the logic "1" level. The voltage of each of the first sensing bit line SBL1 and the holding bit line HBL connected to the second sensing bit line SBL2 is at the logic "0" level.

7. The Second MSB Latching Operation

Figure 9G:
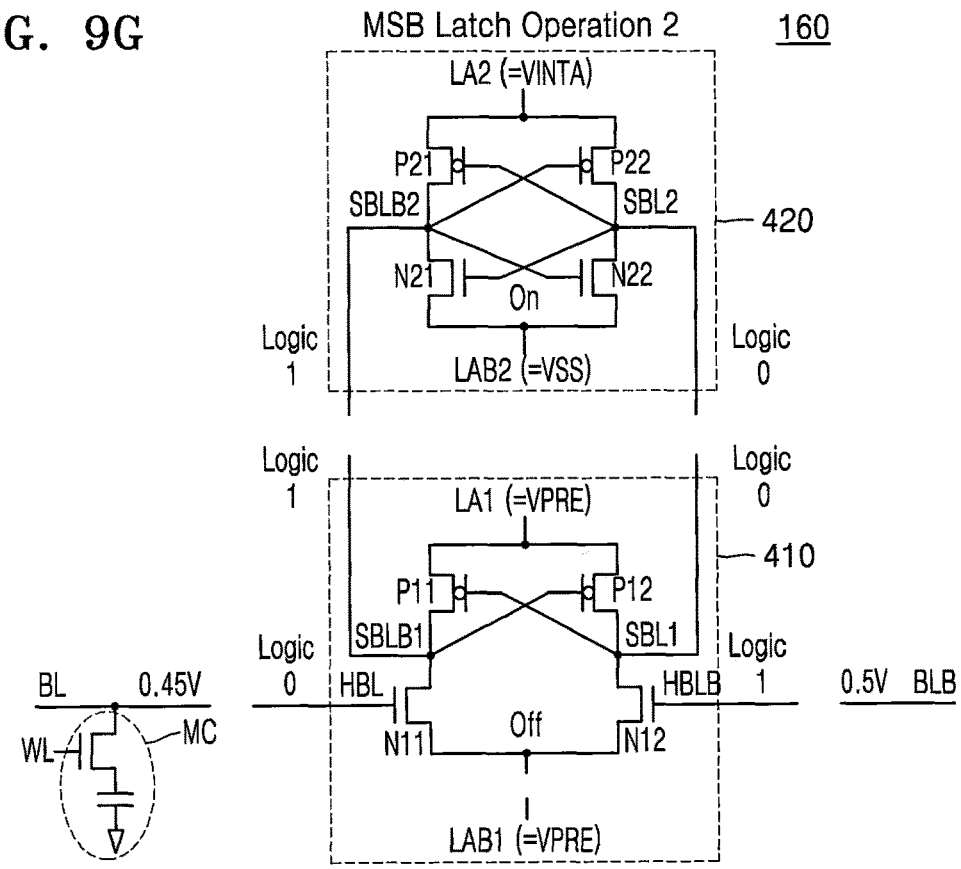

Referring to FIG. 9G and the point in time T6 of FIG. 10, the sense amplifier 160 performs the second MSB latching operation.

The logic "0" level may be latched to the second sensing bit line SBL2 of the second sense amplifying circuit 420 as the MSB of the memory cell MC.

8. The Second Charge Sharing Operation

Figure 9H:
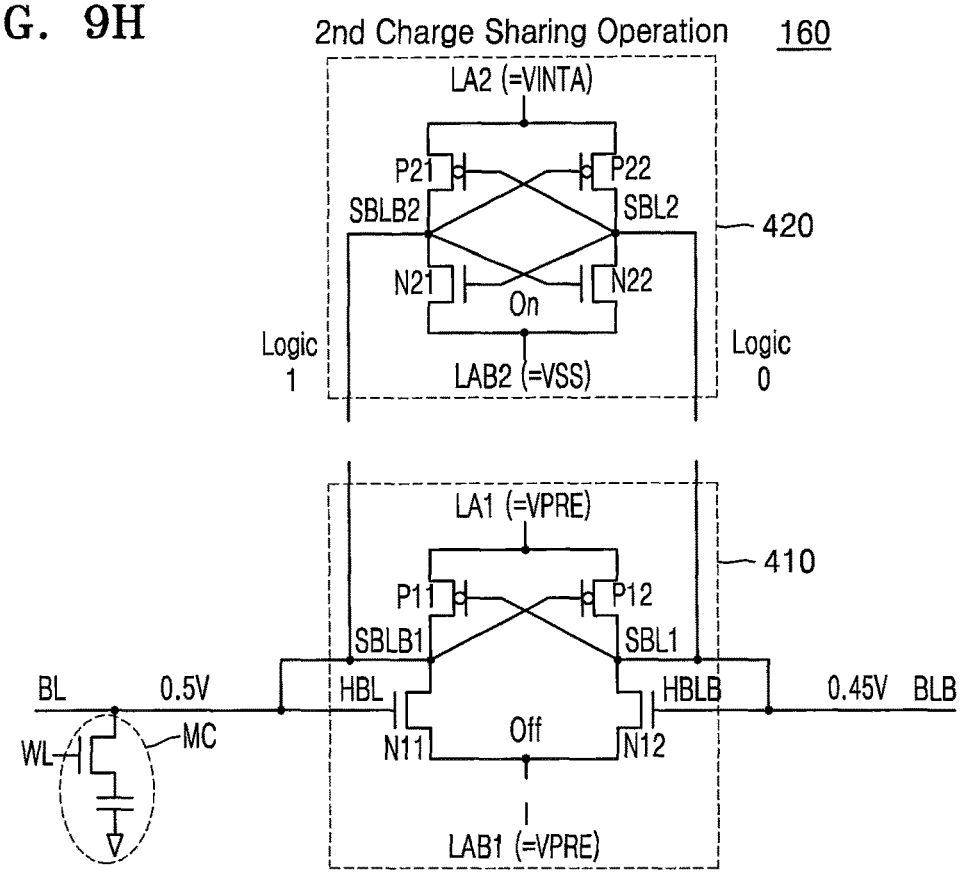

Referring to FIG. 9H and the point in time T7 of FIG. 10, the sense amplifier 160 performs the second charge sharing operation among the first complementary sensing bit line SBLB1, the holding bit line HBL, and the bit line BL and among the first sensing bit line SBL1, the complementary holding bit line HBLB, and the complementary bit line BLB.

In the second charge sharing operation, the voltage of each of the bit line BL, the holding bit line HBL, and the first complementary sensing bit line SBLB1 is captured as about 0.5 V and the voltage of each of the complementary bit line BLB, the complementary holding bit line HBLB, and the first sensing bit line SBL1 is captured as about 0.45 V.

9. The LSB Sense Operation

Figure 9I:
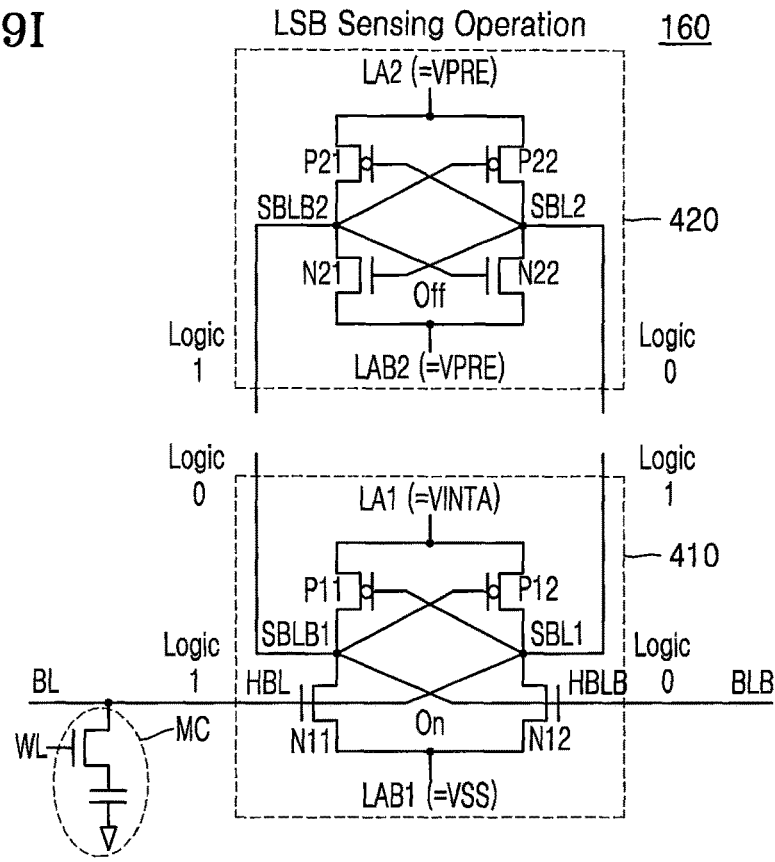

Referring to FIG. 9I and the point in time T8 of FIG. 10, the sense amplifier 160 performs the LSB sense operation of sensing the LSB of the 2-bit combination represented by the cell voltage Vcell stored in the memory cell MC.

The first sense amplifying circuit 410 may reduce the voltage of the first complementary sensing bit line SBLB1 to the logic "0" level and may increase the voltage of the first sensing bit line SBL1 to the logic "1" level by sensing the LSB of the 2-bit combination based on a difference between a bit line BL voltage of 0.5 V applied to each of gates of the first PMOS and NMOS transistors P11 and N11 and a complementary bit line BLB voltage of 0.45 V applied to each of gates of the second PMOS and NMOS transistors P12 and N12.

The voltage of each of the complementary bit line BLB and the complementary holding bit line HBLB connected to the first complementary sensing bit line SBLB1 is reduced to the logic "0" level and the voltage of each of the bit line BL and the holding bit line HBL connected to the first sensing bit line SBL1 is increased to the logic "1" level.

The logic "1" level may be latched to the bit line BL of the first sense amplifying circuit 410 as the LSB of the memory cell MC.

10. Combining the MSB and the LSB

Figure 9J:
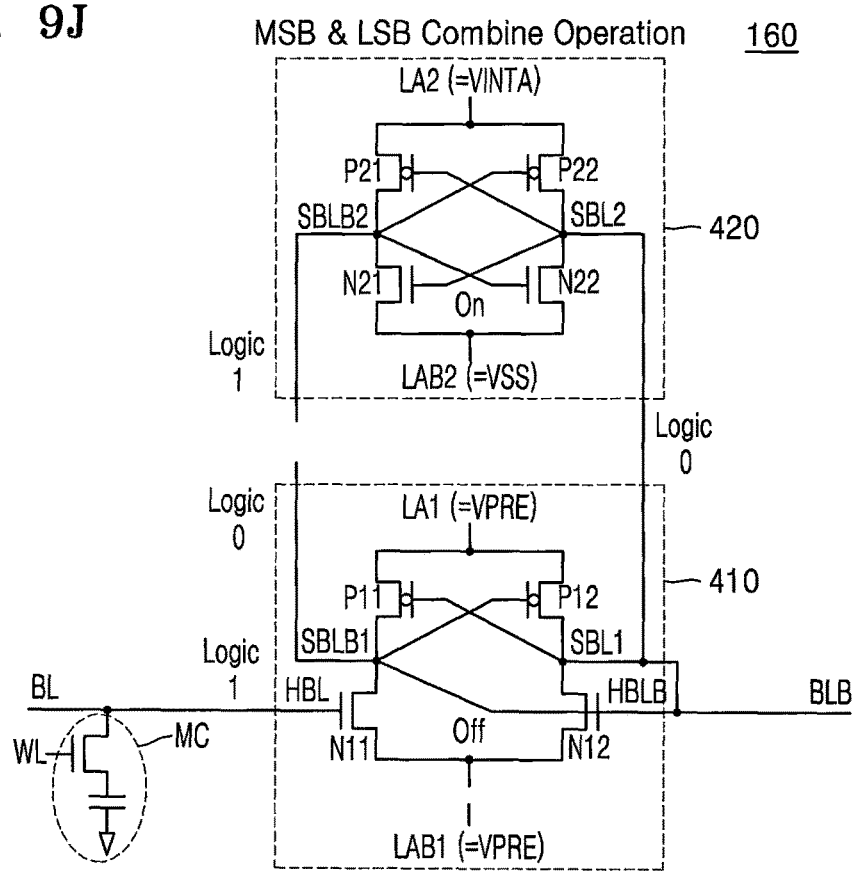

Referring to FIG. 9J and the point in time T9 of FIG. 10, the sense amplifier 160 may perform an operation of combining the sensed MSB and LSB of the memory cell MC.

The MSB of the logic "0" level is latched to the second sensing bit line SBL2 of the second sense amplifying circuit 420 and the LSB of the logic "1" level is latched to the first sensing bit line SBL1 of the first sense amplifying circuit 410.

The second sensing bit line SBL2, the first pair of sensing bit lines SBL1 and SBLB1, the complementary holding bit line HBLB, and the complementary bit line BLB may be connected by the complementary bit line switch SWb and the second, fourth, and sixth switches SW2, SW4, and SW6. In the second sense amplifying circuit 420, the voltage of the second sensing bit line SBL2 is at the logic "0" level and the voltage of each of the first pair of sensing bit lines SBL1 and SBLB1, the complementary holding bit line HBLB, and the complementary bit line BLB connected to the second sensing bit line SBL2 is at the logic "0" level. At this time, the voltage of each of the bit line BL and the holding bit line HBL maintains the logic "1" level.

11. The Third Charge Sharing Operation

Figure 9K:
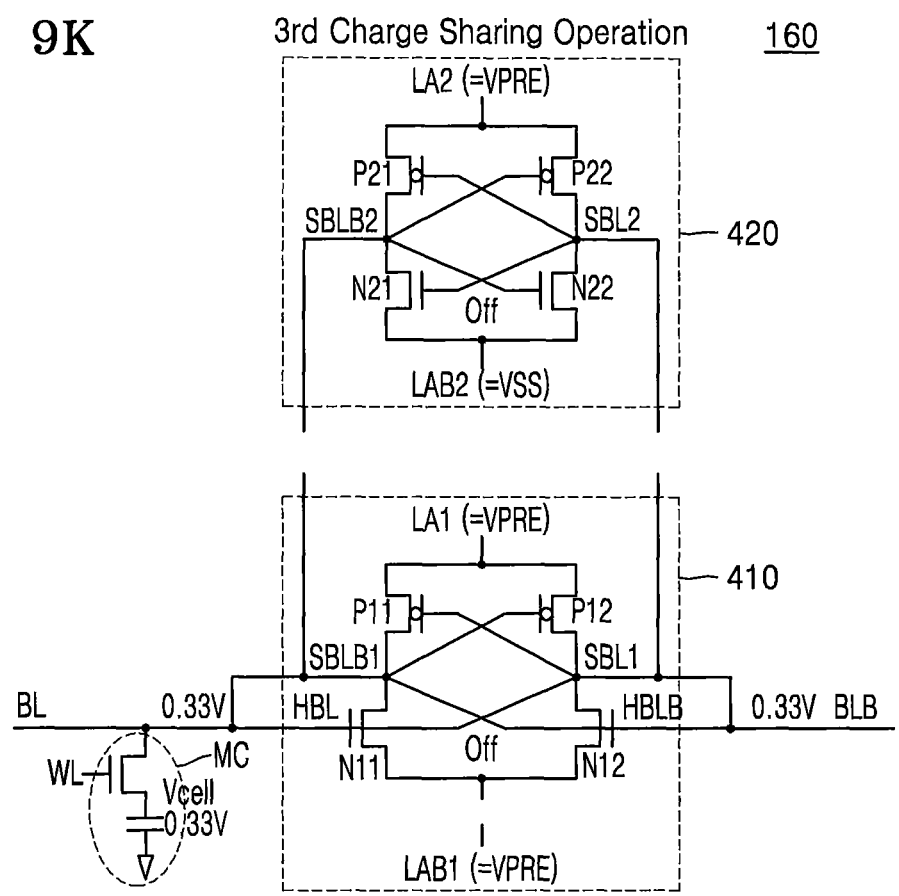

Referring to FIG. 9K and the point in time T10 of FIG. 10, the sense amplifier 160 performs the third charge sharing operation among the first pair of sensing bit lines SBL1 and SBLB1, the pair of holding bit lines HBL and HBLB, and the pair of bit lines BL and BLB.

The sense amplifier 160 may perform the third charge sharing operation by using the cell capacitance of the memory cell MC, the bit line capacitance of each of the pair of bit lines BL and BLB, the bit line capacitance of each of the pair of holding bit lines HBL and HBLB, the bit line capacitance of each of the first pair of sensing bit lines SBL1 and SBLB1, and a change in capacitances. In the third charge sharing operation, the voltage of each of the pair of bit lines BL and BLB, the pair of holding bit lines HBL and HBLB, and the first pair of sensing bit lines SBL1 and SBLB1 have a level of about 0.33 V. The bit line BL voltage is reduced to 0.33 V at the logic "1" level and the bit line BL voltage of 0.33 V is restored in the memory cell MC as the cell voltage Vcell.

The sense amplifier 160 described above senses the cell voltage Vcell of 0.33 V, which is stored in the memory cell MC, as the MSB and LSB bits "01" and restores the bit line BL voltage of 0.33 V corresponding to the sensed MSB and LSB bits "01" in the memory cell MC as the cell voltage Vcell.

FIGS. 11A to 11K and 12 are equivalent circuits and a timing diagram illustrating an operation of a sense amplifier for sensing 2-bit data "10" corresponding to a cell voltage of 0.67 V stored in the memory cell MC. Hereinafter, description will be made based on a difference between FIGS. 7A to 7K and 8 and FIGS. 11A to 11K and 12.

1. The Pre-Charge Operation

Figure 11A:
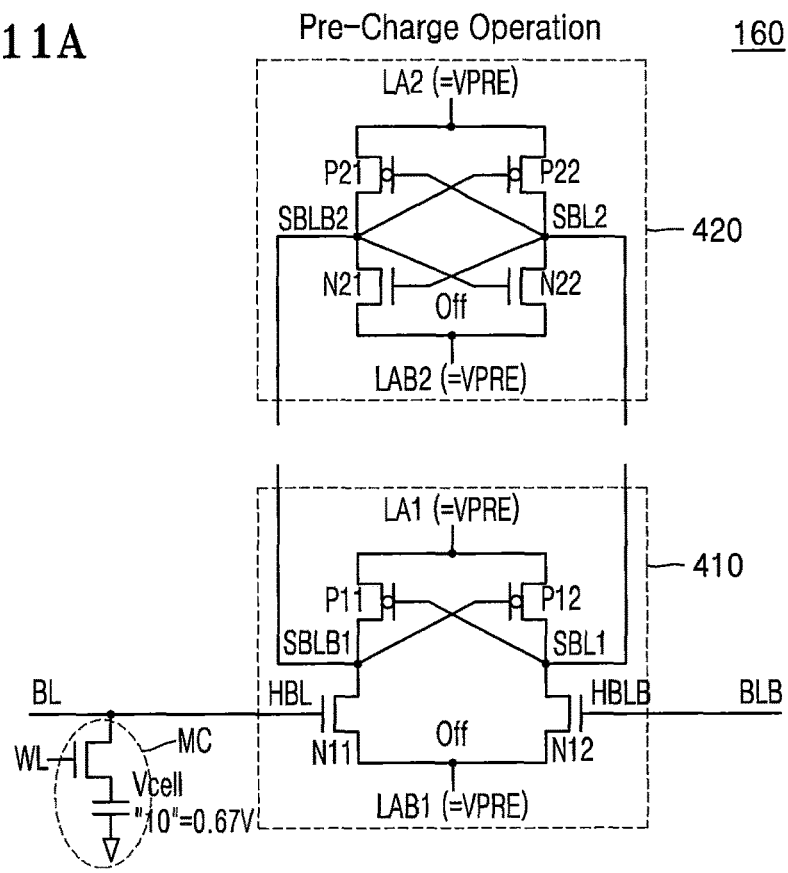
FIGS. 11A to 11K and 12 are equivalent circuits and a timing diagram illustrating an operation of a sense amplifier for sensing 2-bit data "10" corresponding to a cell voltage of 0.67 V stored in a memory cell.
Figure 12:
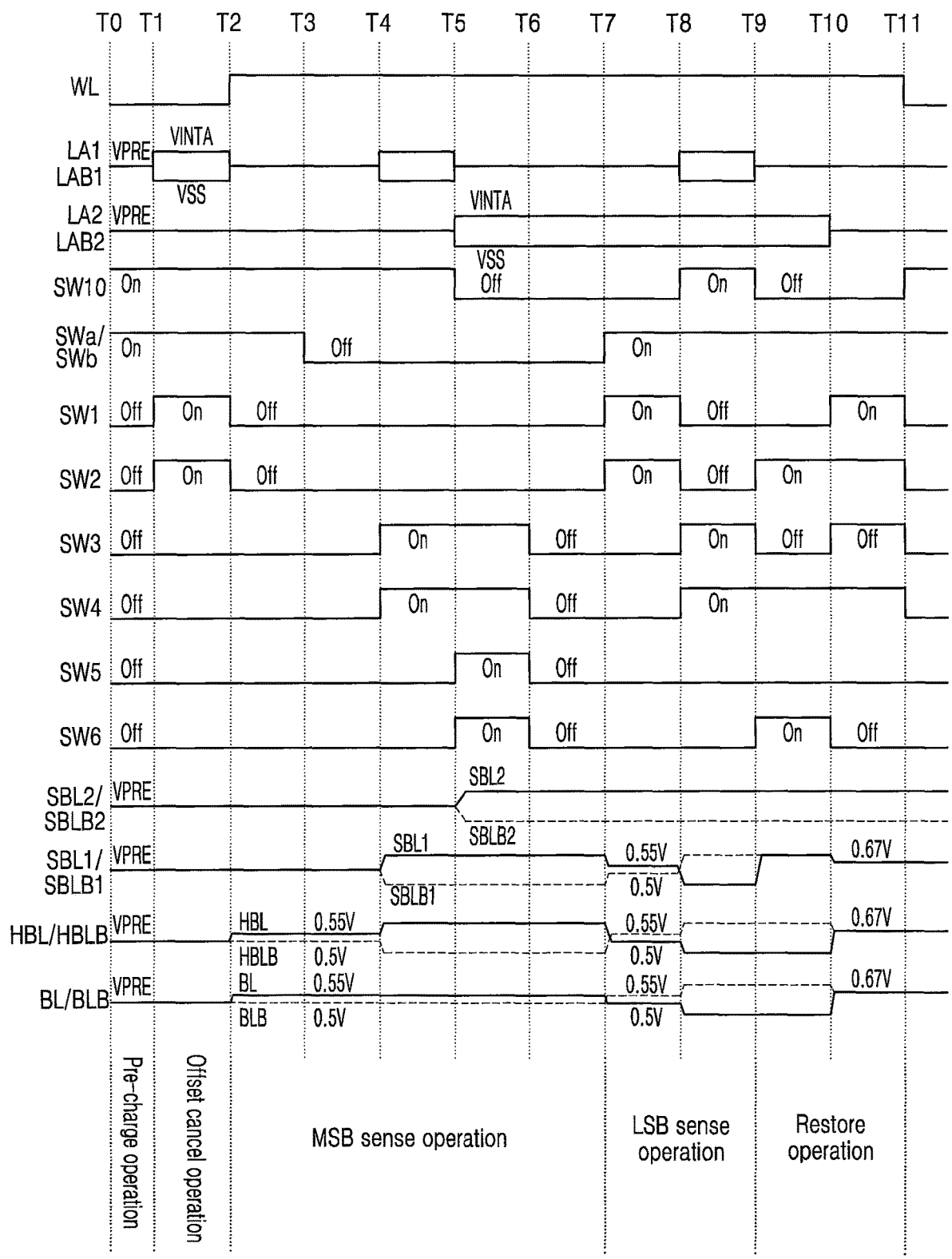

Referring to FIG. 11A and the point in time T0 of FIG. 12, the sense amplifier 160 pre-charges the bit line BL, the holding bit line HBL, the complementary bit line BLB, the complementary holding bit line HBLB, the first complementary sensing bit line SBLB1, the first sensing bit line SBL1, the second complementary sensing bit line SBLB2, the second sensing bit line SBL2, the first and second sensing driving signals LA1 and LAB1, and the third and fourth sensing driving signals LA2 and LAB2 to the pre-charge voltage VPRE.

2. The Offset Removing Operation

Figure 11B:
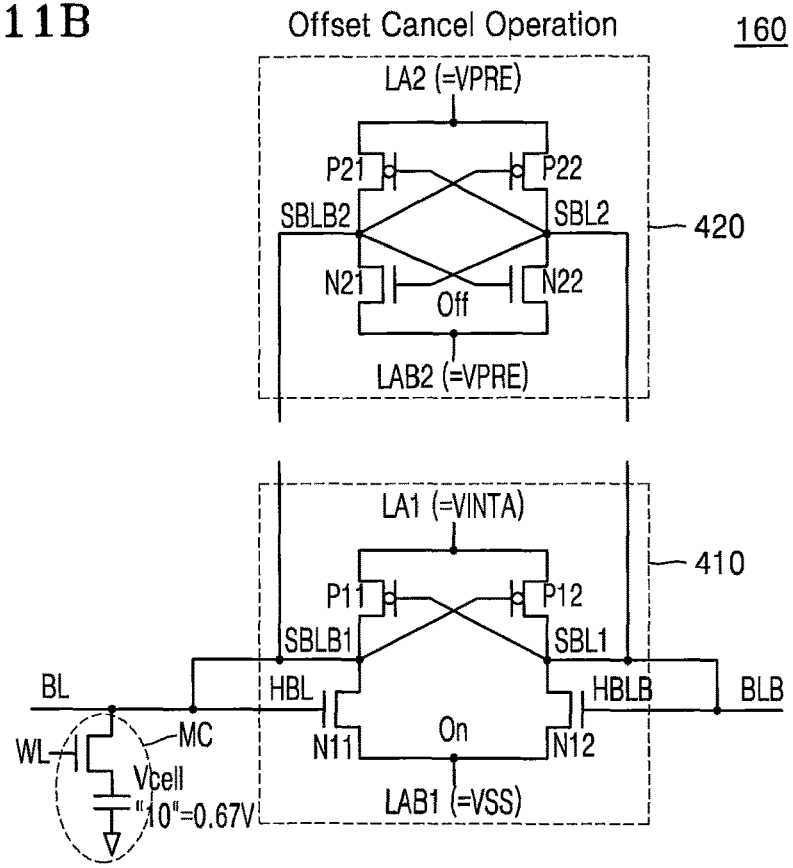

Referring to FIG. 11B and the point in time T1 of FIG. 12, the sense amplifier 160 performs the offset removing operation. In the first sense amplifying circuit 410, the complementary bit line BLB is increased or reduced to a prescribed level in comparison with the bit line BL by the offset noise of the pair of bit lines BL and BLB and accordingly, a prescribed voltage difference lies between the bit line BL and the complementary bit line BLB. The bit line BL and the complementary bit line BLB are set to have a difference by offset voltage and accordingly, the offset noise of the sense amplifier 160 may be removed.

3. The First Charge Sharing Operation

Figure 11C:
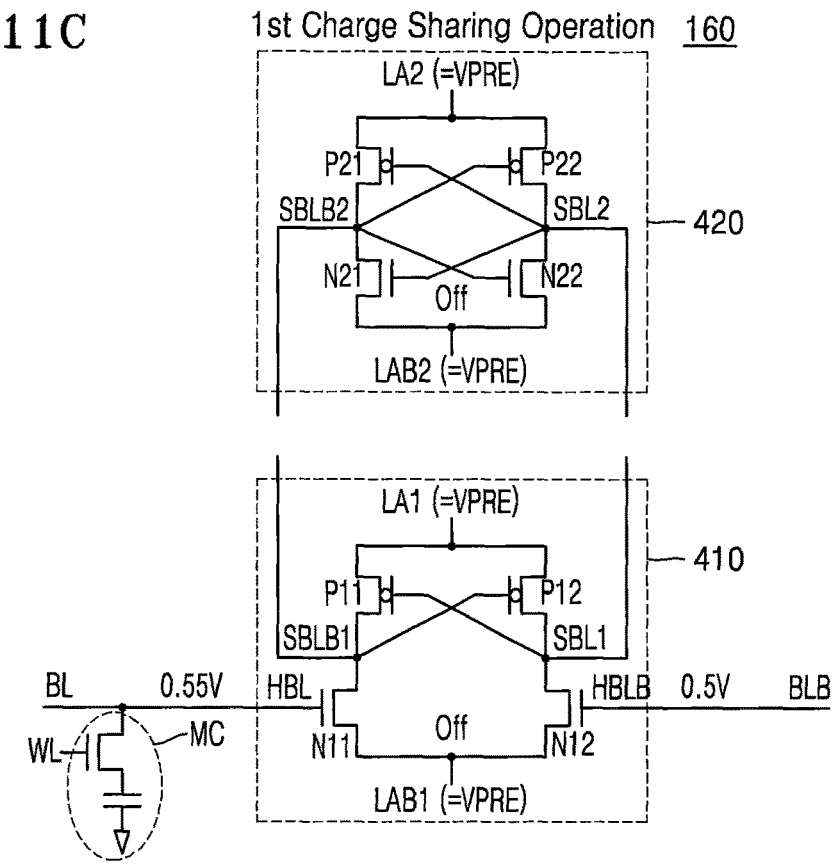

Referring to FIG. 11C and the point in time T2 of FIG. 12, the sense amplifier 160 performs the first charge sharing operation between the memory cell MC and the bit line BL. When the cell voltage Vcell of 0.67 V is stored in the memory cell MC, by the first charge sharing operation, the voltage level of each of the bit line BL and the holding bit line HBL is increased from 0.5 V that is the pre-charge voltage VPRE to about 0.55 V. At this time, each of the complementary bit line BLB and the complementary holding bit line HBLB maintains the level of the pre-charge voltage VPRE, that is, 0.5 V.

4. The Charge Holding Operation

Figure 11D:
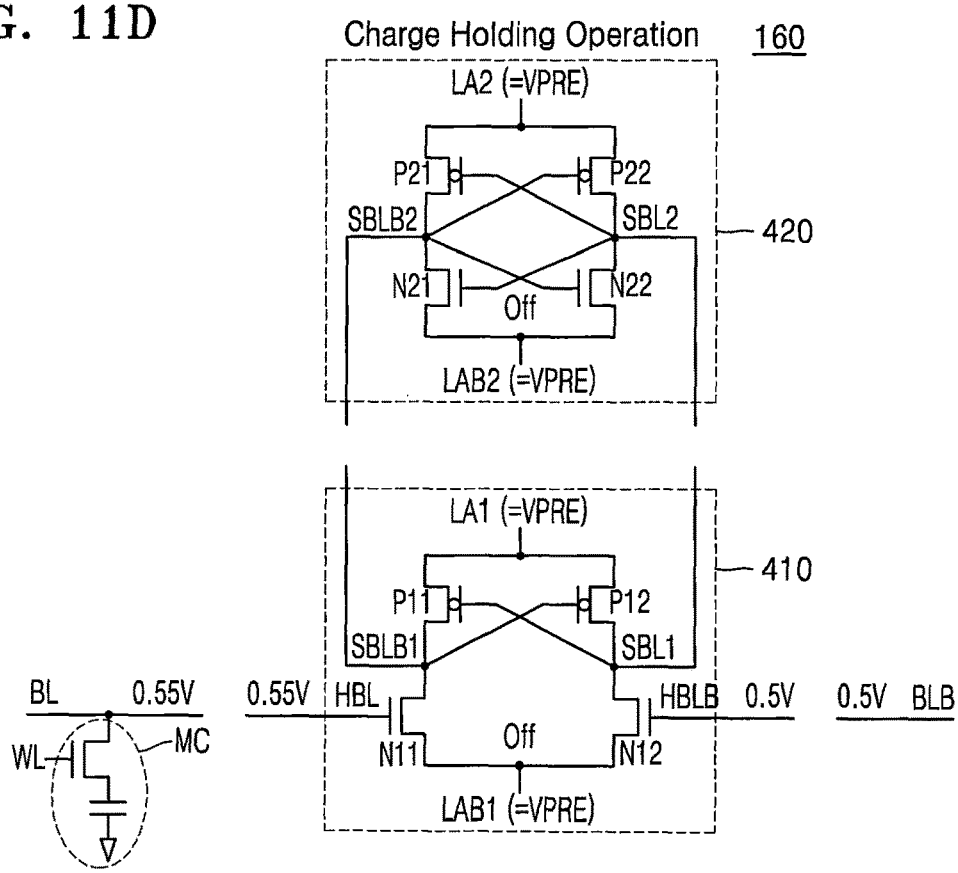

Referring to FIG. 11D and the point in time T3 of FIG. 12, the sense amplifier 160 holds the charges of the bit line BL and the holding bit line HBL in accordance with the first charge sharing operation. Each of the bit line BL and the holding bit line HBL maintains the voltage level of about 0.55 V and each of the complementary bit line BLB and the complementary holding bit line HBLB maintains the voltage level of about 0.5 V.

5. The MSB Sense Operation

Figure 11E:
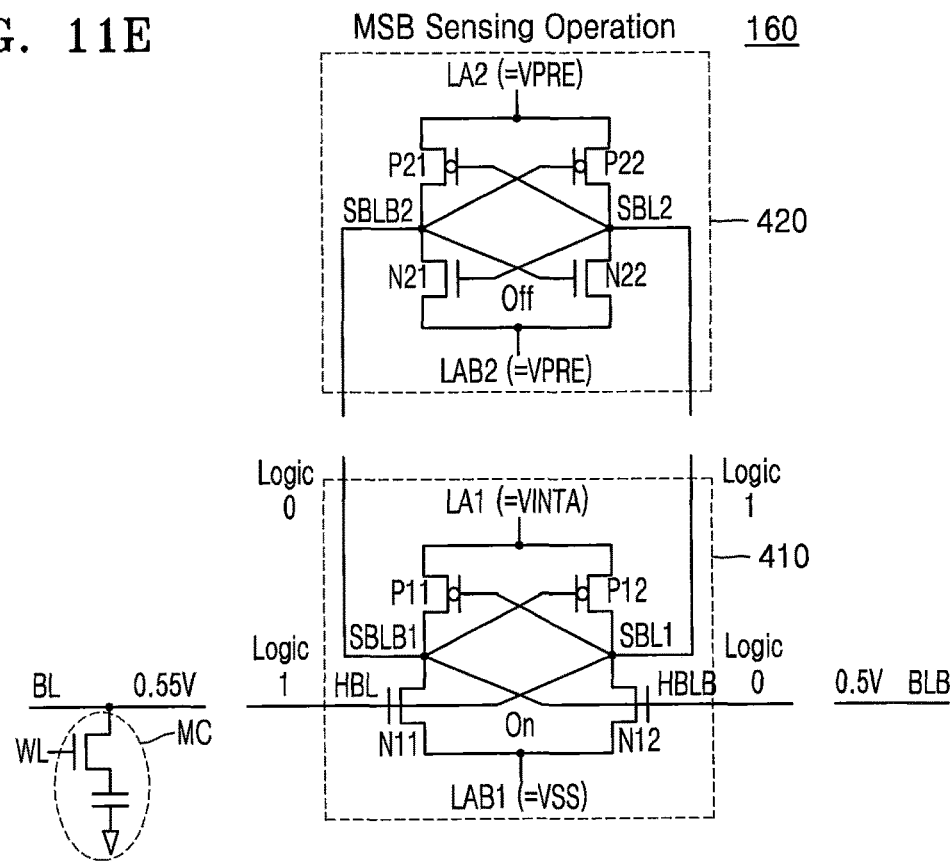

Referring to FIG. 11E and the point in time T4 of FIG. 12, the sense amplifier 160 performs the MSB sense operation of sensing the MSB of the 2-bit combination represented by the cell voltage Vcell stored in the memory cell MC.

The first sense amplifying circuit 410 may reduce the voltage of the first complementary sensing bit line SBLB1 to the logic "0" level and may increase the voltage of the first sensing bit line SBL1 to the logic "1" level by sensing the MSB of the 2-bit combination based on a difference between a holding bit line HBL voltage of 0.55 V and a complementary holding bit line HBLB voltage of 0.5 V that are respectively applied to the gates of the first and second NMOS transistors N11 and N12. The voltage of the complementary holding bit line HBLB connected to the first complementary sensing bit line SBLB1 is reduced to the logic "0" level and the voltage of the holding bit line HBL connected to the first sensing bit line SBL1 is increased to the logic "1" level.

6. The First MSB Latching Operation

Figure 11F:
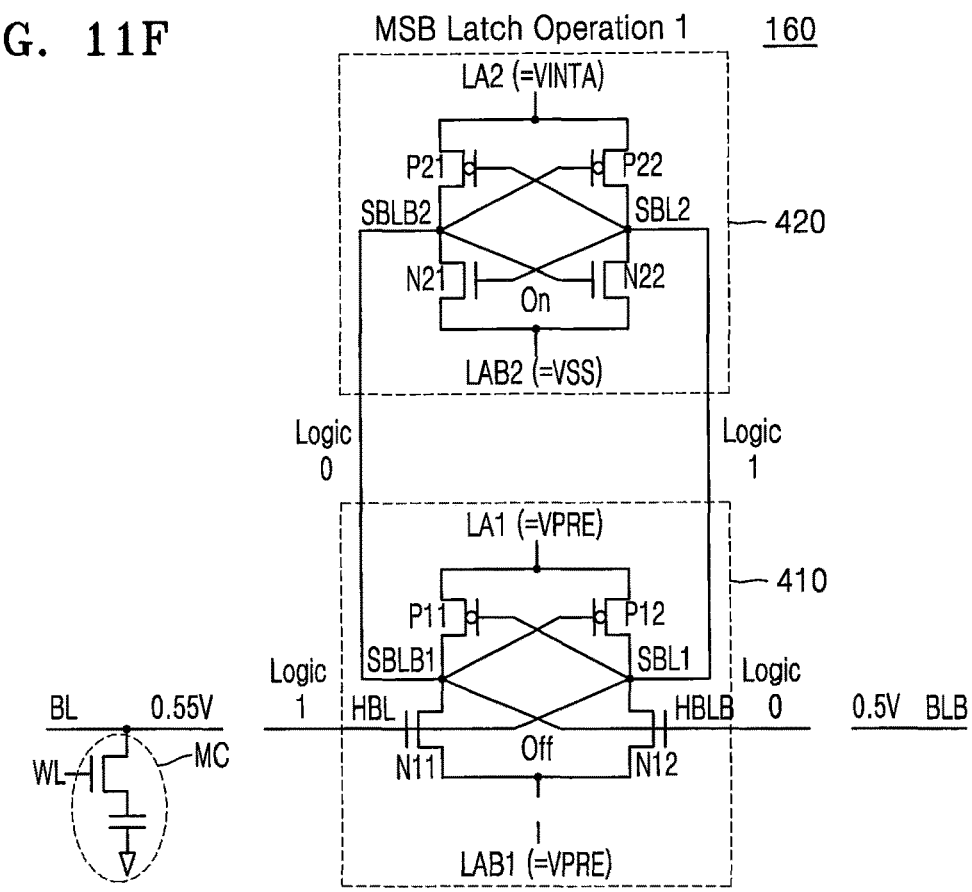

Referring to FIG. 11F and the point in time T5 of FIG. 12, the sense amplifier 160 performs the first MSB latching operation of latching the MSB of the 2-bit data.

The second sense amplifying circuit 420 may reduce the voltage of the second complementary sensing bit line SBLB2 to the logic "0" level and may increase the voltage of the second sensing bit line SBL2 to the logic "1" level by sensing the MSB of the 2-bit combination based on a voltage difference between the second complementary sensing bit line SBLB2 and the second sensing bit line SBL2. The voltage of each of the first complementary sensing bit line SBLB1 and the complementary holding bit line HBLB connected to the second complementary sensing bit line SBLB2 is at the logic "0" level. The voltage of each of the first sensing bit line SBL1 and the holding bit line HBL connected to the second sensing bit line SBL2 is at the logic "1" level.

7. The Second MSB Latching Operation

Figure 11G:
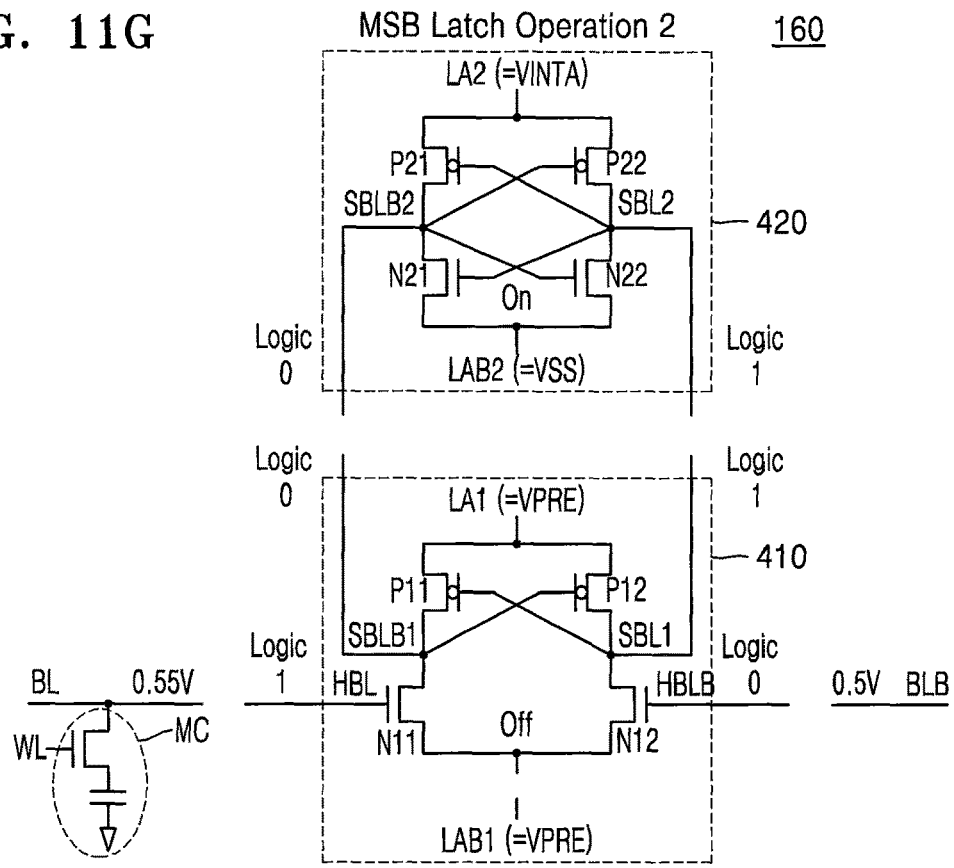

Referring to FIG. 11G and the point in time T6 of FIG. 12, the sense amplifier 160 performs the second MSB latching operation.

The logic "1" level may be latched to the second sensing bit line SBL2 of the second sense amplifying circuit 420 as the MSB of the memory cell MC.

8. The Second Charge Sharing Operation

Figure 11H:
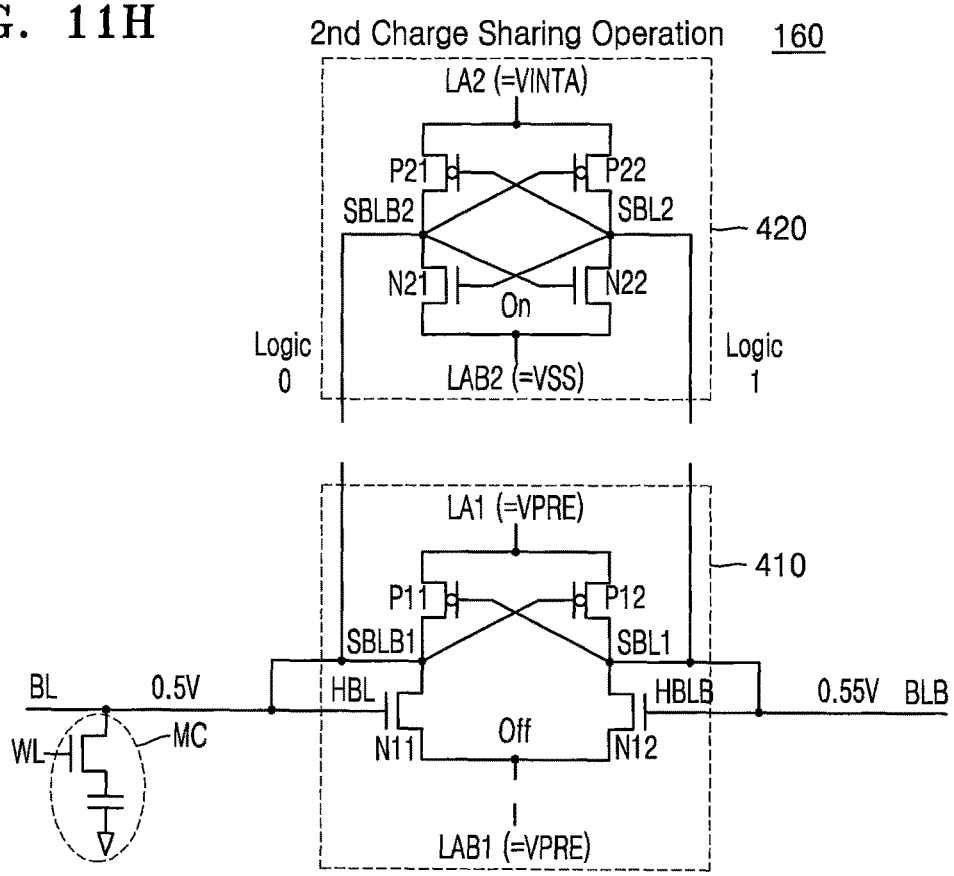

Referring to FIG. 11H and the point in time T7 of FIG. 12, the sense amplifier 160 performs the second charge sharing operation among the first complementary sensing bit line SBLB1, the holding bit line HBL, and the bit line BL and among the first sensing bit line SBL1, the complementary holding bit line HBLB, and the complementary bit line BLB.

In the second charge sharing operation, the voltage of each of the bit line BL, the holding bit line HBL, and the first complementary sensing bit line SBLB1 is captured as about 0.5 V and the voltage of each of the complementary bit line BLB, the complementary holding bit line HBLB, and the first sensing bit line SBL1 is captured as about 0.55 V.

9. The LSB Sense Operation

Figure 11I:
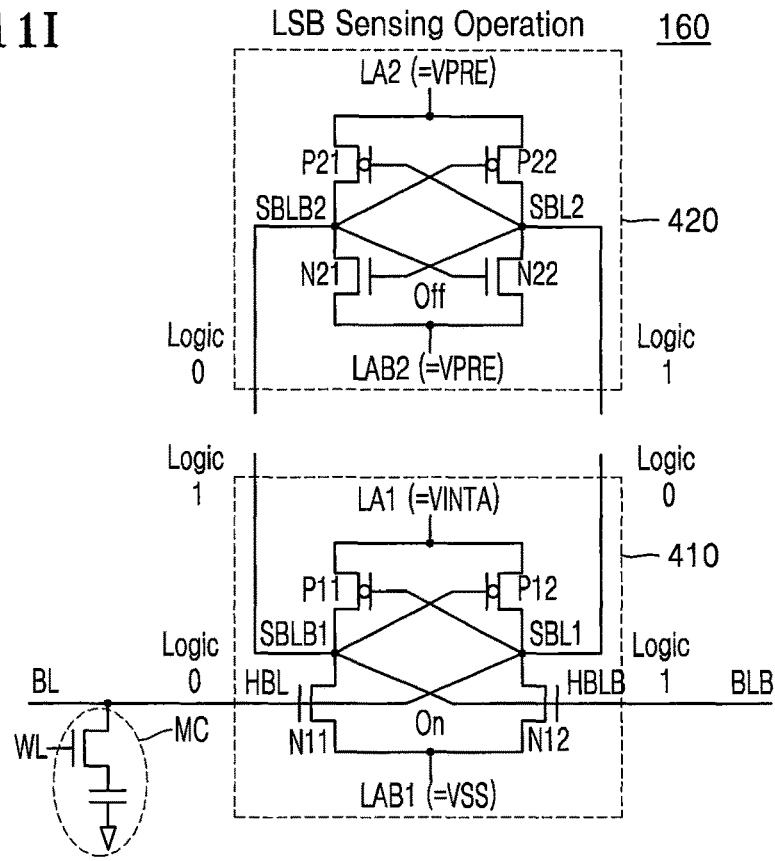

Referring to FIG. 11I and the point in time T8 of FIG. 12, the sense amplifier 160 performs the LSB sense operation of sensing the LSB of the 2-bit combination represented by the cell voltage Vcell stored in the memory cell MC.

The first sense amplifying circuit 410 may increase the voltage of the first complementary sensing bit line SBLB1 to the logic "1" level and may reduce the voltage of the first sensing bit line SBL1 to the logic "0" level by sensing the LSB of the 2-bit combination based on a difference between a bit line BL voltage of 0.5 V applied to each of gates of the first PMOS and NMOS transistors P11 and N11 and a complementary bit line BLB voltage of 0.55 V applied to each of gates of the second PMOS and NMOS transistors P12 and N12.

The voltage of each of the complementary bit line BLB and the complementary holding bit line HBLB connected to the first complementary sensing bit line SBLB1 is increased to the logic "1" level and the voltage of each of the bit line BL and the holding bit line HBL connected to the first sensing bit line SBL1 is reduced to the logic "0" level.

The logic "0" level may be latched to the bit line BL of the first sense amplifying circuit 410 as the LSB of the memory cell MC.

10. Combining the MSB and the LSB

Figure 11J:
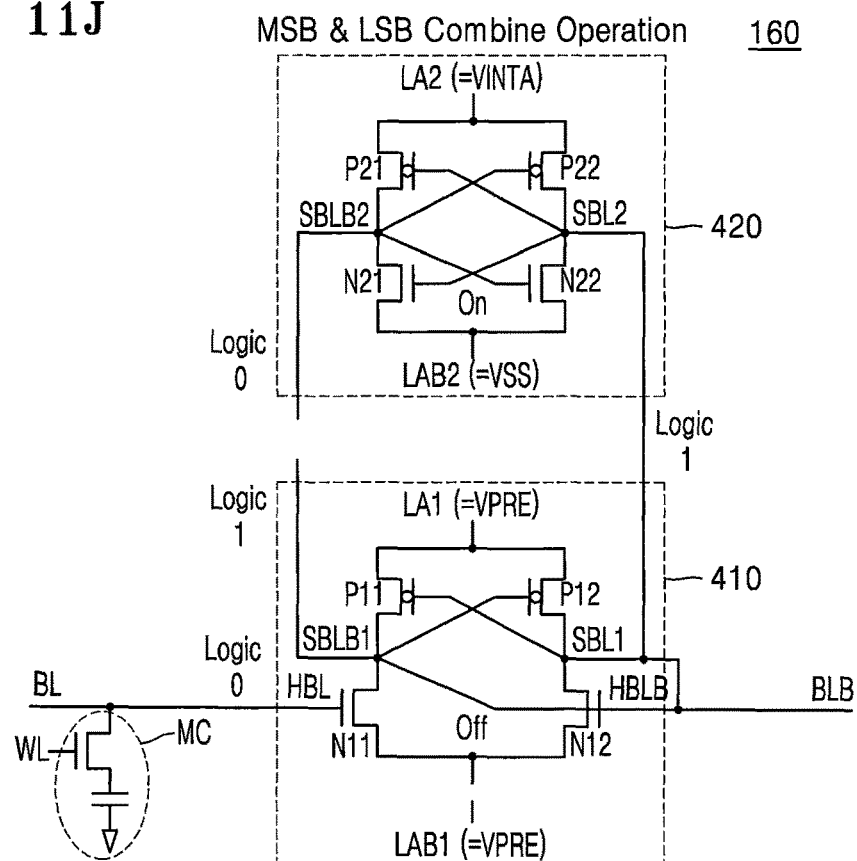

Referring to FIG. 11J and the point in time T9 of FIG. 12, the sense amplifier 160 may perform an operation of combining the sensed MSB and LSB of the memory cell MC. The MSB of the logic "1" level is latched to the second sensing bit line SBL2 of the second sense amplifying circuit 420 and the LSB of the logic "0" level is latched to the first sensing bit line SBL1 of the first sense amplifying circuit 410.

The second sensing bit line SBL2, the first pair of sensing bit lines SBL1 and SBLB1, the complementary holding bit line HBLB, and the complementary bit line BLB may be connected by the complementary bit line switch SWb and the second, fourth, and sixth switches SW2, SW4, and SW6. In the second sense amplifying circuit 420, the voltage of the second sensing bit line SBL2 is at the logic "1" level and the voltage of each of the first pair of sensing bit lines SBL1 and SBLB1, the complementary holding bit line HBLB, and the complementary bit line BLB connected to the second sensing bit line SBL2 is at the logic "1" level. At this time, the voltage of each of the bit line BL and the holding bit line HBL maintains the logic "0" level.

11. The Third Charge Sharing Operation

Figure 11K:
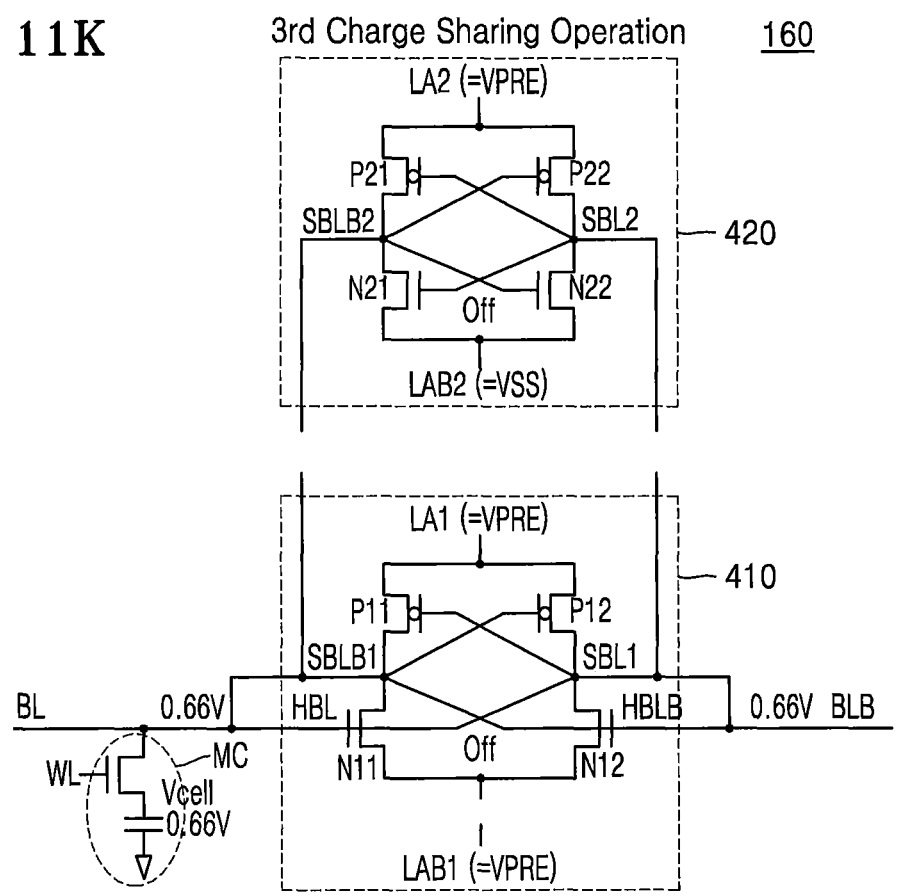

Referring to FIG. 11K and the point in time T10 of FIG. 12, the sense amplifier 160 performs the third charge sharing operation among the first pair of sensing bit lines SBL1 and SBLB1, the pair of holding bit lines HBL and HBLB, and the pair of bit lines BL and BLB.

The sense amplifier 160 may perform the third charge sharing operation by using the cell capacitance of the memory cell MC, the bit line capacitance of each of the pair of bit lines BL and BLB, the bit line capacitance of each of the pair of holding bit lines HBL and HBLB, the bit line capacitance of each of the first pair of sensing bit lines SBL1 and SBLB1, and a change in capacitances. In the third charge sharing operation, the voltage of each of the pair of bit lines BL and BLB, the pair of holding bit lines HBL and HBLB, and the first pair of sensing bit lines SBL1 and SBLB1 has a level of about 0.67 V. The bit line BL voltage is increased to 0.67 V at the logic "0" level and the bit line BL voltage of 0.67 V is restored in the memory cell MC as the cell voltage Vcell.

The sense amplifier 160 described above senses the cell voltage Vcell of 0.67 V, which is stored in the memory cell MC, as the MSB and LSB bits "10" and restores the bit line BL voltage of 0.67 V corresponding to the sensed MSB and LSB bits "10" in the memory cell MC as the cell voltage Vcell.

FIGS. 13A to 13K and 14 are equivalent circuits and a timing diagram illustrating an operation of a sense amplifier for sensing 2-bit data "11" corresponding to a cell voltage of 1.0 V stored in a memory cell. Hereinafter, description will be made based on a difference between FIGS. 7A to 7J and 8 and FIGS. 13A to 13K and 14.

1. The Pre-charge Operation

Figure 13A:
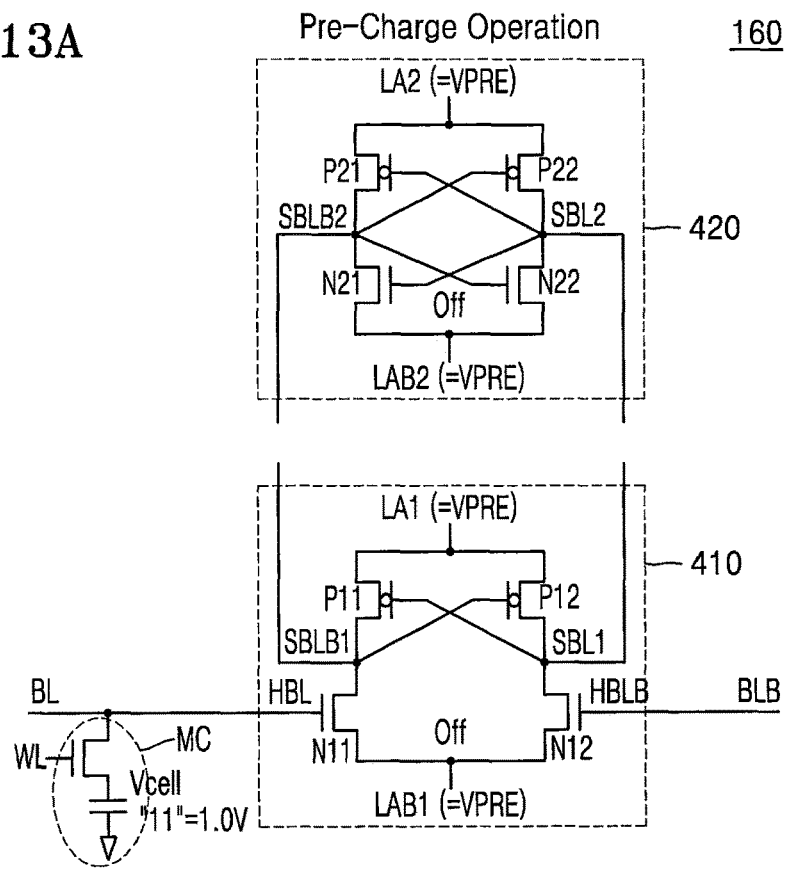
FIGS. 13A to 13K and 14 are equivalent circuits and a timing diagram illustrating an operation of a sense amplifier for sensing 2-bit data "11" corresponding to a cell voltage of 1.0 V stored in a memory cell.
Figure 14:
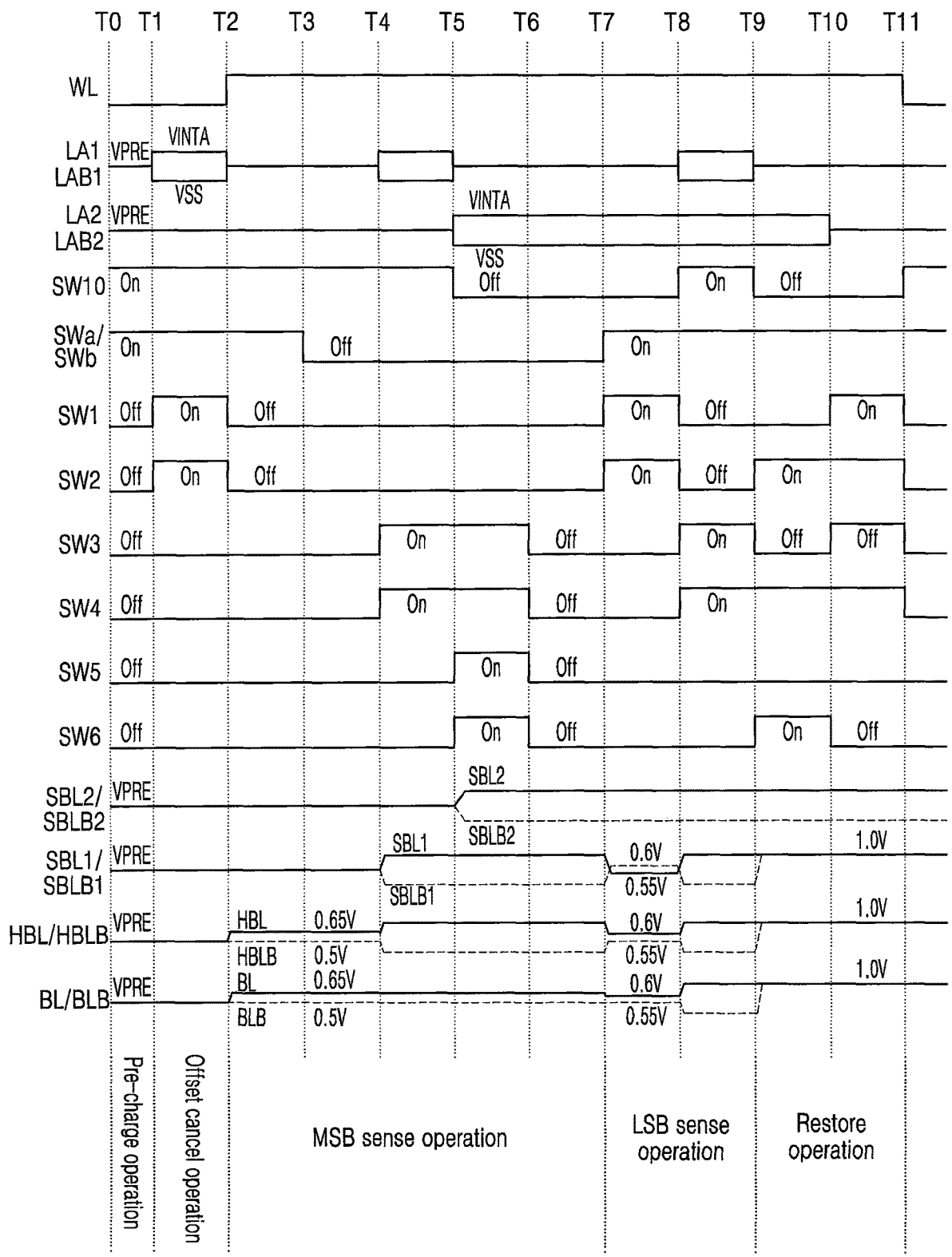

Referring to FIG. 13A and the point in time T0 of FIG. 14, the sense amplifier 160 pre-charges the bit line BL, the holding bit line HBL, the complementary bit line BLB, the complementary holding bit line HBLB, the first complementary sensing bit line SBLB1, the first sensing bit line SBL1, the second complementary sensing bit line SBLB2, the second sensing bit line SBL2, the first and second sensing driving signals LA1 and LAB1, and the third and fourth sensing driving signals LA2 and LAB2 to the pre-charge voltage VPRE.

2. The Offset Removing Operation

Figure 13B:
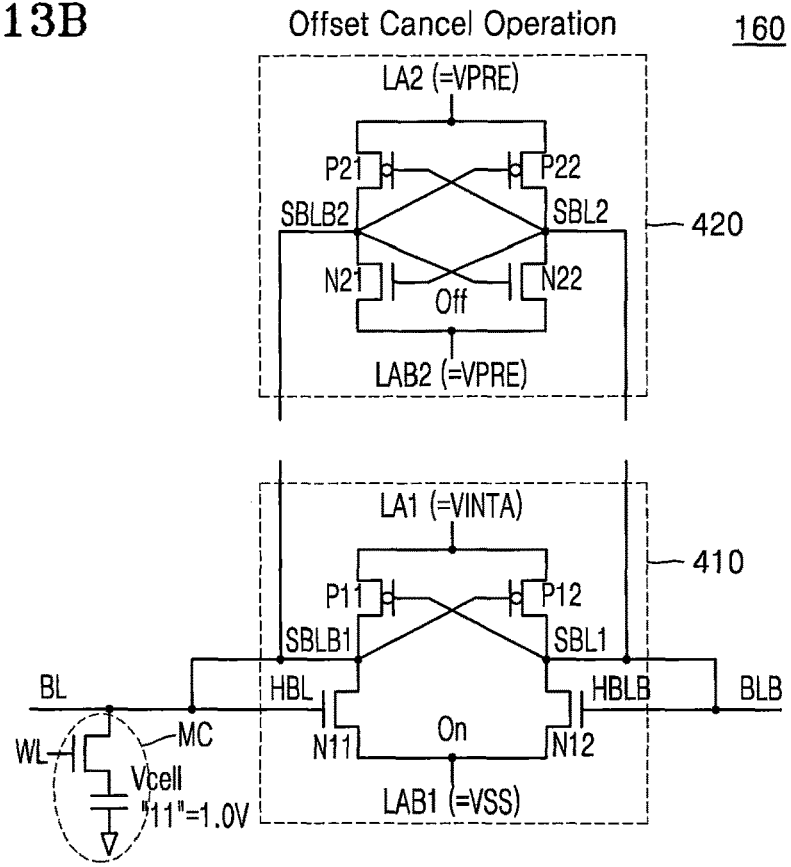

Referring to FIG. 13B and the point in time T1 of FIG. 14, the sense amplifier 160 performs the offset removing operation. In the first sense amplifying circuit 410, the complementary bit line BLB is increased or reduced to a prescribed level in comparison with the bit line BL by the offset noise of the pair of bit lines BL and BLB and accordingly, a prescribed voltage difference lies between the bit line BL and the complementary bit line BLB. The bit line BL and the complementary bit line BLB are set to have a difference by offset voltage and accordingly, the offset noise of the sense amplifier 160 may be removed.

3. The First Charge Sharing Operation

Figure 13C:
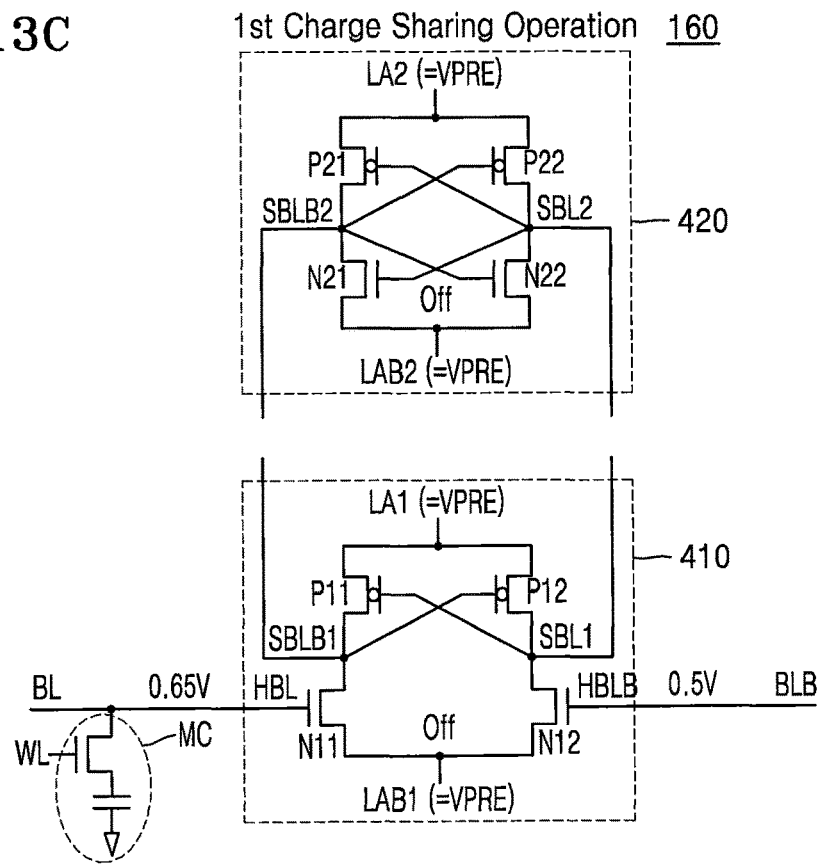

Referring to FIG. 13C and the point in time T2 of FIG. 14, the sense amplifier 160 performs the first charge sharing operation between the memory cell MC and the bit line BL. When the cell voltage Vcell of 0.67 V is stored in the memory cell MC, by the first charge sharing operation, the voltage level of each of the bit line BL and the holding bit line HBL is increased from 0.5 V that is the pre-charge voltage VPRE to about 0.65 V. At this time, each of the complementary bit line BLB and the complementary holding bit line HBLB maintains the level of the pre-charge voltage VPRE, that is, 0.5 V.

4. The Charge Holding Operation

Figure 13D:
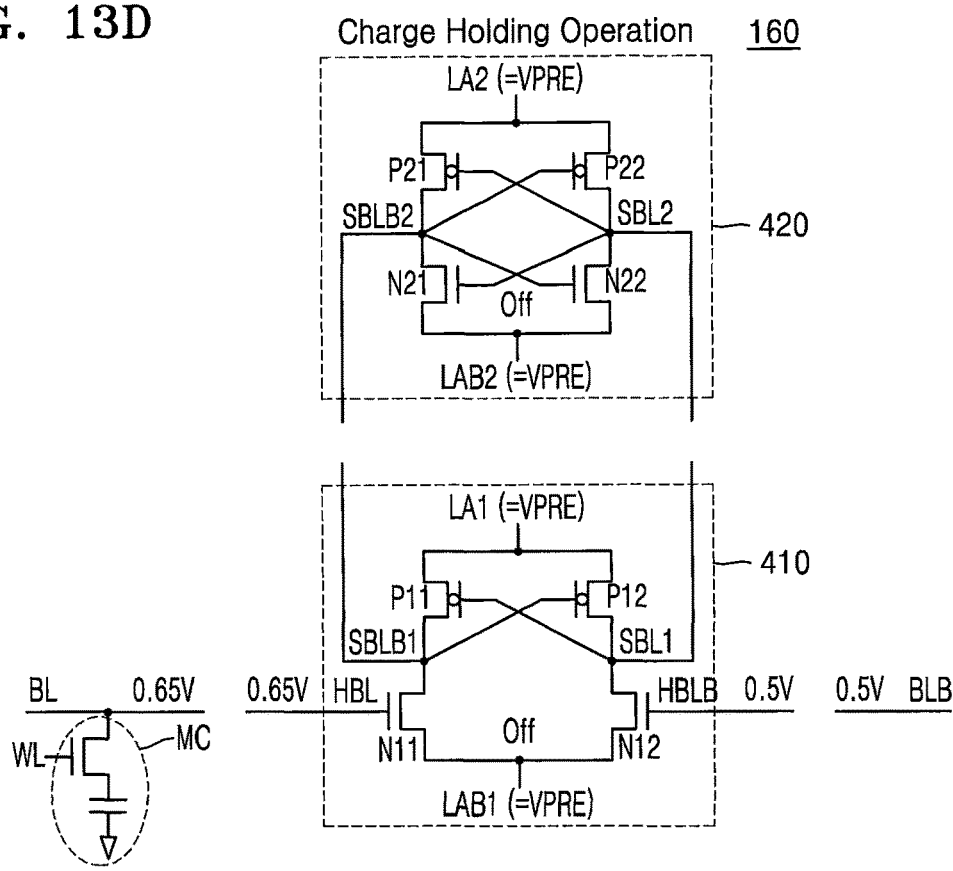

Referring to FIG. 13D and the point in time T3 of FIG. 14, the sense amplifier 160 holds the charges of the bit line BL and the holding bit line HBL in accordance with the first charge sharing operation. Each of the bit line BL and the holding bit line HBL maintains the voltage level of about 0.65 V and each of the complementary bit line BLB and the complementary holding bit line HBLB maintains the voltage level of about 0.5 V.

5. The MSB Sense Operation

Figure 13E:
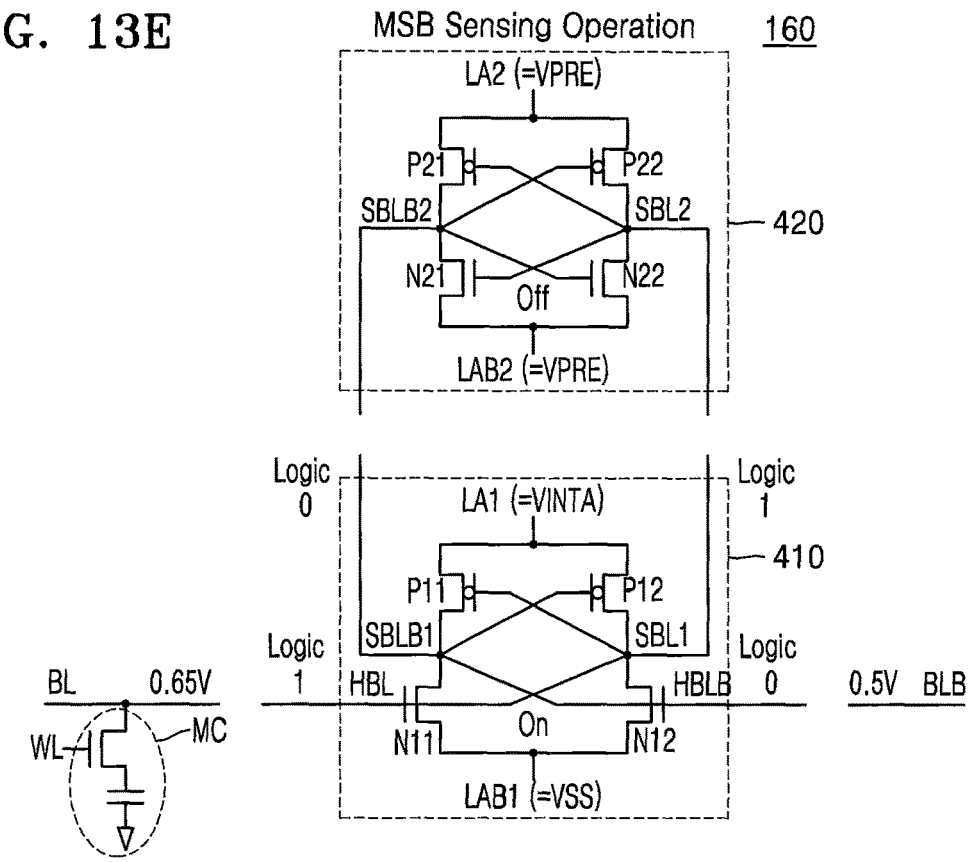

Referring to FIG. 13E and the point in time T4 of FIG. 14, the sense amplifier 160 performs the MSB sense operation of sensing the MSB of the 2-bit combination represented by the cell voltage Vcell stored in the memory cell MC.

The first sense amplifying circuit 410 may reduce the voltage of the first complementary sensing bit line SBLB1 to the logic "0" level and may increase the voltage of the first sensing bit line SBL1 to the logic "1" level by sensing the MSB of the 2-bit combination based on a difference between a holding bit line HBL voltage of 0.65 V and a complementary holding bit line HBLB voltage of 0.5 V that are respectively applied to the gates of the first and second NMOS transistors N11 and N12. The voltage of the complementary holding bit line HBLB connected to the first complementary sensing bit line SBLB1 is reduced to the logic "0" level and the voltage of the holding bit line HBL connected to the first sensing bit line SBL1 is increased to the logic "1" level.

6. The First MSB Latching Operation

Figure 13F:
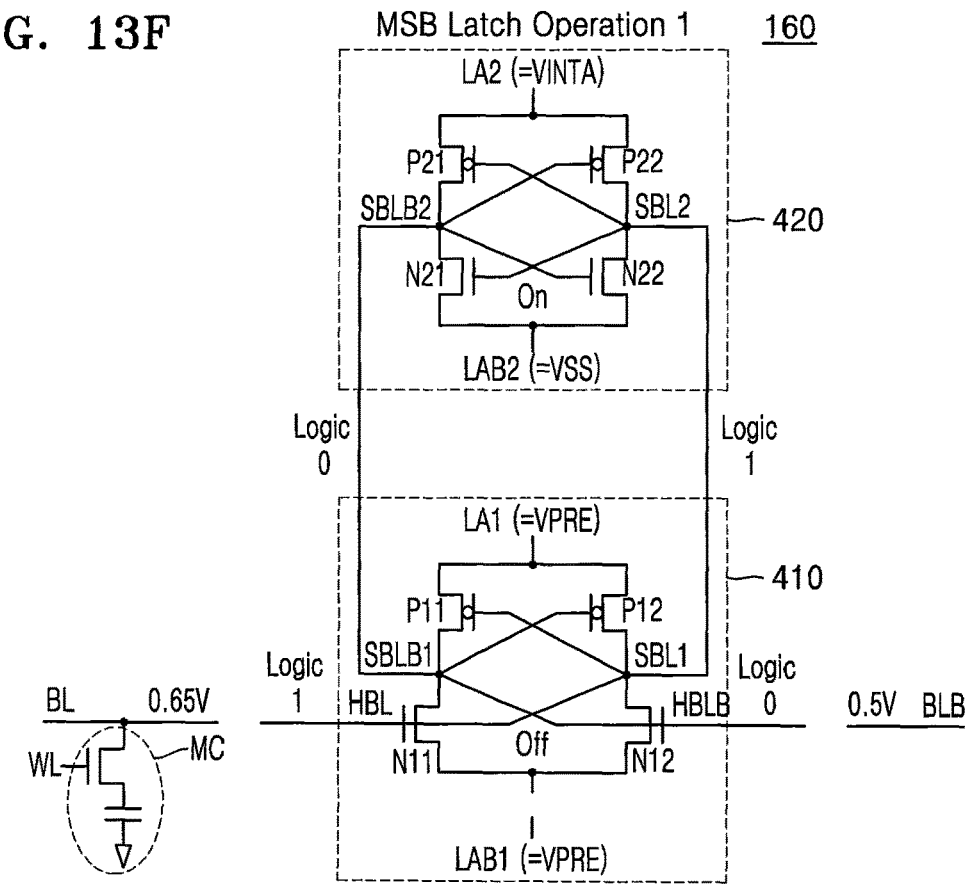

Referring to FIG. 13F and the point in time T5 of FIG. 14, the sense amplifier 160 performs the first MSB latching operation of latching the MSB of the 2-bit data.

The second sense amplifying circuit 420 may reduce the voltage of the second complementary sensing bit line SBLB2 to the logic "0" level and may increase the voltage of the second sensing bit line SBL2 to the logic "1" level by sensing the MSB of the 2-bit combination based on a voltage difference between the second complementary sensing bit line SBLB2 and the second sensing bit line SBL2. The voltage of each of the first complementary sensing bit line SBLB1 and the complementary holding bit line HBLB connected to the second complementary sensing bit line SBLB2 is at the logic "0" level. The voltage of each of the first sensing bit line SBL1 and the holding bit line HBL connected to the second sensing bit line SBL2 is at the logic "1" level.

7. The Second MSB Latching Operation

Figure 13G:
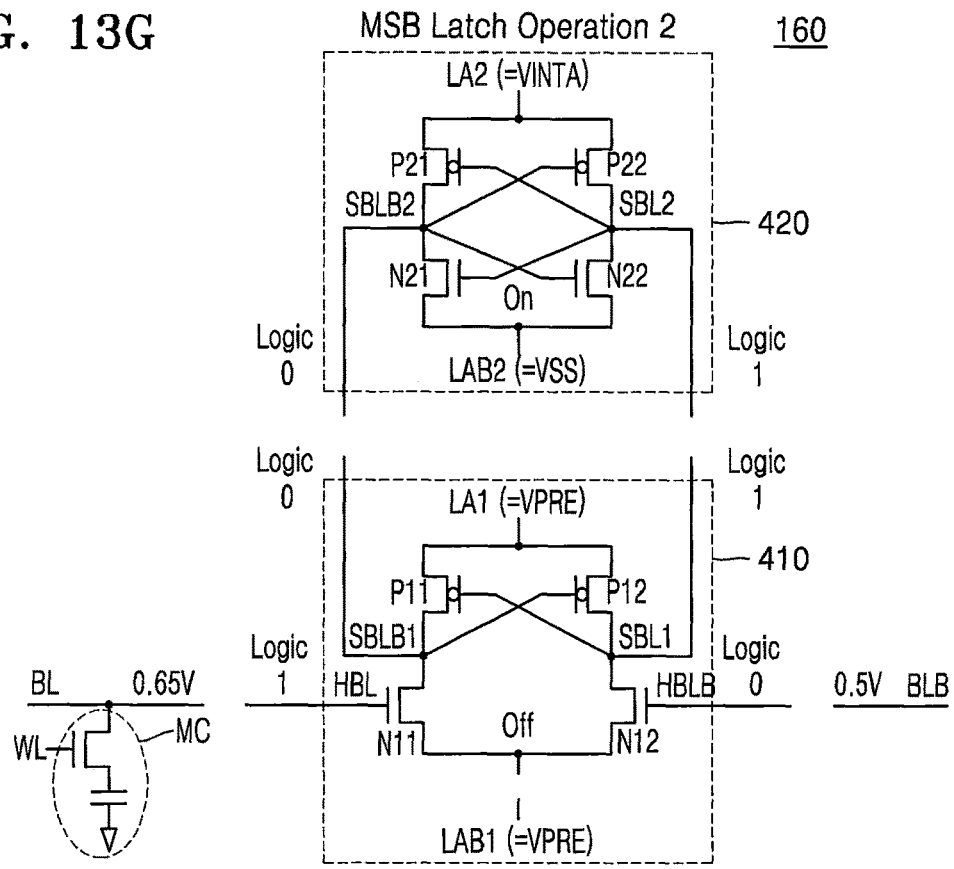

Referring to FIG. 13G and the point in time T6 of FIG. 14, the sense amplifier 160 performs the second MSB latching operation.

The logic "1" level may be latched to the second sensing bit line SBL2 of the second sense amplifying circuit 420 as the MSB of the memory cell MC.

8. The Second Charge Sharing Operation

Figure 13H:
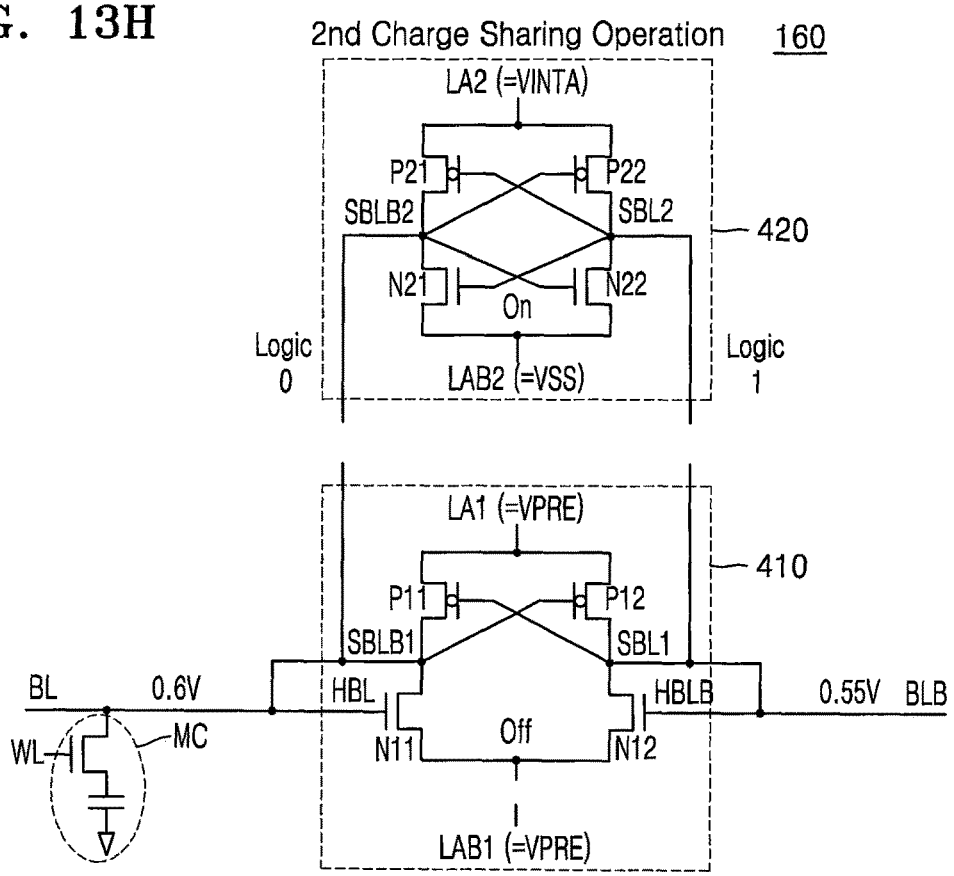

Referring to FIG. 13H and the point in time T7 of FIG. 14, the sense amplifier 160 performs the second charge sharing operation among the first complementary sensing bit line SBLB1, the holding bit line HBL, and the bit line BL and among the first sensing bit line SBL1, the complementary holding bit line HBLB, and the complementary bit line BLB.

In the second charge sharing operation, the voltage of each of the bit line BL, the holding bit line HBL, and the first complementary sensing bit line SBLB1 is captured as about 0.6 V and the voltage of each of the complementary bit line BLB, the complementary holding bit line HBLB, and the first sensing bit line SBL1 is captured as about 0.55 V.

9. The LSB Sense Operation

Figure 13I:
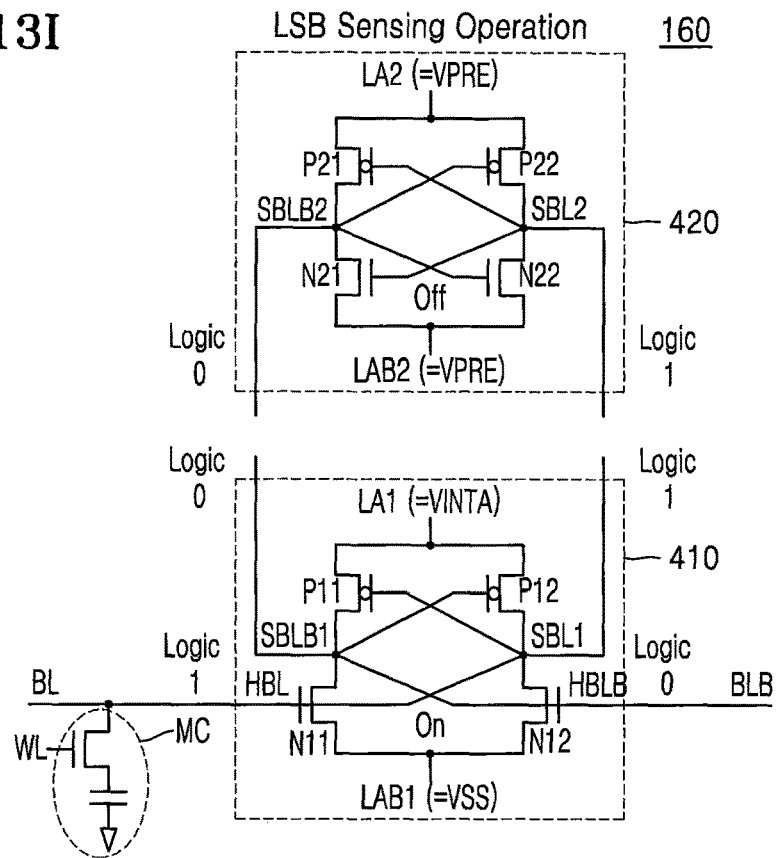

Referring to FIG. 13I and the point in time T8 of FIG. 14, the sense amplifier 160 performs the LSB sense operation of sensing the LSB of the 2-bit combination represented by the cell voltage Vcell stored in the memory cell MC.

The first sense amplifying circuit 410 may reduce the voltage of the first complementary sensing bit line SBLB1 to the logic "0" level and may increase the voltage of the first sensing bit line SBL1 to the logic "1" level by sensing the LSB of the 2-bit combination based on a difference between a bit line BL voltage of 0.6 V applied to each of gates of the first PMOS and NMOS transistors P11 and N11 and a complementary bit line BLB voltage of 0.55 V applied to each of gates of the second PMOS and NMOS transistors P12 and N12.

The voltage of each of the complementary bit line BLB and the complementary holding bit line HBLB connected to the first complementary sensing bit line SBLB1 is reduced to the logic "0" level and the voltage of each of the bit line BL and the holding bit line HBL connected to the first sensing bit line SBL1 is increased to the logic "1" level.

The logic "1" level may be latched to the bit line BL of the first sense amplifying circuit 410 as the LSB of the memory cell MC.

10. Combining the MSB and the LSB

Figure 13J:
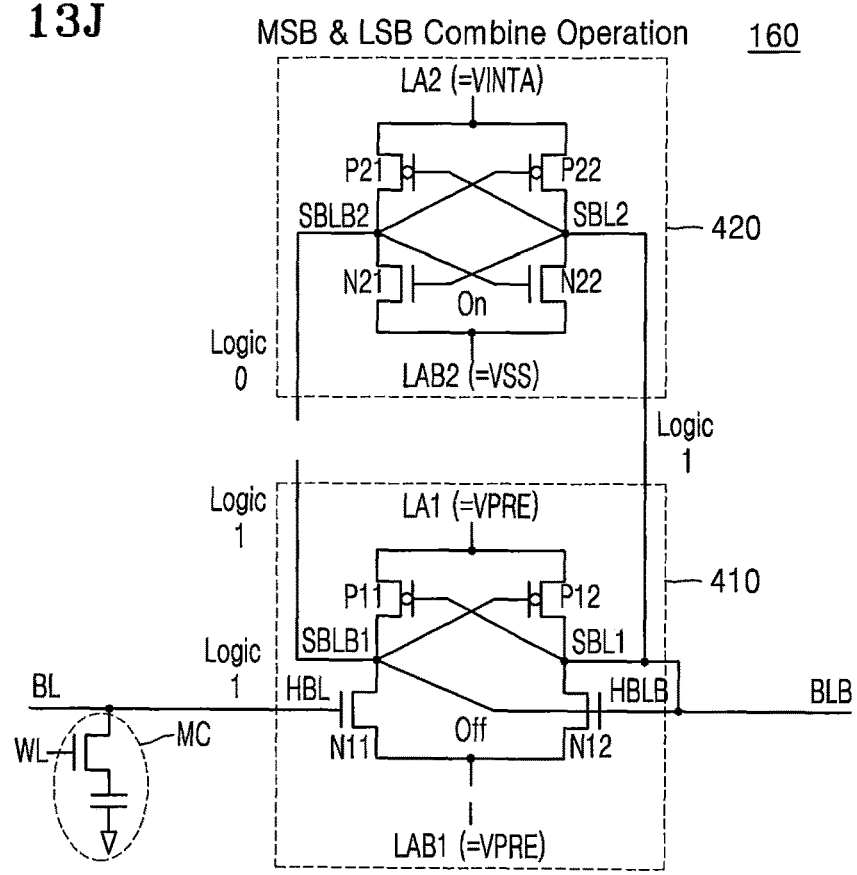

Referring to FIG. 13J and the point in time T9 of FIG. 14, the sense amplifier 160 may perform operation of combining the sensed MSB and LSB of the memory cell MC.

The MSB of the logic "1" level is latched to the second sensing bit line SBL2 of the second sense amplifying circuit 420 and the LSB of the logic "1" level is latched to the first sensing bit line SBL1 of the first sense amplifying circuit 410.

The second sensing bit line SBL2, the first pair of sensing bit lines SBL1 and SBLB1, the complementary holding bit line HBLB, and the complementary bit line BLB may be connected by the complementary bit line switch SWb and the second, fourth, and sixth switches SW2, SW4, and SW6. By the second sense amplifying circuit 420, the voltage of the second sensing bit line SBL2 is at the logic "1" level and the voltage of each of the first pair of sensing bit lines SBL1 and SBLB1, the complementary holding bit line HBLB, and the complementary bit line BLB connected to the second sensing bit line SBL2 is at the logic "1" level. At this time, the voltage of each of the bit line BL and the holding bit line HBL maintains the logic "1" level.

11. The Third Charge Sharing Operation

Figure 13K:
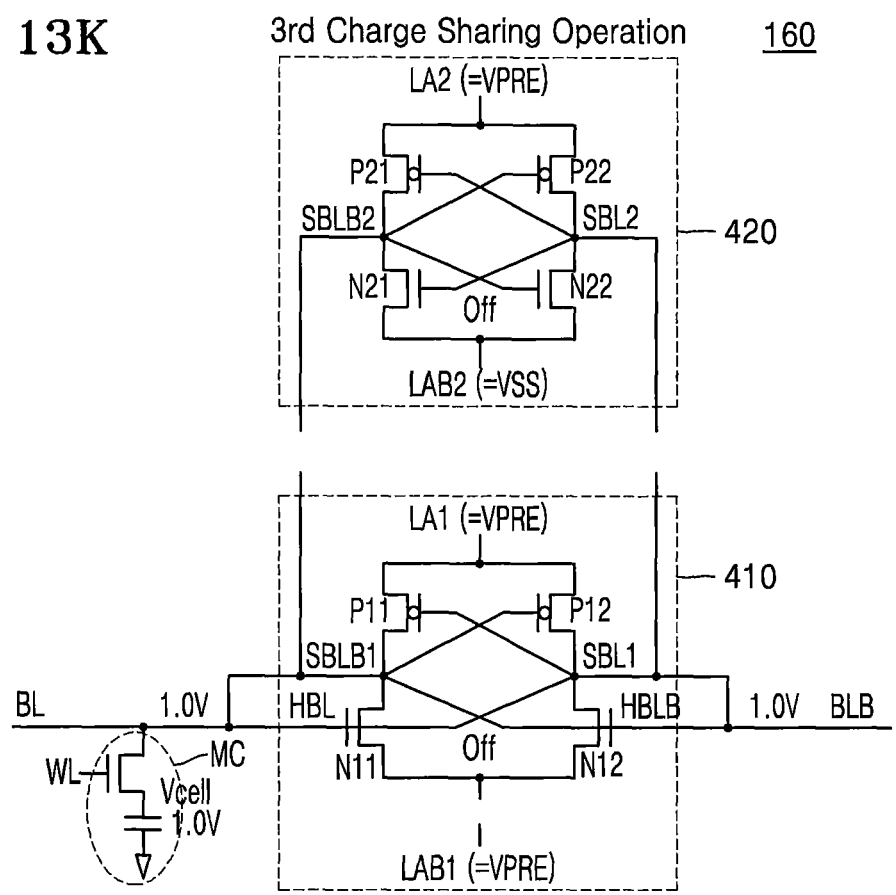

Referring to FIG. 13K and the point in time T10 of FIG. 14, the sense amplifier 160 performs the third charge sharing operation among the first pair of sensing bit lines SBL1 and SBLB1, the pair of holding bit lines HBL and HBLB, and the pair of bit lines BL and BLB.

The sense amplifier 160 may perform the third charge sharing operation by using the cell capacitance of the memory cell MC, the bit line capacitance of each of the pair of bit lines BL and BLB, the bit line capacitance of each of the pair of holding bit lines HBL and HBLB, the bit line capacitance of each of the first pair of sensing bit lines SBL1 and SBLB1, and a change in capacitances. In the third charge sharing operation, the voltage of each of the pair of bit lines BL and BLB, the pair of holding bit lines HBL and HBLB, and the first pair of sensing bit lines SBL1 and SBLB1 has a level of about 1.0 V. The bit line BL voltage is increased to 1.0 V at the logic "1" level and the bit line BL voltage of 1.0 V is restored in the memory cell MC as the cell voltage Vcell.

The sense amplifier 160 described above senses the cell voltage Vcell of 1.0 V, which is stored in the memory cell MC, as the MSB and LSB bits "11" and restores the bit line BL voltage of 1.0 V corresponding to the sensed MSB and LSB bits "11" in the memory cell MC as the cell voltage Vcell.

FIGS. 15A to 15F are circuit diagrams illustrating sense amplifiers 160_15a to 160_15f according to embodiments of the inventive concepts. The sense amplifiers 160_15a to 160_15f of FIGS. 15A to 15F may equalize the pair of first sensing bit lines SBL1 and SBLB1 of the first sense amplifying circuit 410 before a sense operation in order to perform more effectively operations of sensing the cell voltage Vcell stored in the memory cell MC as the MSB and the LSB of the 2-bit data. The sense amplifiers 160_15a to 160_15f of FIGS. 15A to 15F operate similarly to the sense amplifier 160 of FIG. 4 and will be described based on differences with the previously described sense amplifier.

Figure 15A:
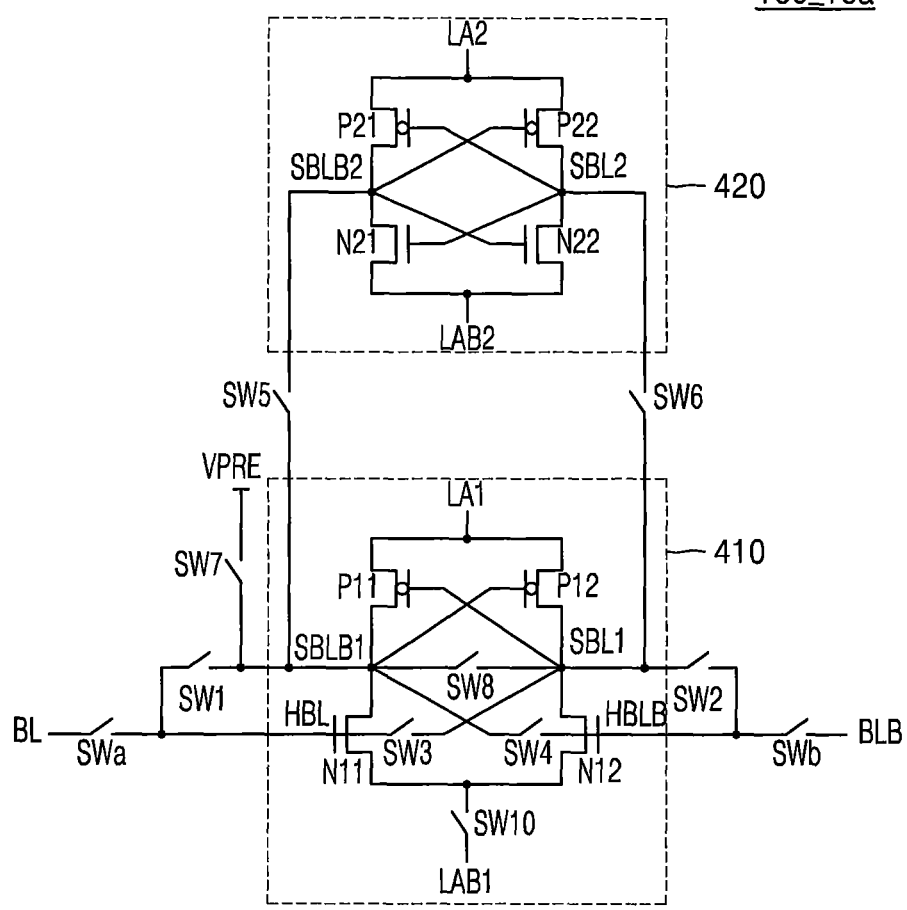
FIGS. 15A to 15F and 16 are circuit diagrams and an operation timing diagram illustrating sense amplifiers according to some embodiments of the inventive concepts.

Referring to FIG. 15A, the sense amplifier 160_15a may further include a seventh switch SW7 and an eighth switch SW8 in comparison with the sense amplifier 160 of FIG. 4. The seventh and eighth switches SW7 and SW8 may be included in the equalizing circuit 180 of FIG. 2. The seventh switch SW7 is connected between the pre-charge voltage VPRE and the first complementary sensing bit line SBLB1 and may be turned on or off in accordance with the equalizing signal PEQ (FIG. 2) provided by the control circuitry 150 (FIG. 2). The eighth switch SW8 is connected between the first complementary sensing bit line SBLB1 and the first sensing bit line SBL1 and may be turned on or off in accordance with the equalizing signal PEQ provided by the control circuitry 150. The seventh and eighth switches SW7 and SW8 are turned on in response to the equalizing signal PEQ and may equalize the first complementary sensing bit line SBLB1 and the first sensing bit line SBL1 to the pre-charge voltage VPRE.

Figure 15B:
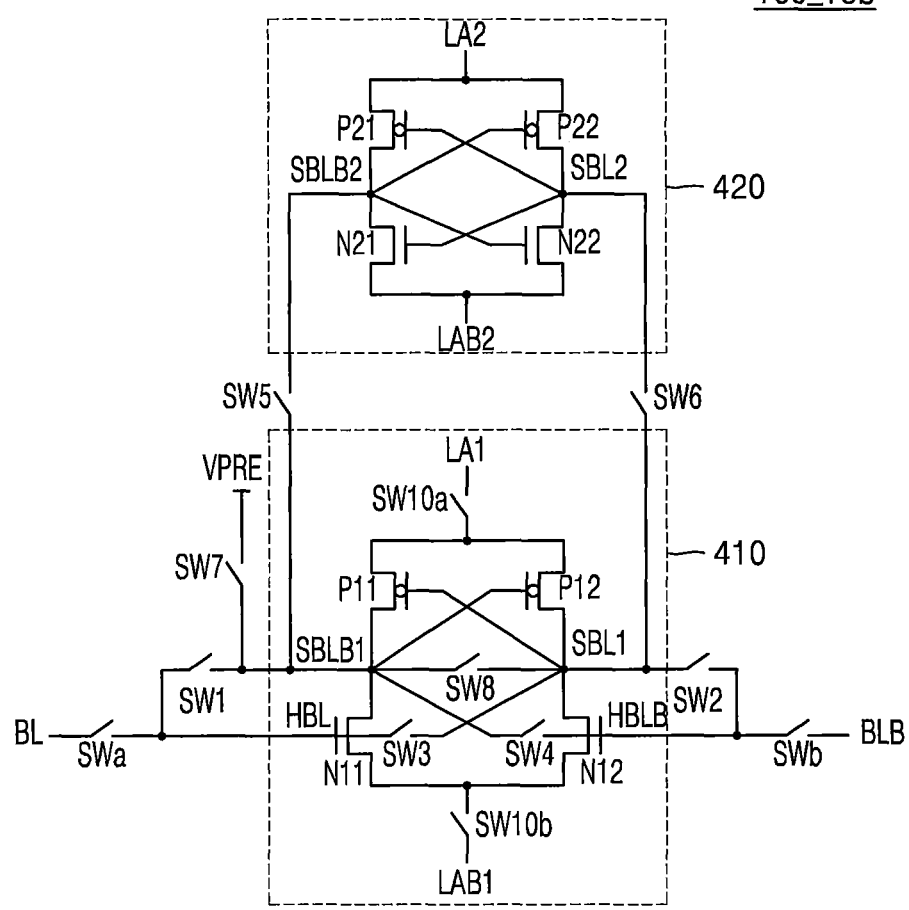

Referring to FIG. 15B, the sense amplifier 160_15*b* is different from the sense amplifier 160_15*a* of FIG. 15A in that a first power switch SW10*a* is connected between the first sensing driving signal LA1 and the first and second PMOS transistors P11 and P12 of the first sense amplifying circuit 410 and a second power switch SW10*b* is connected between the second sensing driving signal LAB1 and the first and second NMOS transistors N11 and N12.

Figure 15C:
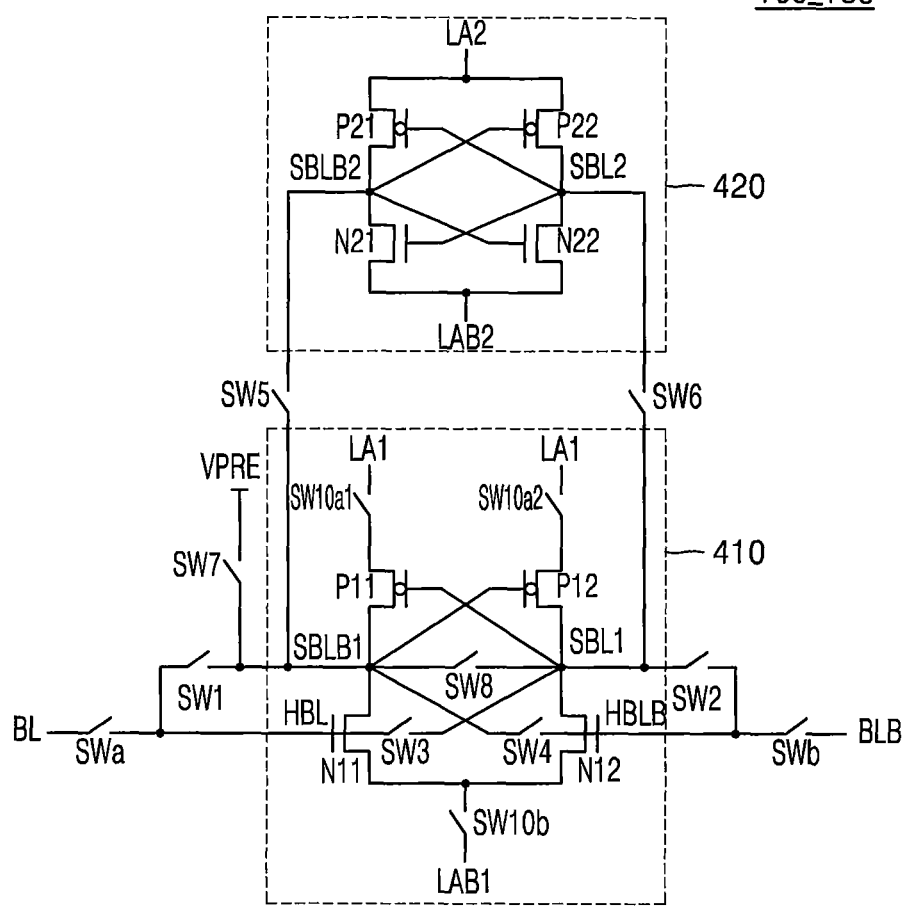

Referring to FIG. 15C, the sense amplifier 160_15*c* is different from the sense amplifier 160_15*b* of FIG. 15B in that first power switches SW10*a*1 and SW10*a*2 are respectively connected between the first sensing driving signal LA1 and the first PMOS transistor P11 of the first sense amplifying circuit 410 and between the first sensing driving signal LA1 and the second PMOS transistor P12.

Figure 15D:
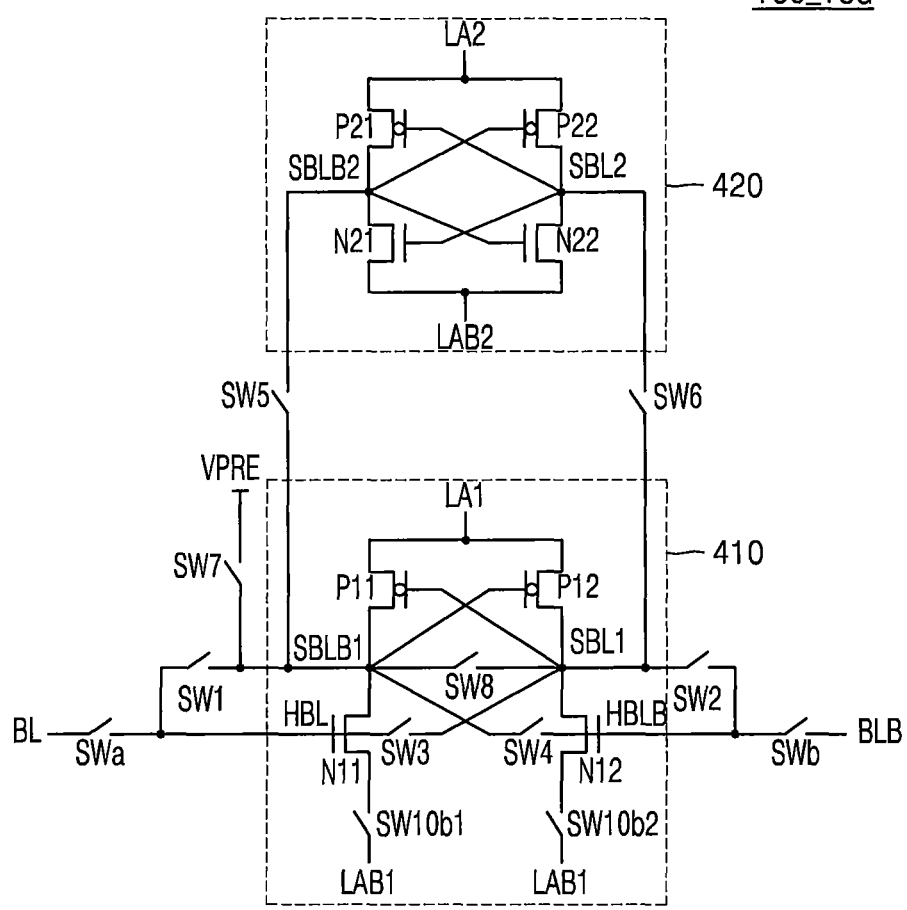

Referring to FIG. 15D, the sense amplifier 160_15*d* is different from the sense amplifier 160_15*a* of FIG. 15A in that second power switches SW10*b*1 and SW10*b*2 are respectively connected between the second sensing driving signal LAB1 and the first NMOS transistor N11 of the first sense amplifying circuit 410 and between the second sensing driving signal LAB1 and the second NMOS transistor N12.

Figure 15E:
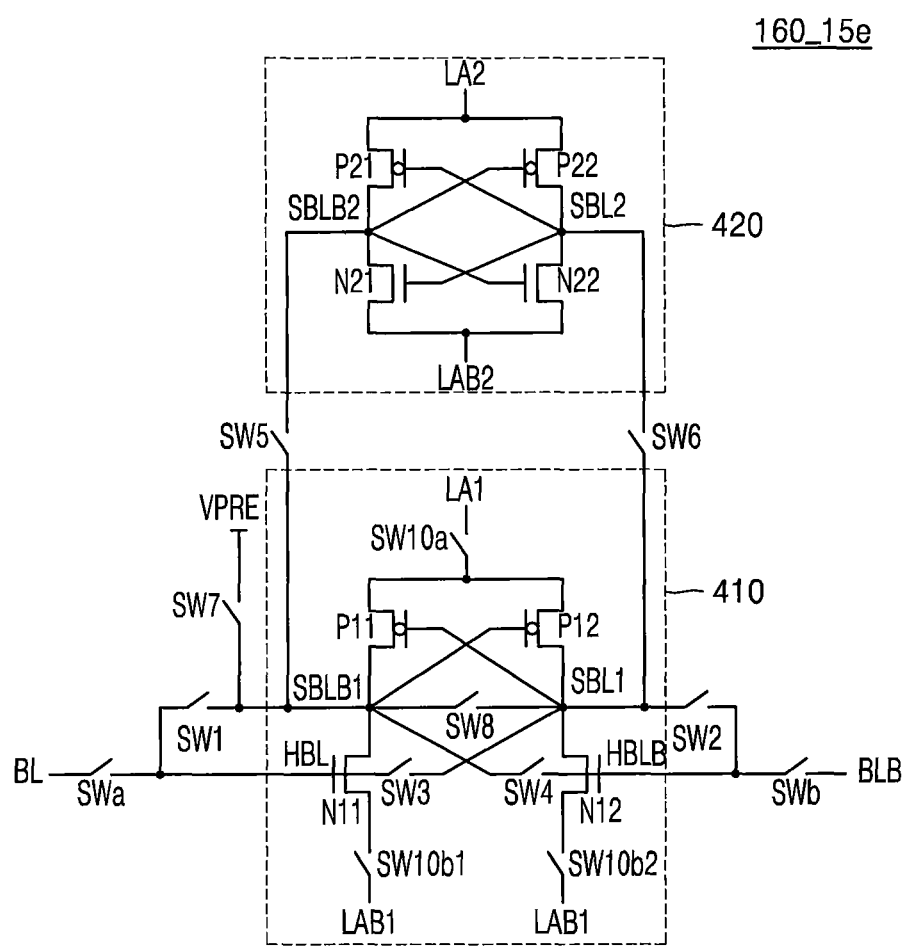

Referring to FIG. 15E, the sense amplifier 160_15*e* is different from the sense amplifier 160_15*b* of FIG. 15B in that the second power switches SW10*b*1 and SW10*b*2 are respectively connected between the second sensing driving signal LAB1 and the first NMOS transistor N11 of the first sense amplifying circuit 410 and between the second sensing driving signal LAB1 and the second NMOS transistor N12.

Figure 15F:
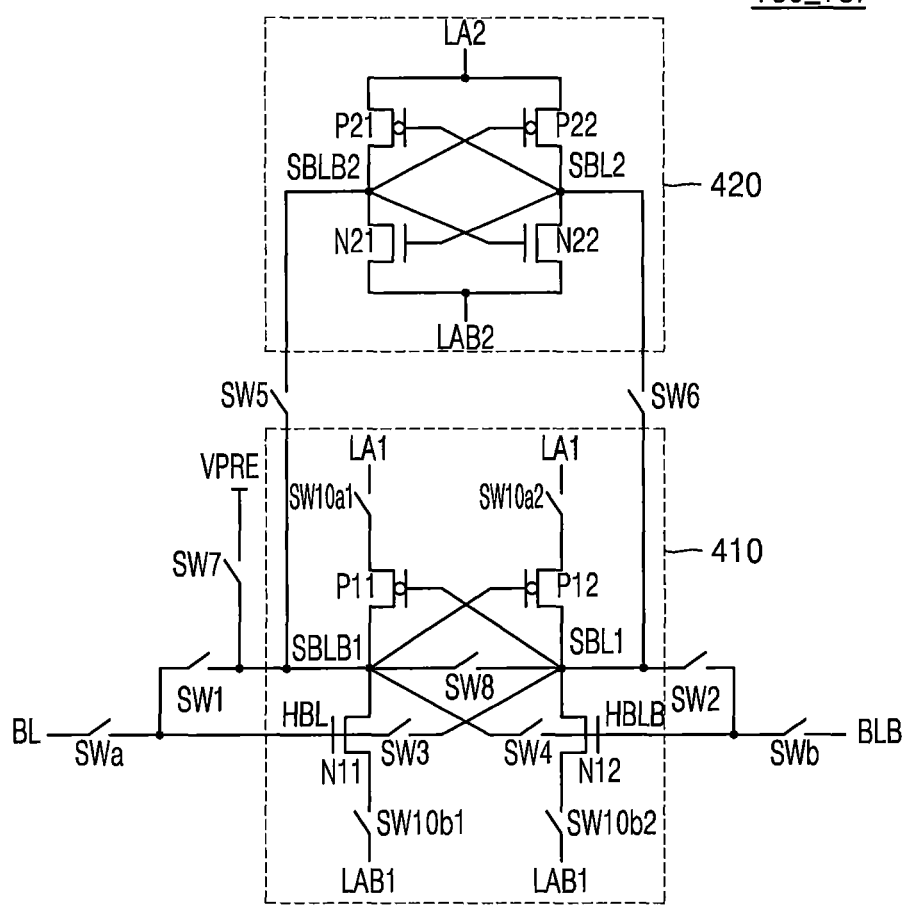

Referring to FIG. 15F, the sense amplifier 160_15*f* is different from the sense amplifier 160_15*c* of FIG. 15C in that the second power switches SW10*b*1 and SW10*b*2 are respectively connected between the second sensing driving signal LAB1 and the first NMOS transistor N11 of the first sense amplifying circuit 410 and between the second sensing driving signal LAB1 and the second NMOS transistor N12.

In FIGS. 15B to 15F, in the first sense amplifying circuit 410, in accordance with operations of the sense amplifiers 160_15*b* to 160_15*f*, the power voltage VINTA, the ground voltage VSS, or the pre-charge voltage VPRE is applied to the first and second sensing driving signals LA1 and LAB1 and the first and second PMOS transistors P11 and P12 and the first and second NMOS transistors N11 and N12 operate. The sense amplifiers 160_15*b* to 160_15*f* may selectively turn on or off the first and second power switches SW10*a*, SW10*b*, SW10*a*1 SW10*a*2, SW10*b*1, and SW10*b*2 in branches to which the first and second sensing driving signals LA1 and LAB1 are supplied. The first and second power switches SW10*a*, SW10*b*, SW10*a*1 SW10*a*2, SW10*b*1, and SW10*b*2 are provided to have the first and second PMOS transistors P11 and P12 and the first and second NMOS transistors N11 and N12 operate as power sources independent from each other in operations of the sense amplifiers 160_15*b* to 160_15*f*. Therefore, the first and second PMOS transistors P11 and P12 and the first and second NMOS transistors N11 and N12 may more stably perform sense operations without being affected by power sources that may change in accordance with operations of the neighboring transistors P11, P12, N11, and N12.

Figure 16:
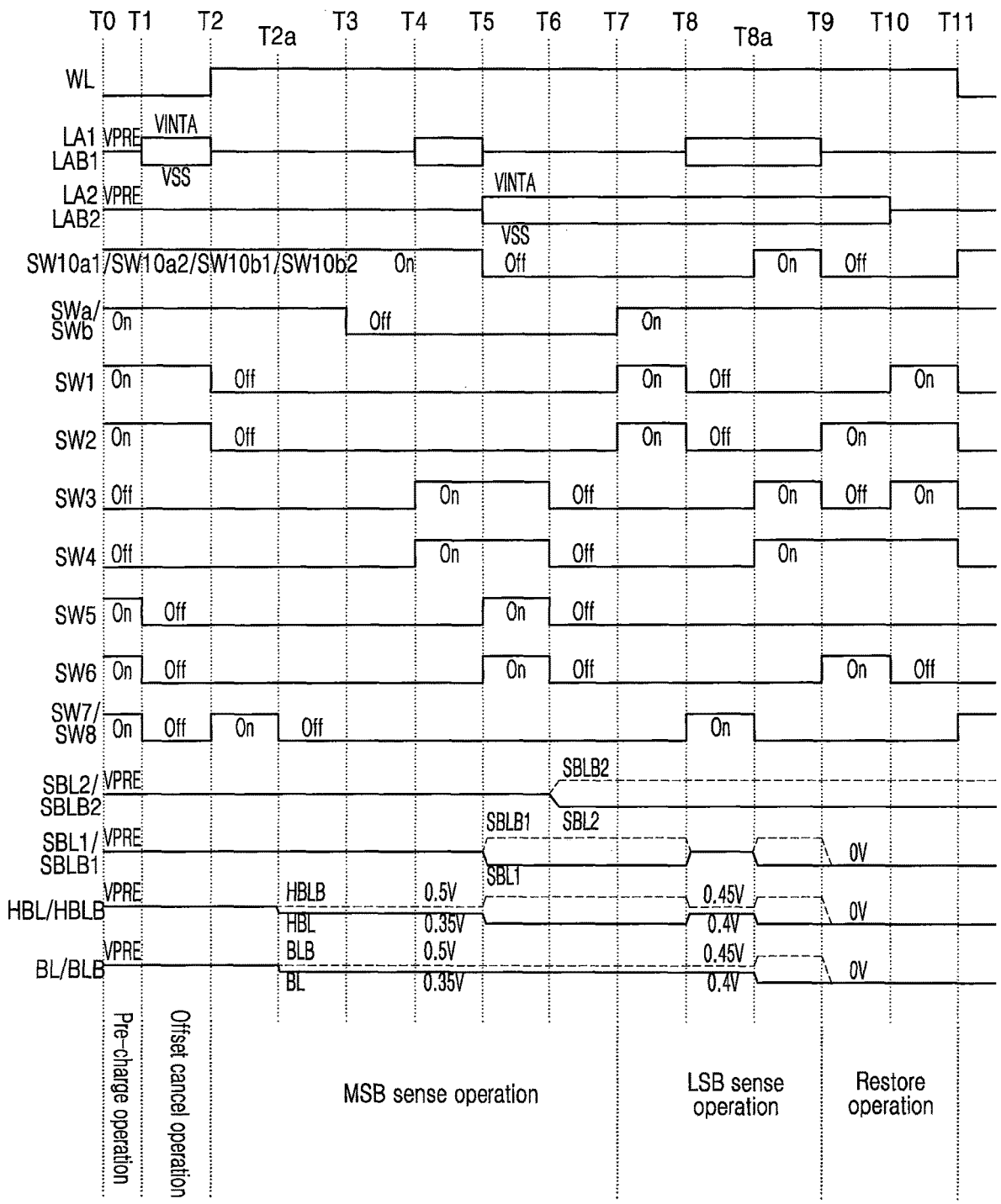

FIG. 16 is a timing diagram of an operation of the sense amplifier 160_15*f* of FIG. 15F. FIG. 16 is similar to FIG. 8 and illustrates operation of the sense amplifier 160_15*f* for sensing the cell voltage Vcell of 0 V, which is stored in the memory cell MC, that is, the 2-bit data "00". The timing diagram of operation of the sense amplifier 160_15*f* of FIG. 16 may be applied to operations of the sense amplifiers 160_15*a* to 160_15*e* of FIGS. 15A to 15E. Hereinafter, description will be made with reference to differences with FIG. 8.

In a pre-charge operation period between the point in time T0 and the point in time T1 of FIGS. 15F and 16, the sense amplifier 160_15*f* may pre-charge the bit line BL, the holding bit line HBL, the complementary bit line BLB, the complementary holding bit line HBLB, the first complementary sensing bit line SBLB1, the first sensing bit line SBL1, the second complementary sensing bit line SBLB2, and the second sensing bit line SBL2 to the pre-charge voltage VPRE by turning on the first and second switches SW1 and SW2, the fifth and sixth switches SW5 and SW6, and the seventh and eighth switches SW7 and SW8.

In an offset removing operation period between the point in time T1 and the point in time T2 of FIGS. 15F and 16, the sense amplifier 160_15*f* may remove the offset noise of the sense amplifier 160_15*f* by turning on the seventh and eighth switches SW7 and SW8 and making the bit line BL and the complementary bit line BLB have the difference by the offset voltage.

In a first charge sharing operation period in which the MSB is sensed between the point in time T2 and the point in time T3 of FIGS. 15F and 16, the sense amplifier 160_15*f* may have the first charge sharing operation performed. The sense amplifier 160_15*f* may equalize the first complementary sensing bit line SBLB1 and the first sensing bit line SBL1 to the pre-charge voltage VPRE by turning on the seventh and eighth switches SW7 and SW8 at the point in time T2 and a point in time T2*a*. Then, the sense amplifier 160_15*f* turns off the seventh and eighth switches SW7 and SW8 at the point in time T2*a* and the point in time T3 and the first sense amplifying circuit 410 may perform the first charge sharing operation at the point in time T2*a*. In the first charge sharing operation, voltage levels of the bit line BL and the holding bit line HBL are reduced from 0.5 V to 0.35 V and the complementary bit line BLB and the complementary holding bit line HBLB may maintain the pre-charge voltage VPRE level, that is, 0.5 V.

In an LSB sense operation period in which the LSB is sensed between the point in time T8 and the point in time T9 of FIGS. 15F and 16, the sense amplifier 160_15*f* may have the LSB sense operation performed. The sense amplifier 160_15*f* may equalize the first complementary sensing bit line SBLB1 and the first sensing bit line SBL1 to the pre-charge voltage VPRE by turning on the seventh and eighth switches SW7 and SW8 at the point in time T8 and a point in time T8*a*. Then, the sense amplifier 160_15*f* turns off the seventh and eighth switches SW7 and SW8 at the point in time T8*a* and the point in time T9 and the first sense amplifying circuit 410 may perform the LSB sense operation at the point in time T8*a*. The first sense amplifying circuit 410 increases voltage levels of the first complementary sensing bit line SBLB1, the complementary bit line BLB, and the complementary holding bit line HBLB to logic "1" levels and may reduce voltage levels of the first sensing bit line SBL1, the bit line BL, and the holding bit line HBL to logic "0" levels by sensing the cell voltage Vcell stored in the memory cell MC based on a voltage difference between the bit line BL voltage of 0.45 V and the complementary bit line BLB voltage of 0.5 V.

In FIG. 16, the sense amplifier 160_15f equalizes the pair of first sensing bit lines SBL1 and SBLB1 before sensing the cell voltage Vcell stored in the memory cell MC, senses the cell voltage Vcell of 0 V, which is stored in the memory cell MC, as the MSB and the LSB "00", and may restore the bit line BL voltage of 0 V, which corresponds to the sensed MSB and LSB "00", as the cell voltage Vcell in the memory cell MC.

Operation timings of the seventh and eighth switches SW7 and SW8 of the sense amplifier 160_15f illustrated in FIG. 16 may be applied to an operation timing diagram of sensing the 2-bit data "01" corresponding to the cell voltage Vcell of 0.33 V, which is stored in the memory cell MC of FIG. 10. The sense amplifier 160_15f equalizes the pair of first sensing bit lines SBL1 and SBLB1 before sensing the cell voltage Vcell stored in the memory cell MC, senses the cell voltage Vcell of 0.33 V, which is stored in the memory cell MC, as the MSB and LSB "01", and may restore the bit line BL voltage of 0.33 V, which corresponds to the sensed MSB and LSB "01", as the cell voltage Vcell in the memory cell MC.

Operation timings of the seventh and eighth switches SW7 and SW8 of the sense amplifier 160_15f illustrated in FIG. 16 may be applied to an operation timing diagram of sensing the 2-bit data "10" corresponding to the cell voltage Vcell of 0.67 V, which is stored in the memory cell MC of FIG. 12. The sense amplifier 160_15f equalizes the pair of first sensing bit lines SBL1 and SBLB1 before sensing the cell voltage Vcell stored in the memory cell MC, senses the cell voltage Vcell of 0.67 V, which is stored in the memory cell MC, as the MSB and LSB "10", and may restore the bit line BL voltage of 0.67 V, which corresponds to the sensed MSB and LSB "10", as the cell voltage Vcell in the memory cell MC.

Operation timings of the seventh and eighth switches SW7 and SW8 of the sense amplifier 160_15f illustrated in FIG. 16 may be applied to an operation timing diagram of sensing the 2-bit data "11" corresponding to the cell voltage Vcell of 1.0 V, which is stored in the memory cell MC of FIG. 14. The sense amplifier 160_15f equalizes the pair of first sensing bit lines SBL1 and SBLB1 before sensing the cell voltage Vcell stored in the memory cell MC, senses the cell voltage Vcell of 1.0 V, which is stored in the memory cell MC, as the MSB and LSB "11", and may restore the bit line BL voltage of 1.0 V, which corresponds to the sensed MSB and LSB "11", as the cell voltage Vcell in the memory cell MC.

FIGS. 17A to 17F are circuit diagrams illustrating sense amplifiers 160_17a to 160_17f according to embodiments of the inventive concepts. The sense amplifiers 160_17a to 160_17f of FIGS. 17A to 17F may transmit the sensed MSB and LSB of the 2-bit data to the data input and output circuitry 170 (FIG. 2) through data input and output lines LIO_MSB, LIOB_MSB, LIO_LSB, and LIOB_LSB. The sense amplifiers 160_17a to 160_17f of FIGS. 17A to 17F will be described based on differences with the above-described sense amplifiers.

Referring to FIG. 17A, the sense amplifier 160_17a is different from the sense amplifier 160_15a of FIG. 15A in that the sense amplifier 160_17a is connected to first to fourth column selection transistors N31 to N34. The first to fourth column selection transistors N31 to N34 may be included in the data input and output circuitry 170. The sense amplifier 160_17a senses the cell voltage Vcell stored in the memory cell MC, latches the sensed MSB of the 2-bit data to the second sensing bit line SBL2, and latches the sensed LSB of the 2-bit data to the bit line BL.

The first column selection transistor N31 electrically connects the bit line BL and the first data input and output line LIO_LSB in response to the column selection signal CSL. The second column selection transistor N32 electrically connects the complementary bit line BLB and the second data input and output line LIOB_LSB in response to the column selection signal CSL. The third column selection transistor N33 electrically connects the second complementary sensing bit line SBLB2 to the third data input and output line LIOB_MSB in response to the column selection signal CSL. The fourth column selection transistor N34 electrically connects the second sensing bit line SBL2 to the fourth data input and output line LIO_MSB in response to the column selection signal CSL. The column selection signal CSL may be provided by the address decoder 140 (FIG. 2), which may be configured to decode the column address.

Figure 17B:
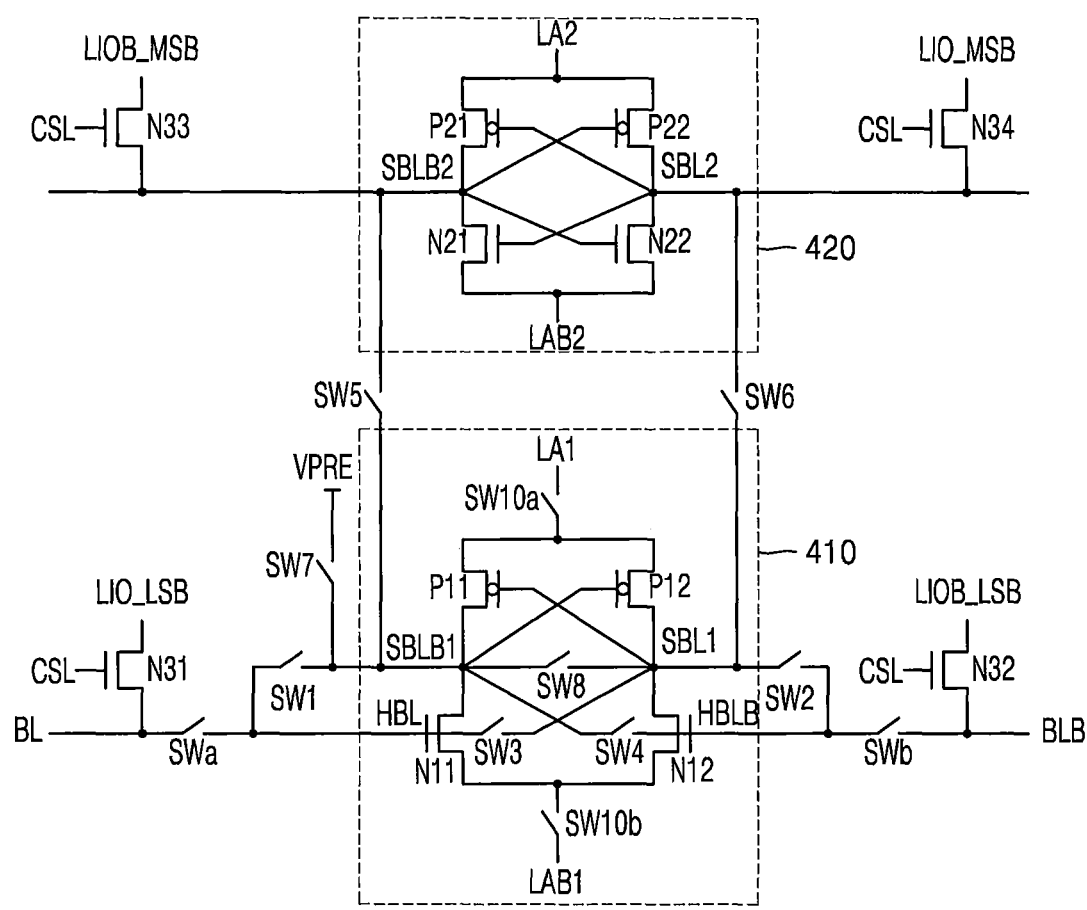

Referring to FIG. 17B, the sense amplifier 160_17b is different from the sense amplifier 160_17a of FIG. 17A in that the first power switch SW10a is connected between the first sensing driving signal LA1 and the first and second PMOS transistors P11 and P12 of the first sense amplifying circuit 410 and that the second power switch SW10b is connected between the second sensing driving signal LAB1 and the first and second NMOS transistors N11 and N12.

Figure 17C:
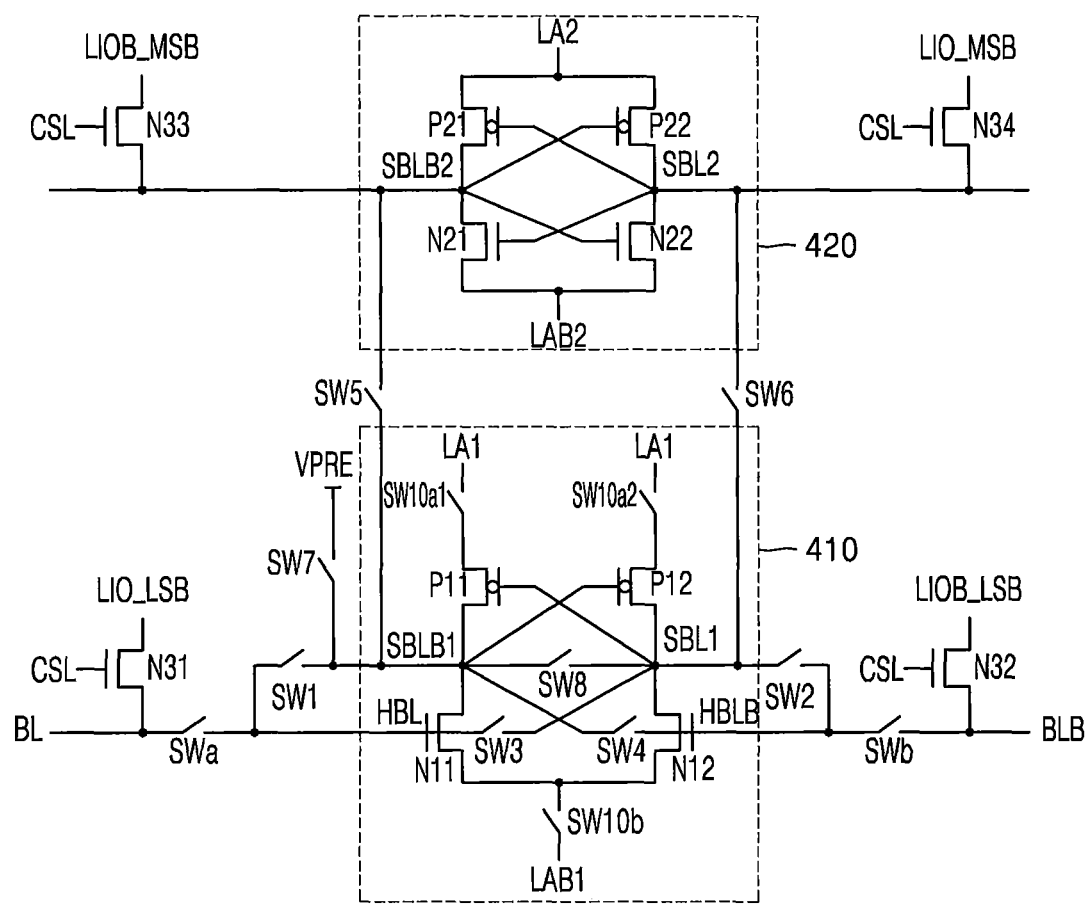

Referring to FIG. 17C, the sense amplifier 160_17c is different from the sense amplifier 160_17b of FIG. 17B in that the first power switches SW10a1 and SW10a2 are respectively connected between the first sensing driving signal LA1 and the first PMOS transistor P11 of the first sense amplifying circuit 410 and between the first sensing driving signal LA1 and the second PMOS transistor P12.

Figure 17D:
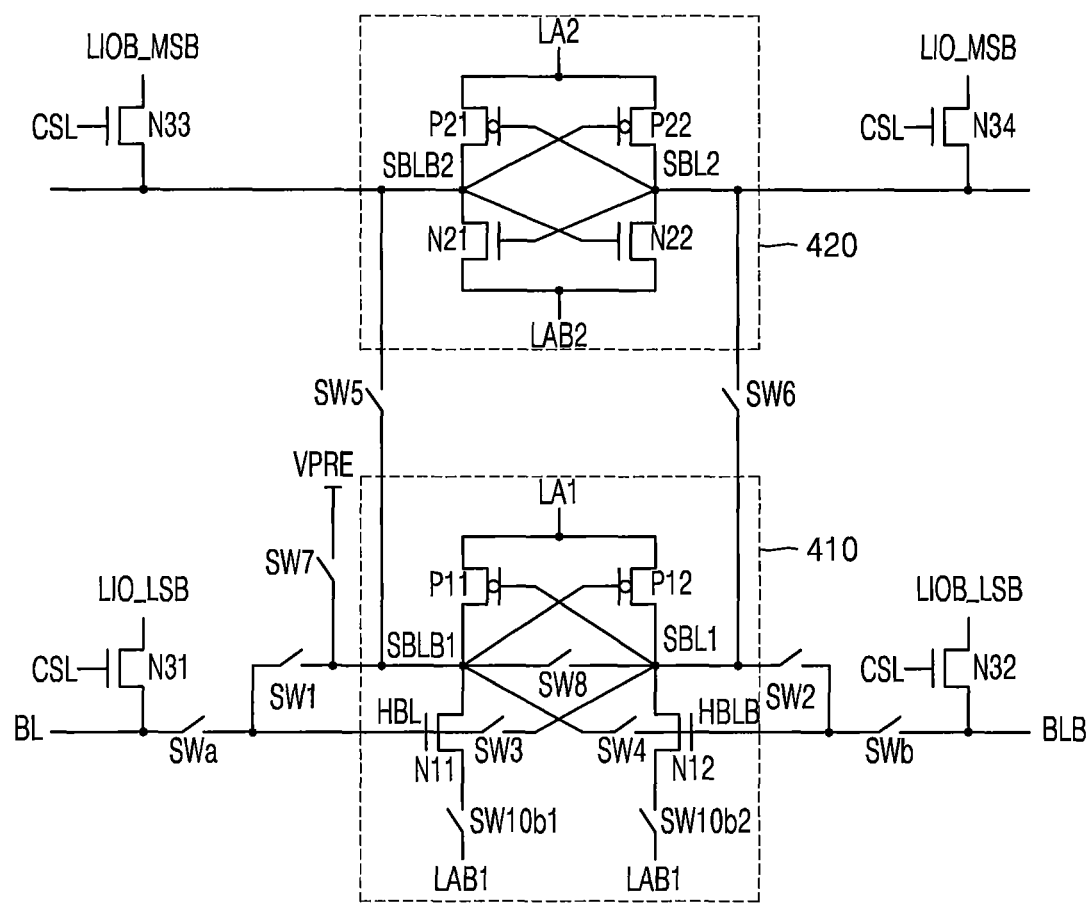

Referring to FIG. 17D, the sense amplifier 160_17d is different from the sense amplifier 160_17a of FIG. 17A in that the second power switches SW10b1 and SW10b2 are respectively connected between the second sensing driving signal LAB1 and the first NMOS transistor N11 of the first sense amplifying circuit 410 and between the second sensing driving signal LAB1 and the second NMOS transistor N12.

Figure 17E:
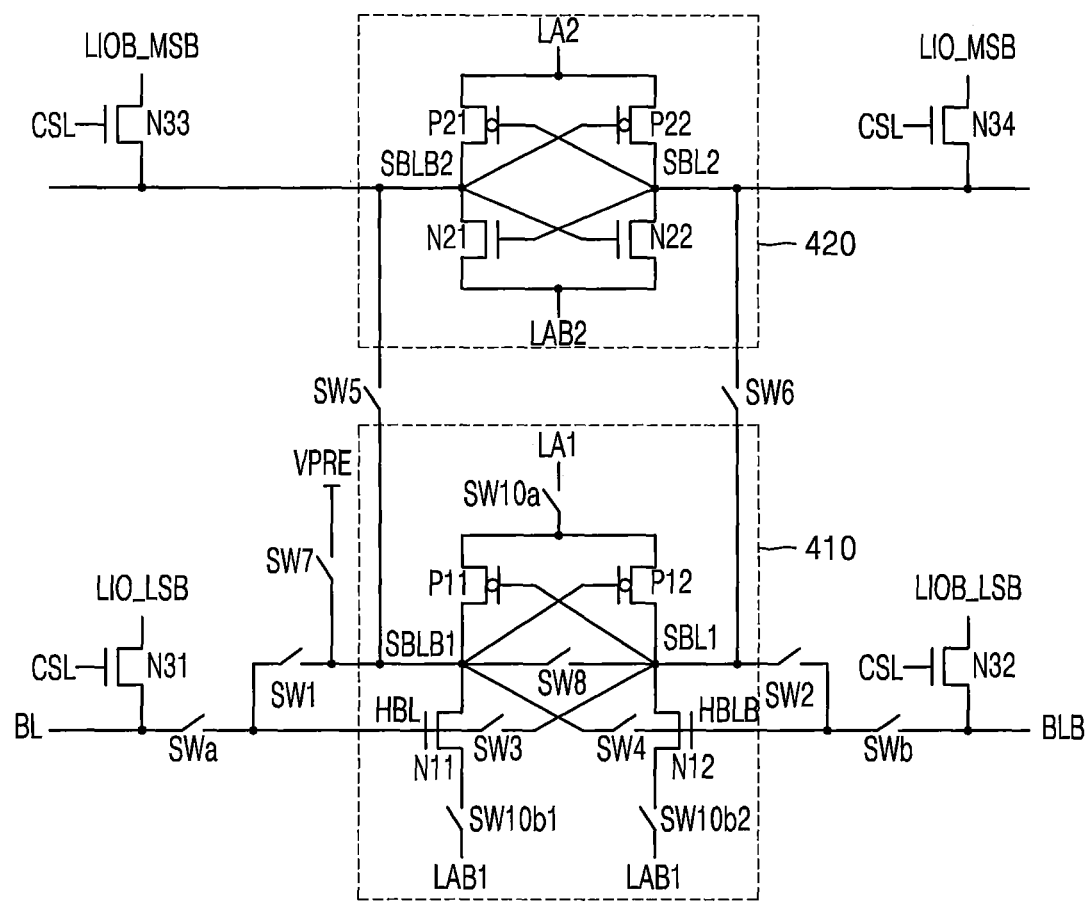

Referring to FIG. 17E, the sense amplifier 160_17e is different from the sense amplifier 160_17b of FIG. 17B in that the second power switches SW10b1 and SW10b2 are respectively connected between the second sensing driving signal LAB1 and the first NMOS transistor N11 of the first sense amplifying circuit 410 and between the second sensing driving signal LAB1 and the second NMOS transistor N12.

Figure 17F:
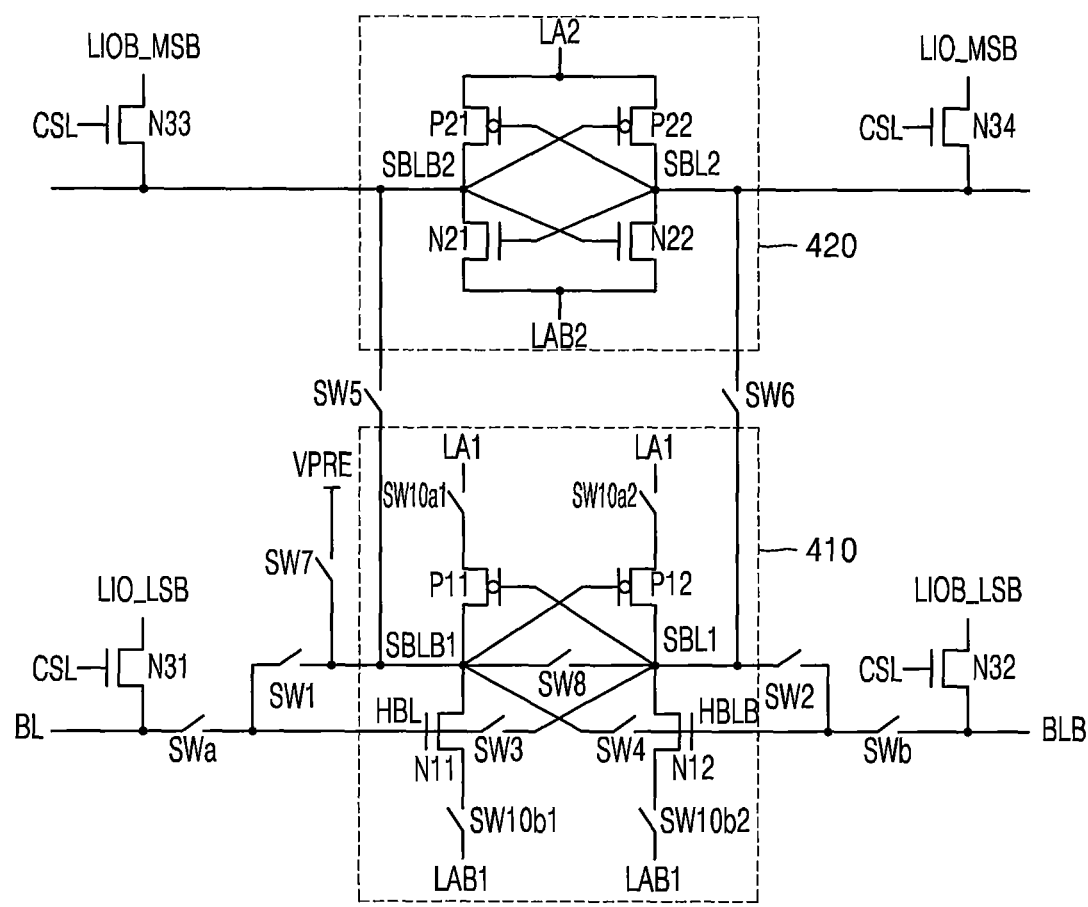

Referring to FIG. 17F, the sense amplifier 160_17f is different from the sense amplifier 160_17c of FIG. 17C in that the second power switches SW10b1 and SW10b2 are respectively connected between the second sensing driving signal LAB1 and the first NMOS transistor N11 of the first sense amplifying circuit 410 and between the second sensing driving signal LAB1 and the second NMOS transistor N12.

In FIGS. 17B to 17F, in accordance with operation of the first sense amplifying circuit 410, the first and second power switches SW10a, SW10b, SW10a1, SW10a2, SW10b1, and SW10b2 may be selectively connected to branches of the first and second sensing driving signals LA1 and LAB1 to which the power voltage VINTA, the ground voltage VSS, or the pre-charge voltage VPRE is applied. The first and second power switches SW10a, SW10b, SW10a1, SW10a2, SW10*b*1, and SW10*b*2 are provided so that, in operations of the sense amplifiers 160_15*b* to 160_15*f*, the first and second PMOS transistors P11 and P12 and the first and second NMOS transistors N11 and N12 operate as independent power sources. Therefore, the first and second PMOS transistors P11 and P12 and the first and second NMOS transistors N11 and N12 may motr stably perform sense operations without being affected by power sources that may change in accordance with operations of the neighboring transistors P11, P12, N11, and N12.

Figure 18A:
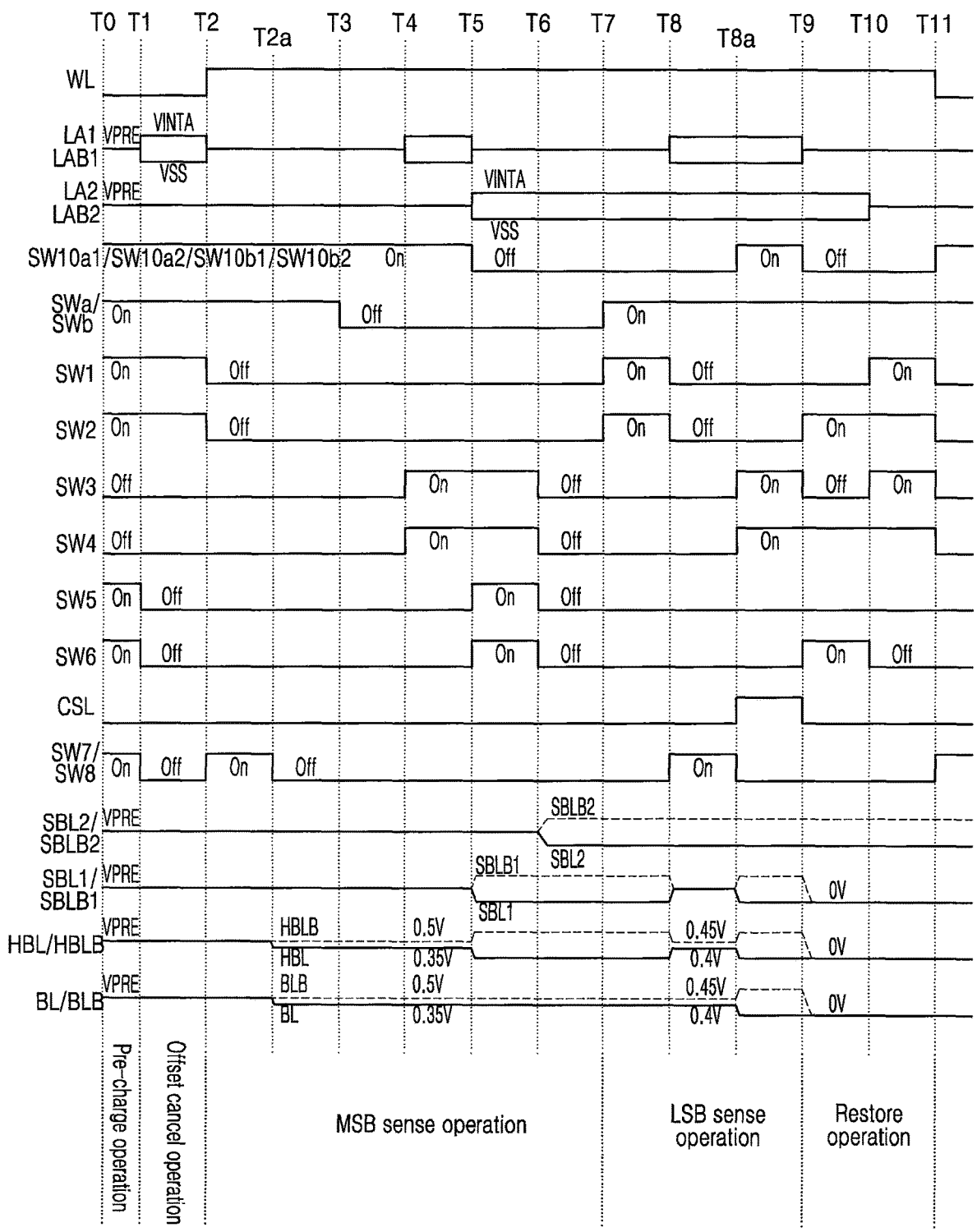
Figure 18B:
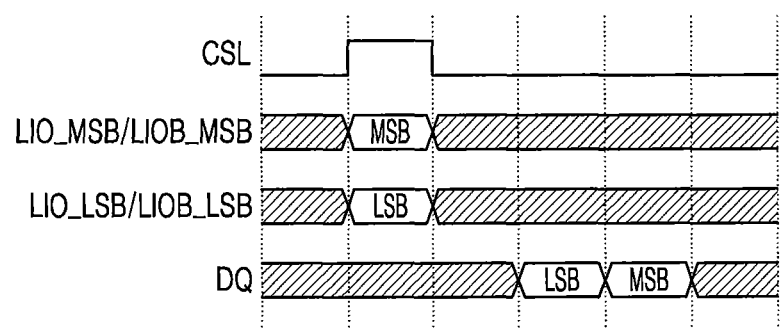
Figure 18C:
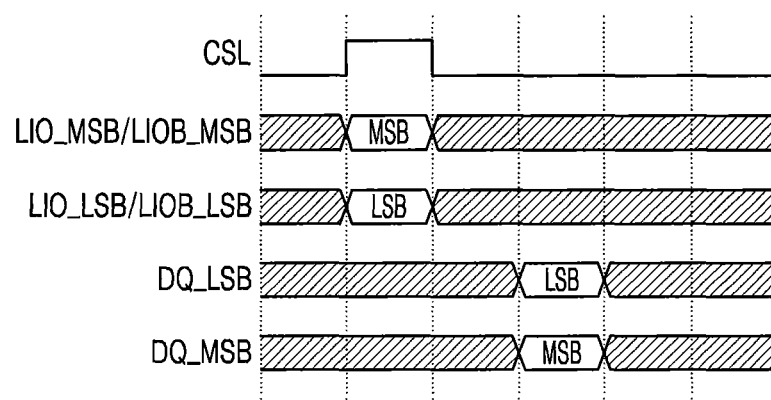

FIGS. 18A to 18C are timing diagrams in accordance with operation of the sense amplifier 160_17*f* of FIG. 17F. FIG. 18A is similar to FIG. 16 and illustrates operation of the sense amplifier 160_17*f* for sensing the cell voltage Vcell of 0 V, which is stored in the memory cell MC, that is, the 2-bit data "00". Operation timing diagrams of FIGS. 18A to 18C may be applied to operations of the sense amplifiers 160_17*a* to 160_17*e* of FIGS. 17A to 17E. Hereinafter, description will be made with reference to differences with FIG. 16.

In an LSB sense operation period in which the LSB is sensed between the point in time T8*a* and the point in time T9 of FIGS. 17F and 18A, the column selection signal CSL may be activated to a logic high level. At this time, the sensed MSB of the 2-bit data is latched to the second sensing bit line SBL2 of the sense amplifier 160_17*f* and the sensed LSB of the 2-bit data is latched to the bit line BL.

In response to the column selection signal CSL at the logic high level, the first column selection transistor N31 outputs the LSB of the 2-bit data, which is latched to the bit line BL, to the first data input and output line LIO_LSB, the second column selection transistor N32 outputs data of the complementary bit line BLB to the second data input and output line LIOB_LSB, the third column selection transistor N33 outputs data of the second complementary sensing bit line SBLB2 to the third data input and output line LIOB_MSB, and the fourth column selection transistor N34 may output the MSB of the 2-bit data, which is latched to the second sensing bit line SBL2, to the fourth data input and output line LIO_MSB.

Referring to FIG. 18B, the data input and output circuitry 170 (FIG. 2) may serially output LSBs of the first and second data input and output lines LIO_LSB and LIOB_LSB and MSBs of the third and fourth data input and output lines LIOB_MSB and LIO_MSB through the data DQ pad in the read mode of the memory device 100.

Referring to FIG. 18C, the data input and output circuitry 170 (FIG. 2) may output the LSBs of the first and second data input and output lines LIO_LSB and LIOB_LSB and the MSBs of the third and fourth data input and output lines LIOB_MSB and LIO_MSB through the two data pads, that is, the first and second data DQ_MSB and DQ_LSB pads in parallel in the read mode of the memory device 100.

In FIGS. 18A to 18C, the sense amplifier 160_17*f* senses the cell voltage Vcell of 0 V, which is stored in the memory cell MC, as the MSB and the LSB "00" and serially outputs the sensed MSB and LSB "00" through the data DQ pad or may output the sensed MSB and LSB "00" in parallel through the two data pads, that is, the first and second data DQ_MSB and DQ_LSB pads.

Operation timings of the sense amplifier 160_17*f* and the column selection signal CSL, which are illustrated in FIGS. 18A to 18C, may be applied to an operation timing diagram of sensing the 2-bit data "01" corresponding to the cell voltage Vcell of 0.33 V, which is stored in the memory cell MC of FIG. 10. The sense amplifier 160_15*f* senses the cell voltage Vcell of 0.33 V, which is stored in the memory cell MC, as the MSB and the LSB "01" and serially outputs the sensed MSB and LSB "01" through the data DQ pad or may output the sensed MSB and LSB "01" in parallel through the two data pads, that is, the first and second data DQ_MSB and DQ_LSB pads.

Operation timings of the sense amplifier 160_17*f* and the column selection signal CSL, which are illustrated in FIGS. 18A to 18C, may be applied to an operation timing diagram of sensing the 2-bit data "10" corresponding to the cell voltage Vcell of 0.67 V, which is stored in the memory cell MC of FIG. 12. The sense amplifier 160_15*f* senses the cell voltage Vcell of 0.67 V, which is stored in the memory cell MC, as the MSB and LSB "10" and serially outputs the sensed MSB and LSB "10" through the data DQ pad or may output the sensed MSB and LSB "10" in parallel through the two data pads, that is, the first and second data DQ_MSB and DQ_LSB pads.

Operation timings of the sense amplifier 160_17*f* and the column selection signal CSL, which are illustrated in FIGS. 18A to 18C, may be applied to an operation timing diagram of sensing the 2-bit data "11" corresponding to the cell voltage Vcell of 1.0 V, which is stored in the memory cell MC of FIG. 14. The sense amplifier 160_15*f* senses the cell voltage Vcell of 1.0 V, which is stored in the memory cell MC, as the MSB and LSB "11" and serially outputs the sensed MSB and LSB "11" through the data DQ pad or may output the sensed MSB and LSB "11" in parallel through the two data pads, that is, the first and second data DQ_MSB and DQ_LSB pads.

FIGS. 19A to 19F are circuit diagrams illustrating sense amplifiers 160_19*a* to 160_19*f* according to embodiments of the inventive concepts. The sense amplifiers 160_19*a* to 160_19*f* of FIGS. 19A to 19F operate similarly to the sense amplifier 160 of FIG. 4 and will be described based on the differences with circuit diagrams illustrating sense amplifiers 160_17*a* and the previously described sense amplifiers.

Figure 19A:
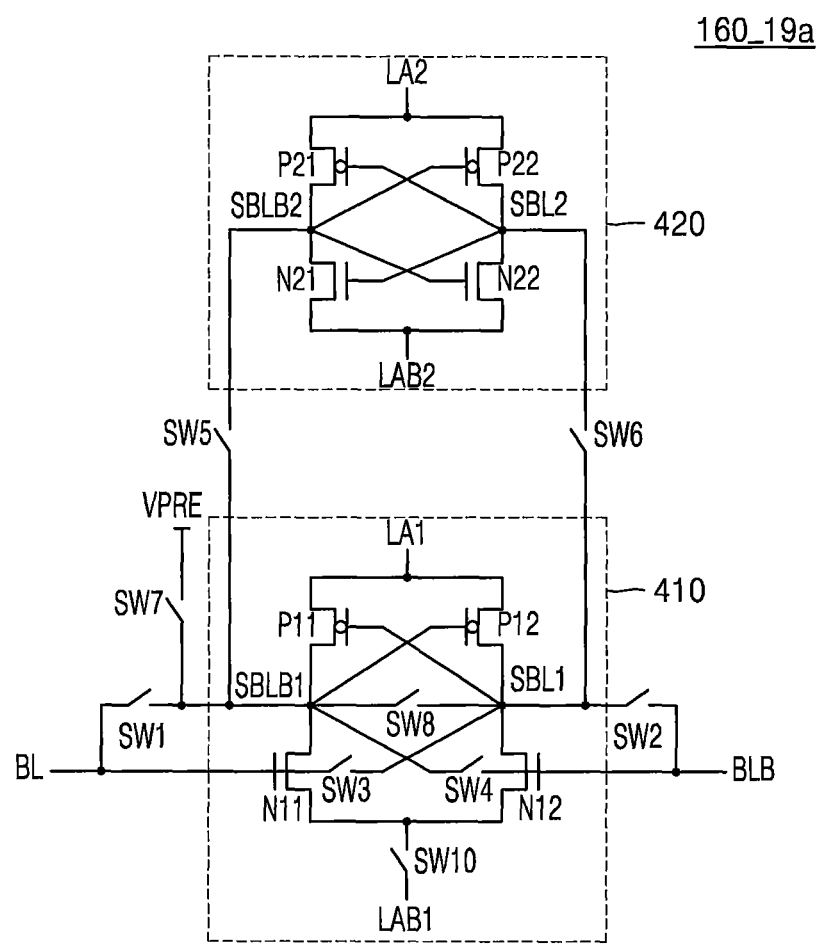
FIGS. 19A to 19F and 20 are circuit diagrams and an operation timing diagram illustrating sense amplifiers according to some embodiments of the inventive concepts.

In comparison with the sense amplifier 160 of FIG. 4, the sense amplifier 160_19*a* of FIG. 19A may further include the seventh switch SW7 and the eighth switch SW8 without including the bit line switch SWa and the complementary bit line switch SWb for connecting the pair of bit lines BL and BLB and the pair of holding bit lines HBL and HBLB. The sense amplifier 160_19*a* may equalize the pair of first sensing bit lines SBL1 and SBLB1 to the pre-charge voltage VPRE before sensing the cell voltage Vcell stored in the memory cell MC by using the seventh switch SW7 and the eighth switch SW8. Therefore, the sense amplifier 160_19*a* may more efficiently perform operations of sensing the cell voltage Vcell stored in the memory cell MC as the MSB and the LSB of the 2-bit data.

Figure 19B:
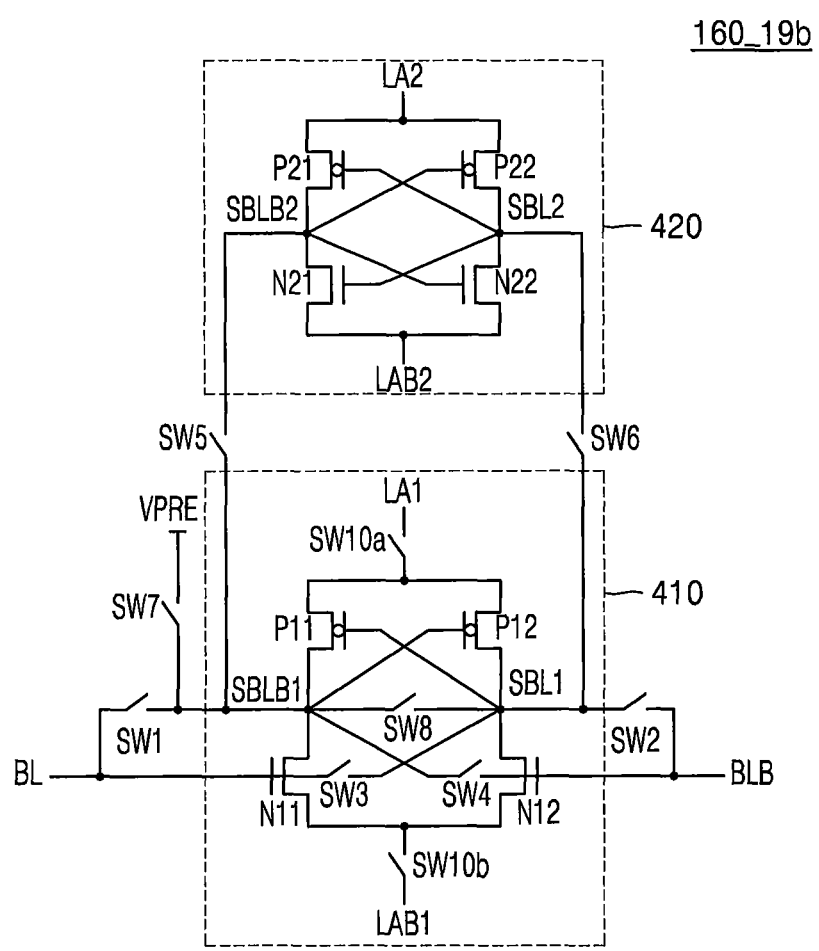

Referring to FIG. 19B, the sense amplifier 160_19*b* is different from the sense amplifier 160_19*a* of FIG. 19A in that the first power switch SW10*a* is connected between the first sensing driving signal LA1 and the first and second PMOS transistors P11 and P12 of the first sense amplifying circuit 410 and the second power switch SW10*b* is connected between the second sensing driving signal LAB1 and the first and second NMOS transistors N11 and N12.

Figure 19C:
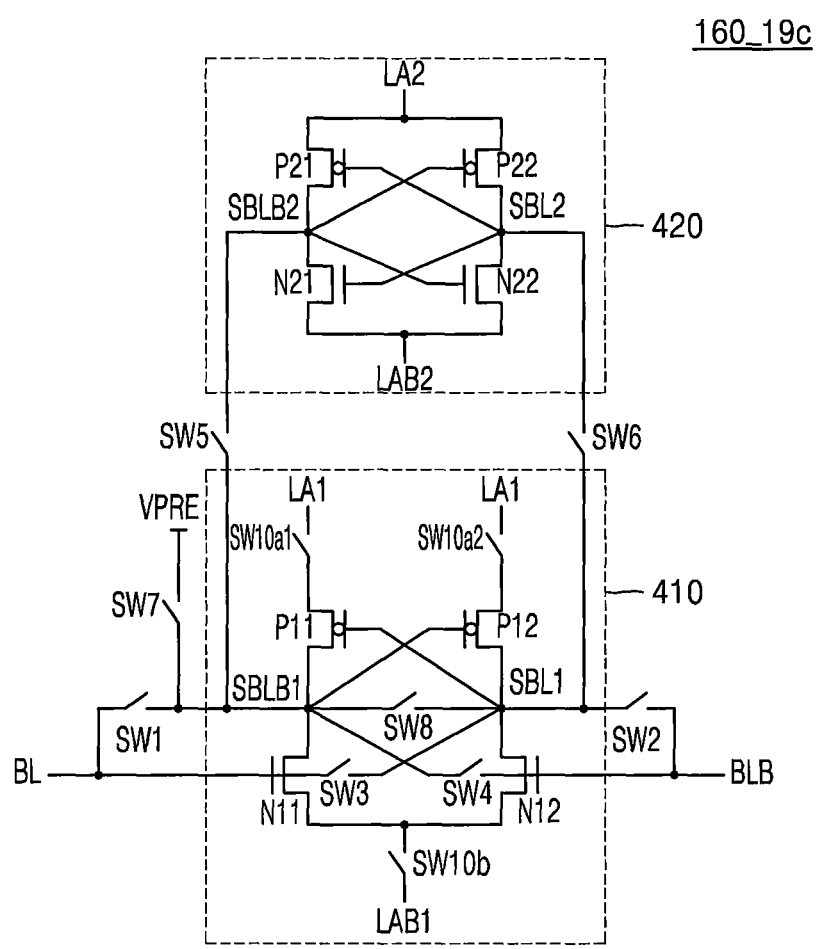

Referring to FIG. 19C, the sense amplifier 160_19*c* is different from the sense amplifier 160_19*b* of FIG. 19B in that the first power switches SW10*a*1 and SW10*a*2 are respectively connected between the first sensing driving signal LA1 and the first PMOS transistor P11 of the first sense amplifying circuit 410 and between the first sensing driving signal LA1 and the second PMOS transistor P12.

Figure 19D:
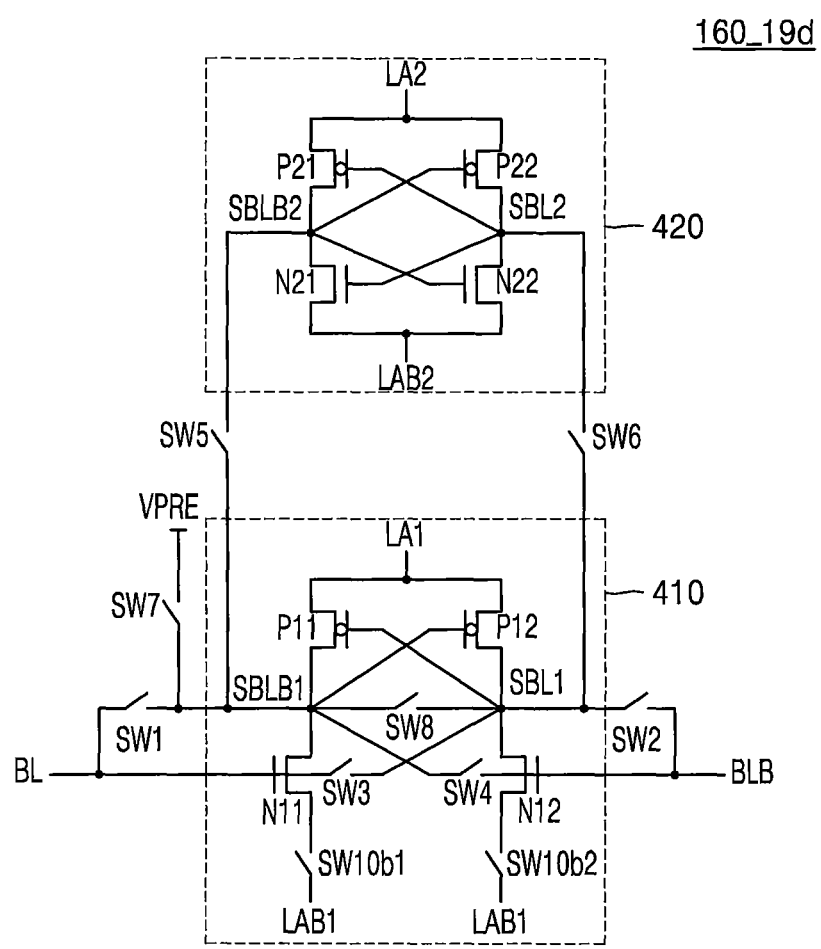

Referring to FIG. 19D, the sense amplifier 160_19*d* is different from the sense amplifier 160_19*a* of FIG. 19A in that the second power switches SW10b1 and SW10b2 are respectively connected between the second sensing driving signal LAB1 and the first NMOS transistor N11 of the first sense amplifying circuit 410 and between the second sensing driving signal LAB1 and the second NMOS transistor N12.

Figure 19E:
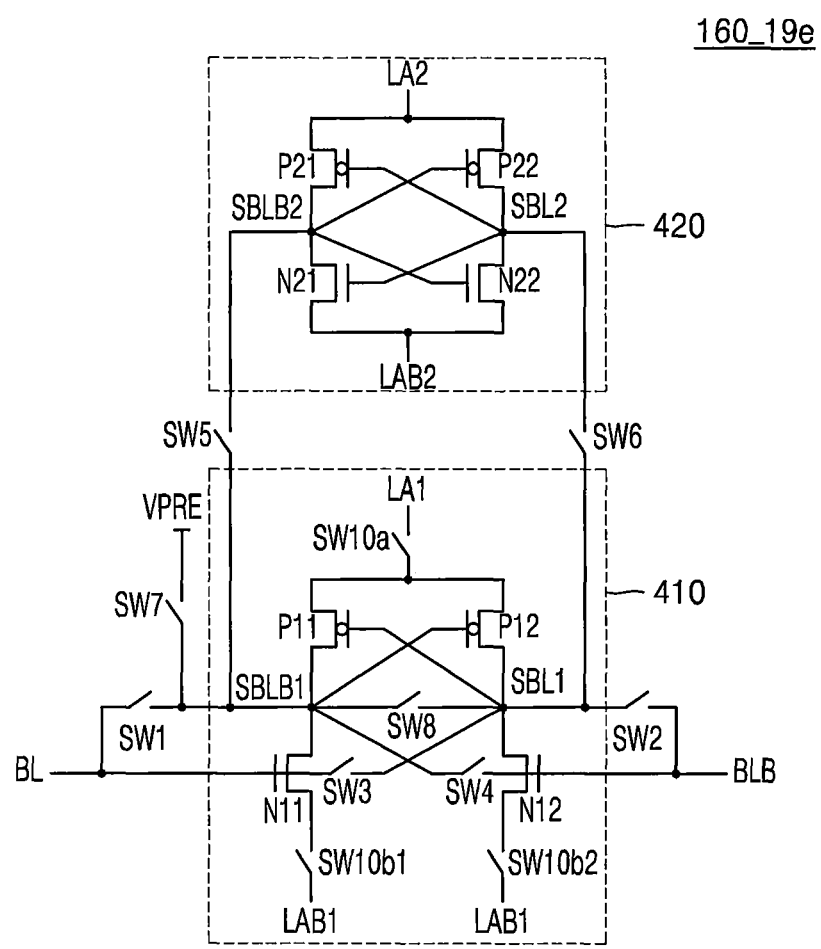

Referring to FIG. 19E, the sense amplifier 160_19e is different from the sense amplifier 160_19b of FIG. 19B in that the second power switches SW10b1 and SW10b2 are respectively connected between the second sensing driving signal LAB1 and the first NMOS transistor N11 of the first sense amplifying circuit 410 and between the second sensing driving signal LAB1 and the second NMOS transistor N12.

Figure 19F:
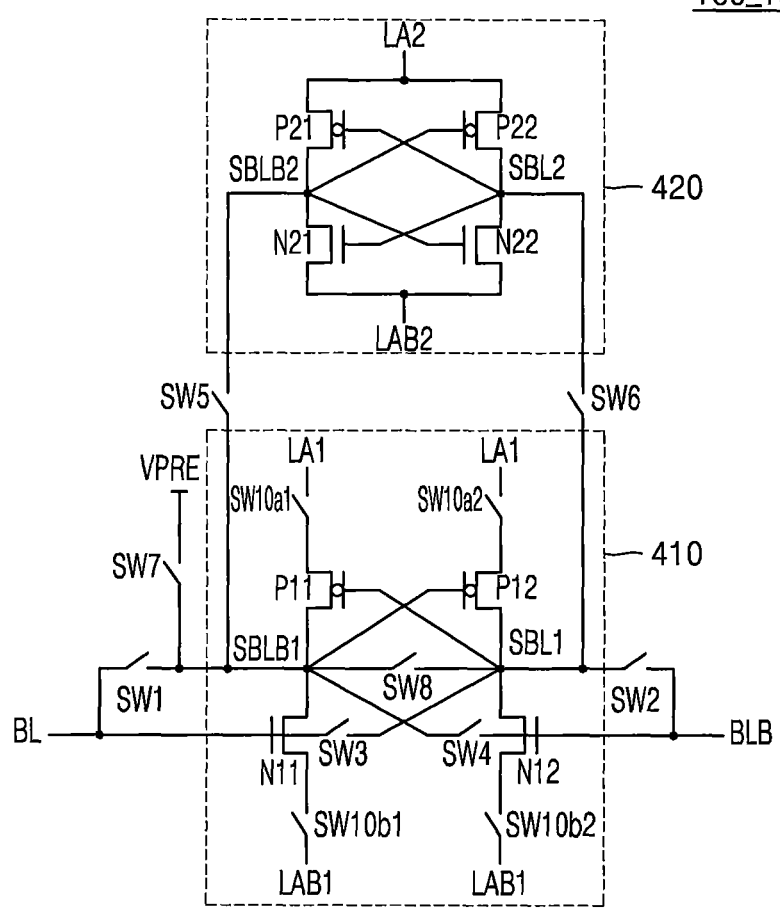

Referring to FIG. 19F, the sense amplifier 160_19f is different from the sense amplifier 160_19c of FIG. 19C in that the second power switches SW10b1 and SW10b2 are respectively connected between the second sensing driving signal LAB1 and the first NMOS transistor N11 of the first sense amplifying circuit 410 and between the second sensing driving signal LAB1 and the second NMOS transistor N12.

In FIGS. 19B to 19F, the sense amplifiers 160_19b to 160_19f may selectively turn on or off the first and second power switches SW10a, SW10b, SW10a1 SW10a2, SW10b1, and SW10b2 in the branches to which the first and second sensing driving signals LA1 and LAB1 of the first sense amplifying circuit 410 are supplied. The first and second PMOS transistors P11 and P12 and the first and second NMOS transistors N11 and N12 of the first sense amplifying circuit 410 operate as power sources independent from each other and may more stably perform sense operations without being affected by power sources that may change in accordance with operations of the neighboring transistors P11, P12, N11, and N12.

Figure 20:
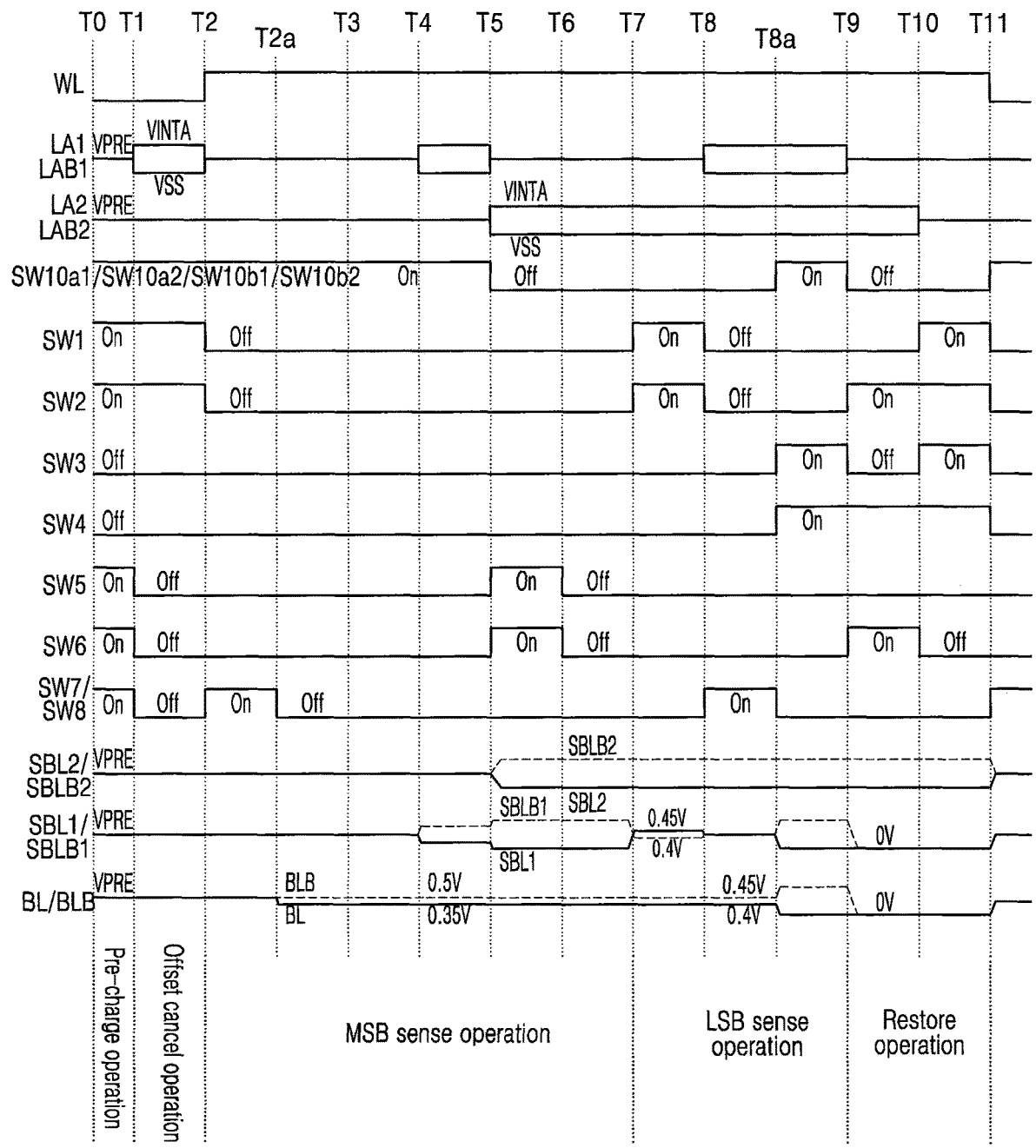

FIG. 20 is a timing diagram of an operation of the sense amplifier 160_19f of FIG. 19F. FIG. 20 is similar to FIG. 16 and illustrates operation of the sense amplifier 160_19f for sensing the cell voltage Vcell of 0 V, which is stored in the memory cell MC, that is, the 2-bit data "00". The timing diagram of operation of the sense amplifier 160_19f of FIG. 20 may be applied to operations of the sense amplifiers 160_19a to 160_19e of FIGS. 19A to 19E. Hereinafter, description will be made with reference to differences with FIG. 16.

In an MSB sense operation period between the point in time T4 and the point in time T6 of FIGS. 19F and 20, the sense amplifier 160_19f may turn off the third and fourth switches SW3 and SW4. At the point in time T4, the first sense amplifying circuit 410 senses the cell voltage Vcell stored in the memory cell MC based on a voltage difference between the bit line BL voltage of 0.35 V and the complementary bit line BLB voltage of 0.5 V, which is applied to gates of the first and second NMOS transistors N11 and N12, and accordingly, the first complementary sensing bit line SBLB1 and the first sensing bit line SBL1 may be developed by a prescribed voltage difference. At the point in time T5, the second sense amplifying circuit 420 senses the cell voltage Vcell stored in the memory cell MC based on a voltage difference between the second complementary sensing bit line SBLB2 connected to the first complementary sensing bit line SBLB1 and the second sensing bit line SBL2 connected to the first sensing bit line SBL1 and accordingly, the voltage of the second complementary sensing bit line SBLB2 is increased to a logic "1" level and the voltage of the second sensing bit line SBL2 may be reduced to a logic "0" level.

In FIG. 20, the sense amplifier 160_19f equalizes the pair of first sensing bit lines SBL1 and SBLB1 before sensing the cell voltage Vcell stored in the memory cell MC, senses the cell voltage Vcell of 0 V, which is stored in the memory cell MC, as the MSB and LSB "00", and may restore the bit line BL voltage of 0 V, which corresponds to the sensed MSB and LSB "00", as the cell voltage Vcell in the memory cell MC.

Operation timings of the third and fourth switches SW3 and SW4 and the seventh and eighth switches SW7 and SW8 of the sense amplifier 160_19f illustrated in FIG. 20 may be applied to an operation timing diagram of sensing the 2-bit data "01" corresponding to the cell voltage Vcell of 0.33 V, which is stored in the memory cell MC of FIG. 10. The sense amplifier 160_19f equalizes the pair of first sensing bit lines SBL1 and SBLB1 before sensing the cell voltage Vcell stored in the memory cell MC, senses the cell voltage Vcell of 0.33 V, which is stored in the memory cell MC, as the MSB and LSB "01", and may restore the bit line BL voltage of 0.33 V, which corresponds to the sensed MSB and LSB "01", as the cell voltage Vcell in the memory cell MC.

Operation timings of the third and fourth switches SW3 and SW4 and the seventh and eighth switches SW7 and SW8 of the sense amplifier 160_19f illustrated in FIG. 20 may be applied to an operation timing diagram of sensing the 2-bit data "10" corresponding to the cell voltage Vcell of 0.67 V, which is stored in the memory cell MC of FIG. 12. The sense amplifier 160_19f equalizes the pair of first sensing bit lines SBL1 and SBLB1 before sensing the cell voltage Vcell stored in the memory cell MC, senses the cell voltage Vcell of 0.67 V, which is stored in the memory cell MC, as the MSB and LSB "10", and may restore the bit line BL voltage of 0.67 V, which corresponds to the sensed MSB and LSB "10", as the cell voltage Vcell in the memory cell MC.

Operation timings of the third and fourth switches SW3 and SW4 and the seventh and eighth switches SW7 and SW8 of the sense amplifier 160_19f illustrated in FIG. 20 may be applied to an operation timing diagram of sensing the 2-bit data "11" corresponding to the cell voltage Vcell of 1.0 V, which is stored in the memory cell MC of FIG. 14. The sense amplifier 160_19f equalizes the pair of first sensing bit lines SBL1 and SBLB1 before sensing the cell voltage Vcell stored in the memory cell MC, senses the cell voltage Vcell of 1.0 V, which is stored in the memory cell MC, as the MSB and LSB "11", and may restore the bit line BL voltage of 1.0 V, which corresponds to the sensed MSB and LSB "11", as the cell voltage Vcell in the memory cell MC.

FIGS. 21A to 21F are circuit diagrams illustrating sense amplifiers 160_21a to 160_21f according to embodiments of the inventive concepts. The sense amplifiers 160_21a to 160_21f of FIGS. 21A to 21F may transmit the sensed MSB and LSB of the 2-bit data to the data input and output circuitry 170 (FIG. 2) through the data input and output lines LIO_MSB, LIOB_MSB, LIO_LSB, and LIOB_LSB. The sense amplifiers 160_21a to 160_21f of FIGS. 21A to 21F will be described based on differences with the above-described sense amplifiers.

Figure 21A:
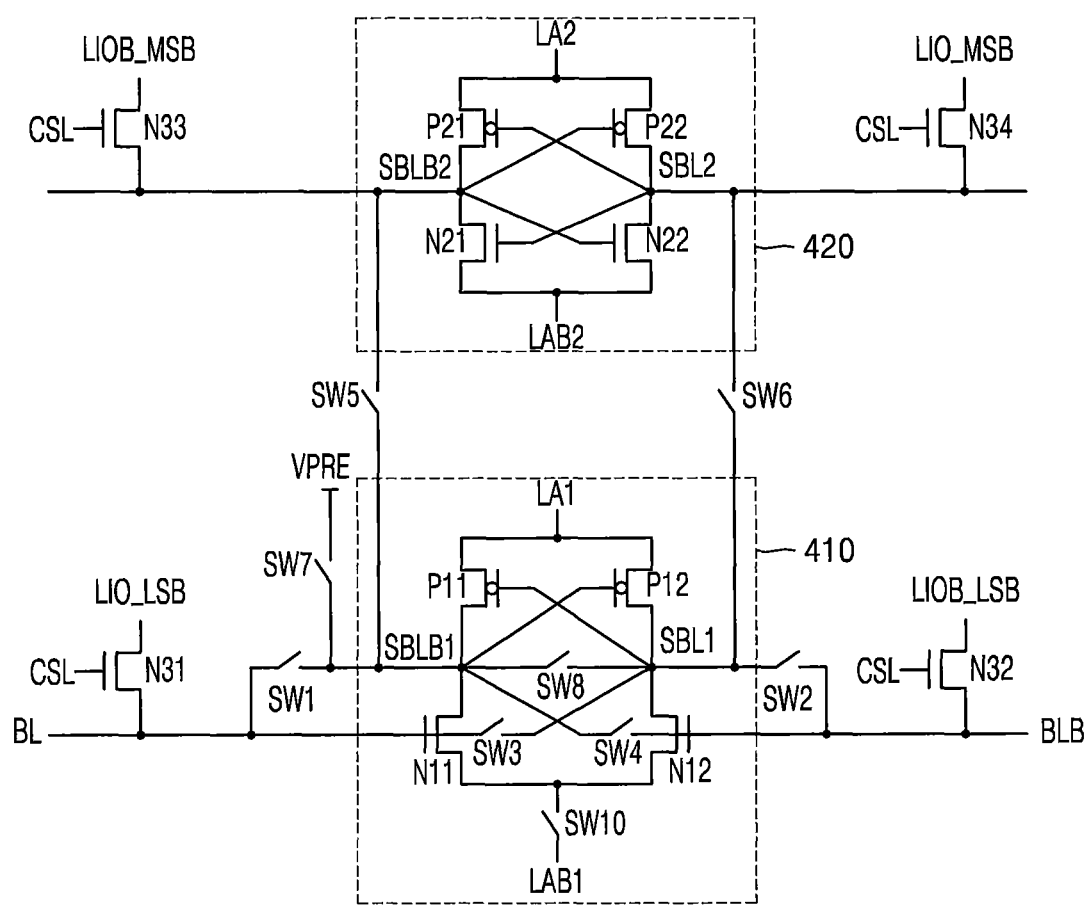
FIGS. 21A to 21F and 22 are circuit diagrams and an operation timing diagram illustrating sense amplifiers according to some embodiments of the inventive concepts.

Referring to FIG. 21A, the sense amplifier 160_21a is different from the sense amplifier 160_19a of FIG. 19A in that the sense amplifier 160_21a is connected to the first to fourth column selection transistors N31 to N34. The sense amplifier 160_21a senses the cell voltage Vcell stored in the memory cell MC as the MSB and the LSB of the 2-bit data, outputs the sensed LSB of the 2-bit data to the first and second data input and output lines LIO_LSB and LIOB_LSB through the first and second column selection transistors N31 and N32, and may output the sensed MSB of the 2-bit data to the third and fourth data input and output lines LIOB_MSB and LIO_MSB through the third and fourth column selection transistors N33 and N34.

Figure 21B:
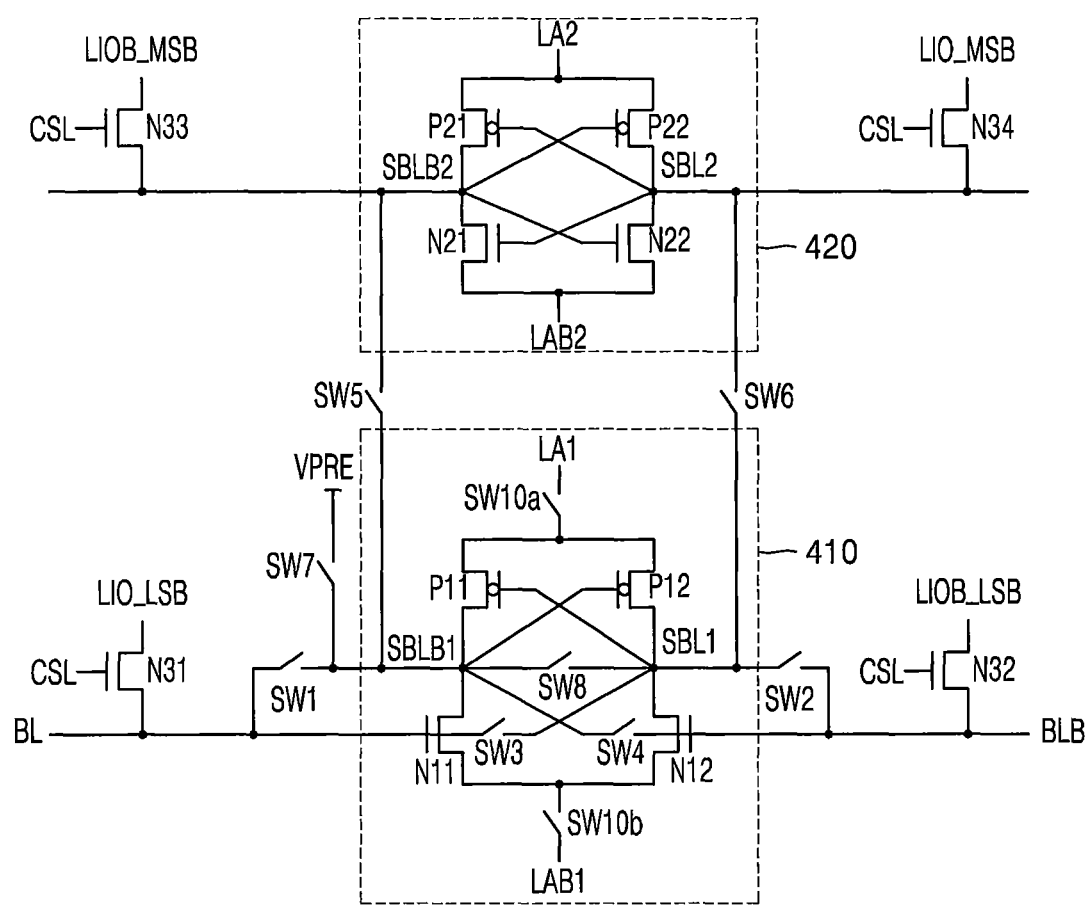

Referring to FIG. 21B, the sense amplifier 160_21*b* is different from the sense amplifier 160_21*a* of FIG. 21A in that the first power switch SW10*a* is connected between the first sensing driving signal LA1 and the first and second PMOS transistors P11 and P12 of the first sense amplifying circuit 410 and the second power switch SW10*b* is connected between the second sensing driving signal LAB1 and the first and second NMOS transistors N11 and N12.

Figure 21C:
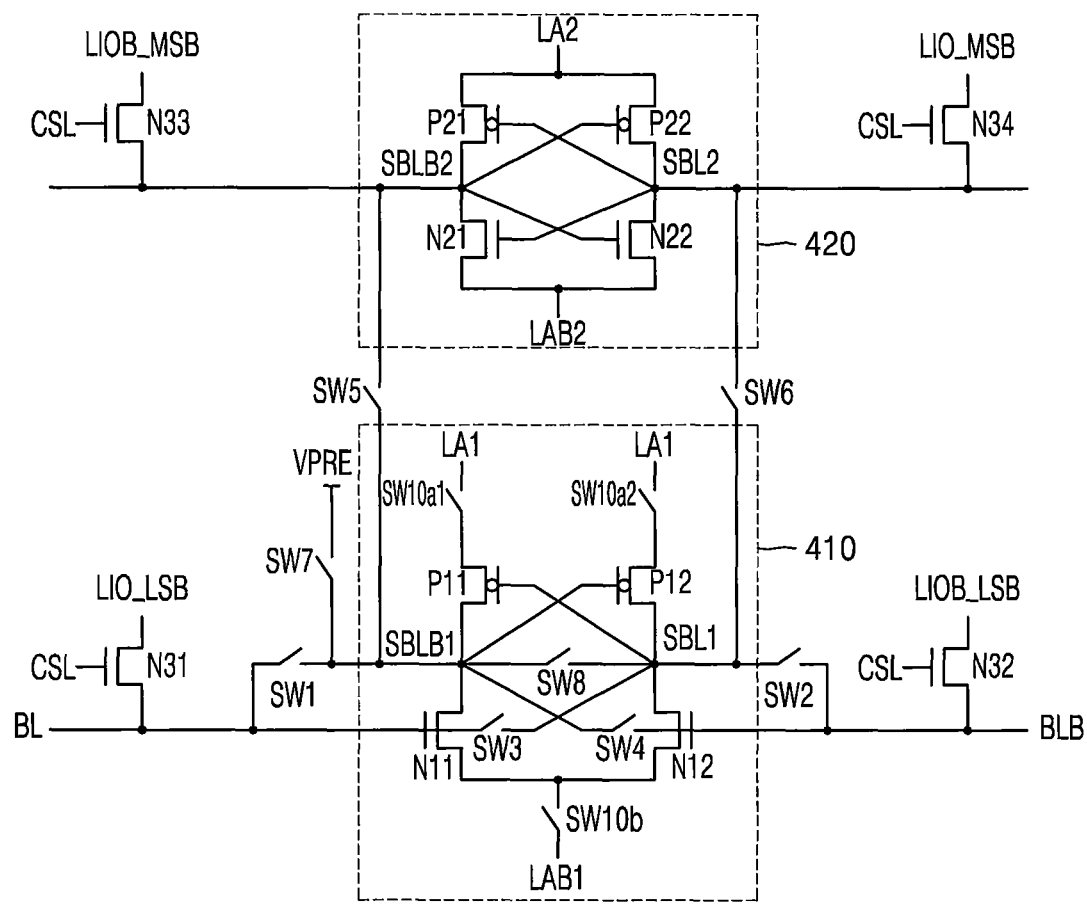

Referring to FIG. 21C, the sense amplifier 160_21*c* is different from the sense amplifier 160_21*b* of FIG. 21B in that the first power switches SW10*a*1 and SW10*a*2 are respectively connected between the first sensing driving signal LA1 and the first PMOS transistor P11 of the first sense amplifying circuit 410 and between the first sensing driving signal LA1 and the second PMOS transistor P12.

Figure 21D:
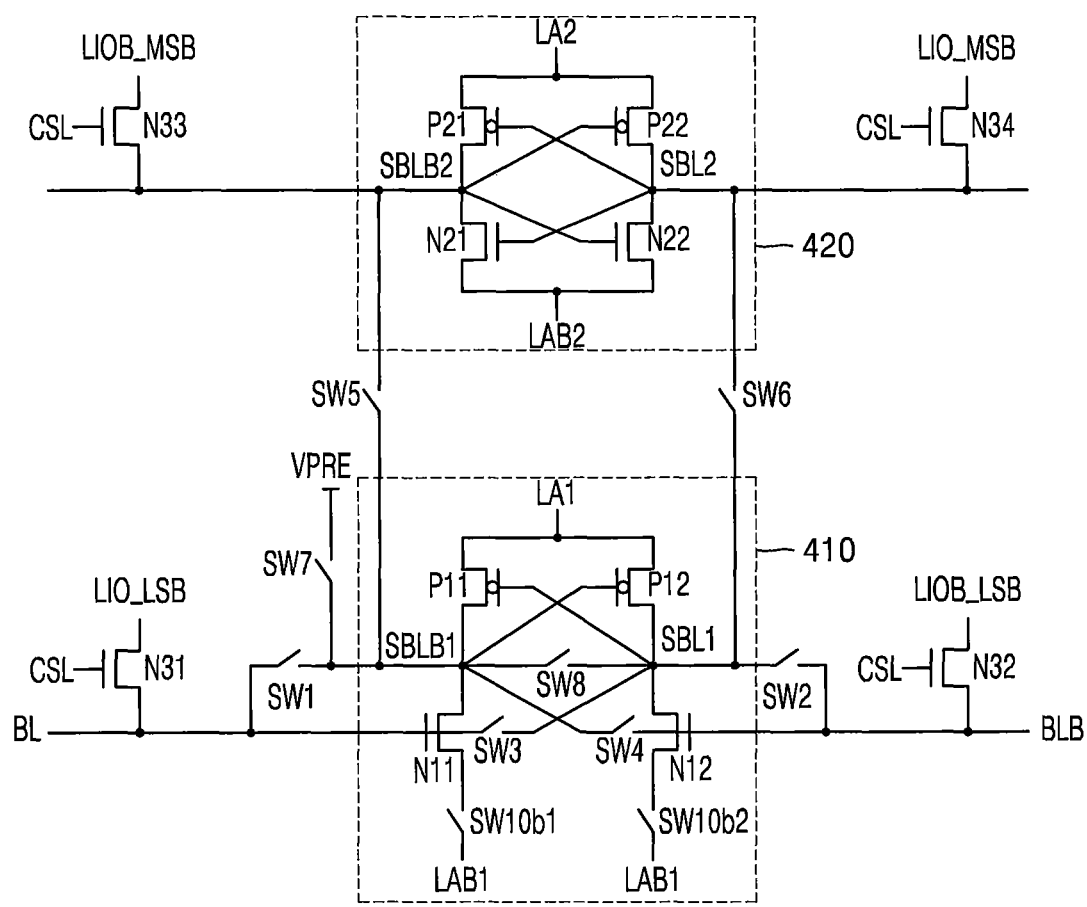

Referring to FIG. 21D, the sense amplifier 160_21*d* is different from the sense amplifier 160_21*a* of FIG. 21A in that the second power switches SW10*b*1 and SW10*b*2 are respectively connected between the second sensing driving signal LAB1 and the first NMOS transistor N11 of the first sense amplifying circuit 410 and between the second sensing driving signal LAB1 and the second NMOS transistor N12.

Figure 21E:
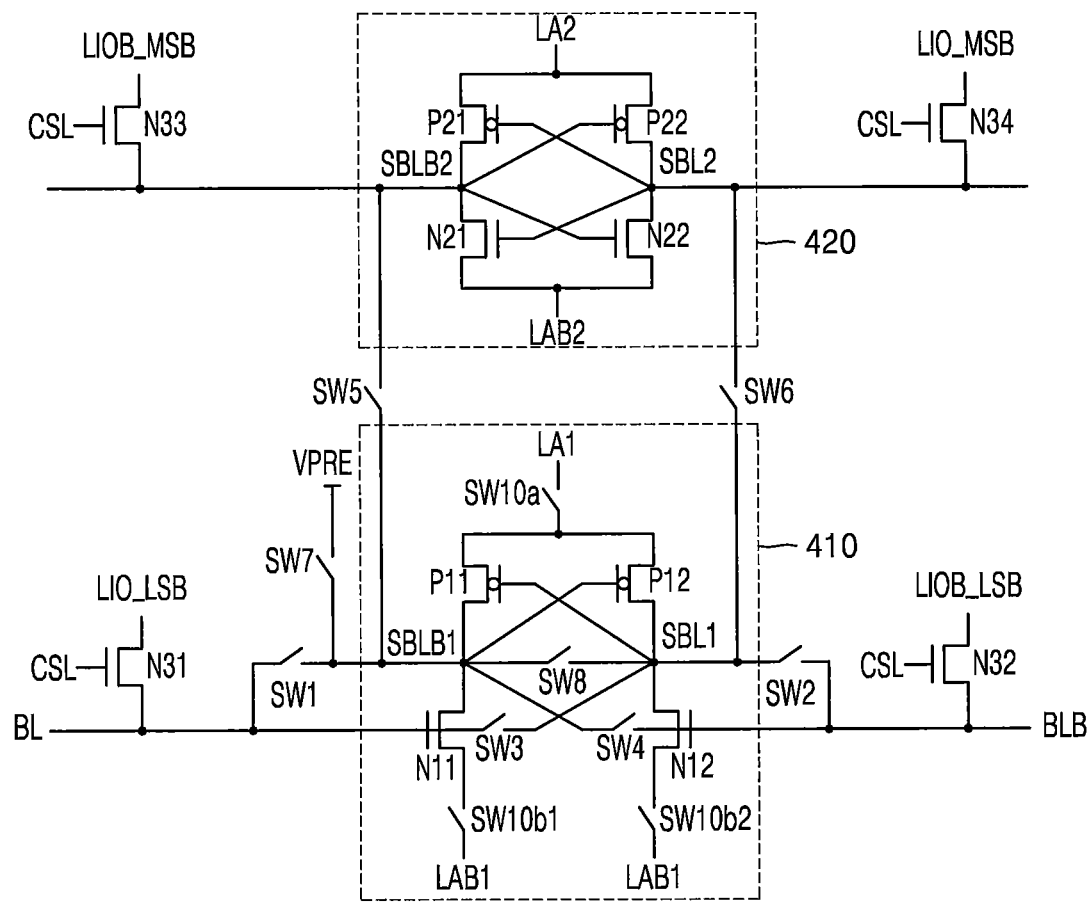

Referring to FIG. 21E, the sense amplifier 160_21*e* is different from the sense amplifier 160_21*b* of FIG. 21B in that the second power switches SW10*b*1 and SW10*b*2 are respectively connected between the second sensing driving signal LAB1 and the first NMOS transistor N11 of the first sense amplifying circuit 410 and between the second sensing driving signal LAB1 and the second NMOS transistor N12.

Figure 21F:
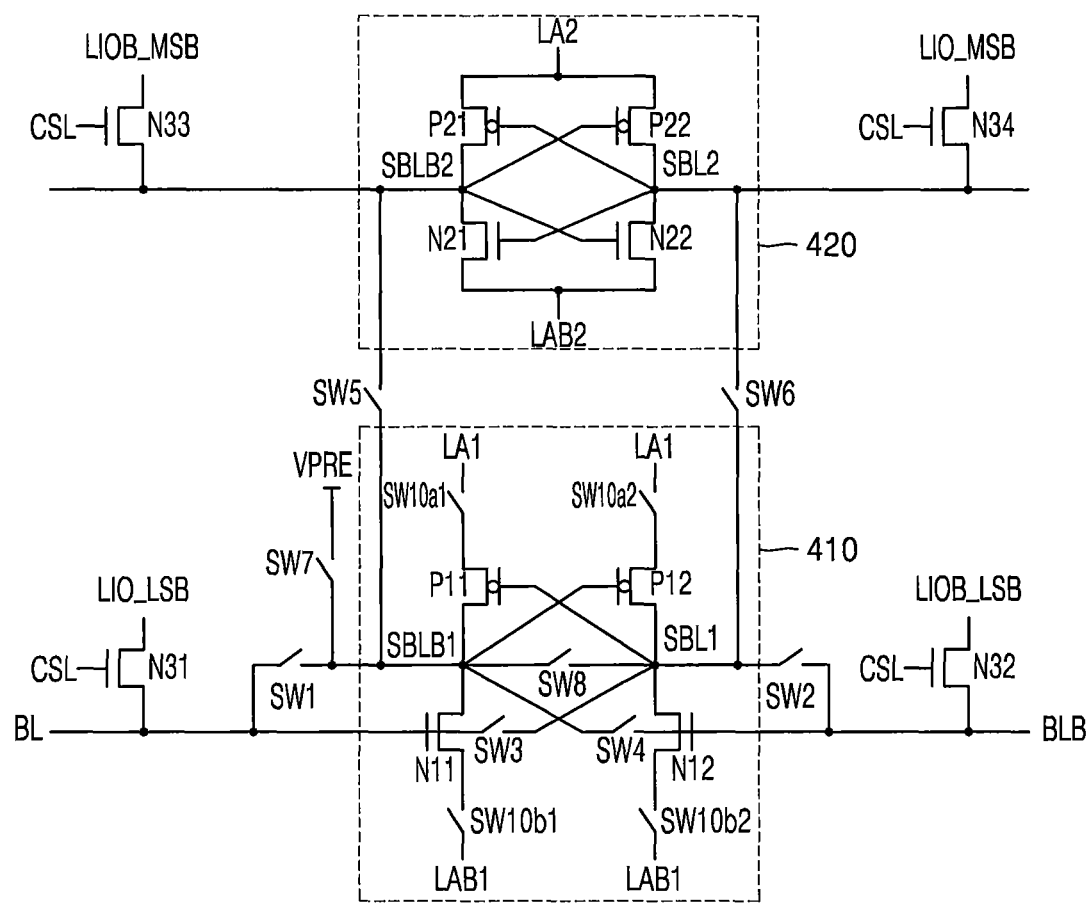

Referring to FIG. 21F, the sense amplifier 160_21*f* is different from the sense amplifier 160_21*c* of FIG. 21C in that the second power switches SW10*b*1 and SW10*b*2 are respectively connected between the second sensing driving signal LAB1 and the first NMOS transistor N11 of the first sense amplifying circuit 410 and between the second sensing driving signal LAB1 and the second NMOS transistor N12.

In FIGS. 21B to 21F, the sense amplifiers 160_21*b* to 160_21*f* may selectively turn on or off the first and second power switches SW10*a*, SW10*b*, SW10*a*1 SW10*a*2, SW10*b*1, and SW10*b*2 in the branches to which the first and second sensing driving signals LA1 and LAB1 of the first sense amplifying circuit 410 are supplied. The first and second PMOS transistors P11 and P12 and the first and second NMOS transistors N11 and N12 of the first sense amplifying circuit 410 operate as power sources independent from each other and may more stably perform sense operations without being affected by power sources that may change in accordance with operations of the neighboring transistors P11, P12, N11, and N12.

Figure 22:
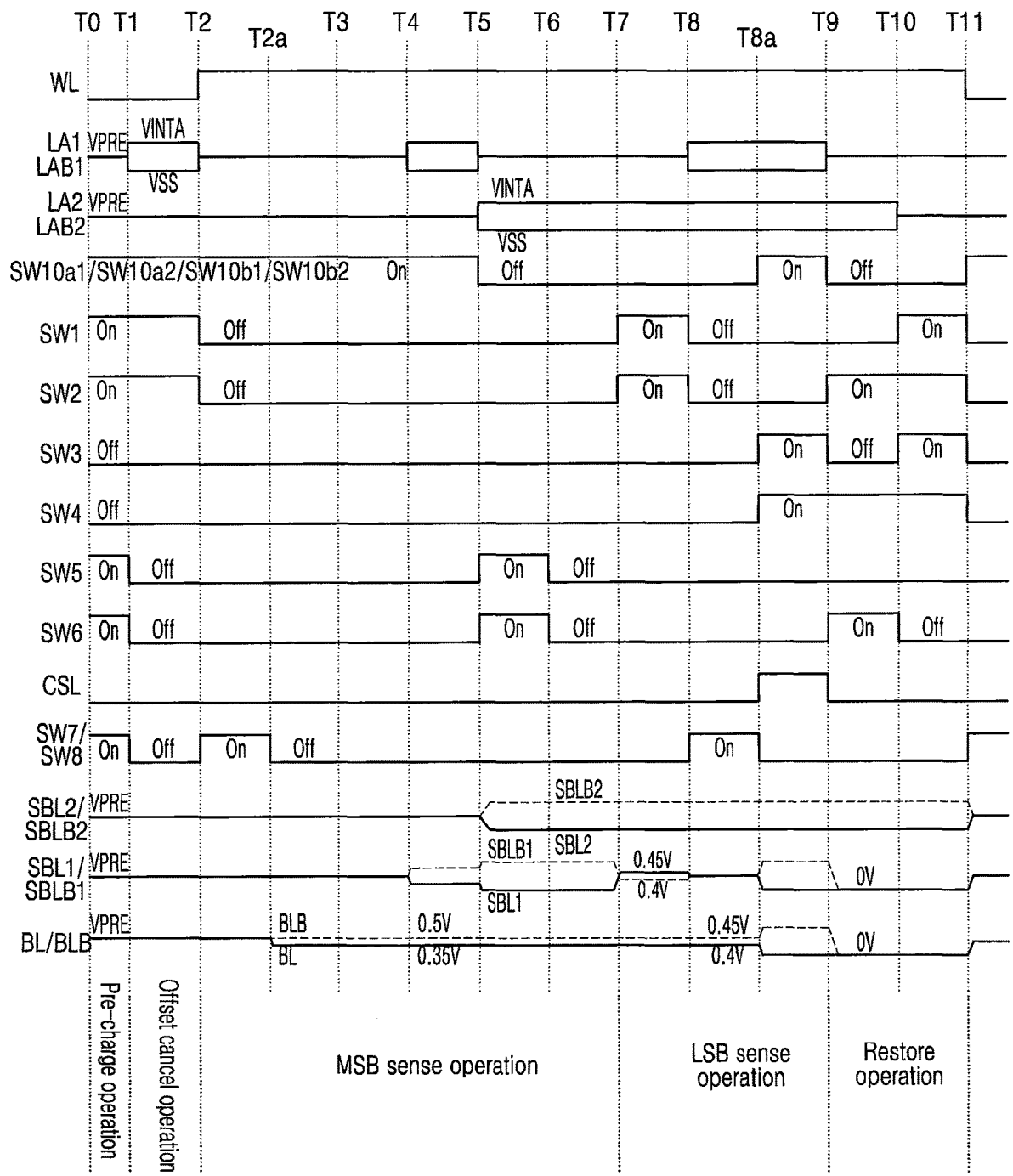

FIG. 22 is a timing diagram of an operation of the sense amplifier 160_21*f* of FIG. 21F. FIG. 22 is similar to FIG. 20 and illustrates an operation timing of the column selection signal CSL for outputting the sensed MSB and LSB of the 2-bit data to the data input and output lines LIO_LSB, LIOB_LSB, LIO_MSB, and LIOB_MSB. Hereinafter, FIG. 22 will be described based on differences with FIG. 20.

In an LSB sensing operation period in which the LSB is sensed between the point in time T8*a* and the point in time T9 of FIGS. 21F and 22, the column selection signal CSL may be activated to a logic high level. At this time, the sensed MSB of the 2-bit data is latched to the second sensing bit line SBL2 of the sense amplifier 160_17*f* and the sensed LSB of the 2-bit data is latched to the bit line BL.

In response to the column selection signal CSL at the logic high level, the first and second column selection transistors N31 and N32 output the sensed LSB of the 2-bit data to the first and second data input and output lines LIO_LSB and LIOB_LSB and the third and fourth column selection transistors N33 and N34 may output the sensed MSB of the 2-bit data to the third and fourth data input and output lines LIO_MSB and LIOB_MSB. Then, the data input and output circuitry 170 (FIG. 2) may serially output the LSBs of the first and second data input and output lines LIO_LSB and LIOB_LSB and the MSBs of the third and fourth data input and output lines LIOB_MSB and LIO_MSB through the data DQ (FIG. 18B) pad or may output the LSBs of the first and second data input and output lines LIO_LSB and LIOB_LSB and the MSBs of the third and fourth data input and output lines LIOB_MSB and LIO_MSB in parallel through the two data pads, that is, the first and second data DQ_MSB and DQ_LSB pads (FIG. 18C) in the read mode of the memory device 100.

Operation timings of the sense amplifier 160_21*f* and the column selection signal CSL, which are illustrated in FIG. 22, may be applied to an operation timing diagram of sensing the 2-bit data "01" corresponding to the cell voltage Vcell of 0.33 V, which is stored in the memory cell MC of FIG. 10. The sense amplifier 160_21*f* senses the cell voltage Vcell of 0.33 V, which is stored in the memory cell MC, as the MSB and LSB "01" and serially outputs the sensed MSB and LSB "01" through the data DQ pad or may output the sensed MSB and LSB "01" in parallel through the two data pads, that is, the first and second data DQ_MSB and DQ_LSB pads.

Operation timings of the sense amplifier 160_21*f* and the column selection signal CSL, which are illustrated in FIG. 22, may be applied to an operation timing diagram of sensing the 2-bit data "10" corresponding to the cell voltage Vcell of 0.67 V, which is stored in the memory cell MC of FIG. 12. The sense amplifier 160_21*f* senses the cell voltage Vcell of 0.67 V, which is stored in the memory cell MC, as the MSB and LSB "10" and serially outputs the sensed MSB and LSB "10" through the data DQ pad or may output the sensed MSB and LSB "10" in parallel through the two data pads, that is, the first and second data DQ_MSB and DQ_LSB pads.

Operation timings of the sense amplifier 160_21*f* and the column selection signal CSL, which are illustrated in FIG. 22, may be applied to an operation timing diagram of sensing the 2-bit data "11" corresponding to the cell voltage Vcell of 1.0 V, which is stored in the memory cell MC of FIG. 14. The sense amplifier 160_21*f* senses the cell voltage Vcell of 1.0 V, which is stored in the memory cell MC, as the MSB and LSB "11" and serially outputs the sensed MSB and LSB "11" through the data DQ pad or may output the sensed MSB and LSB "11" in parallel through the two data pads, that is, the first and second data DQ_MSB and DQ_LSB pads.

Figure 23:
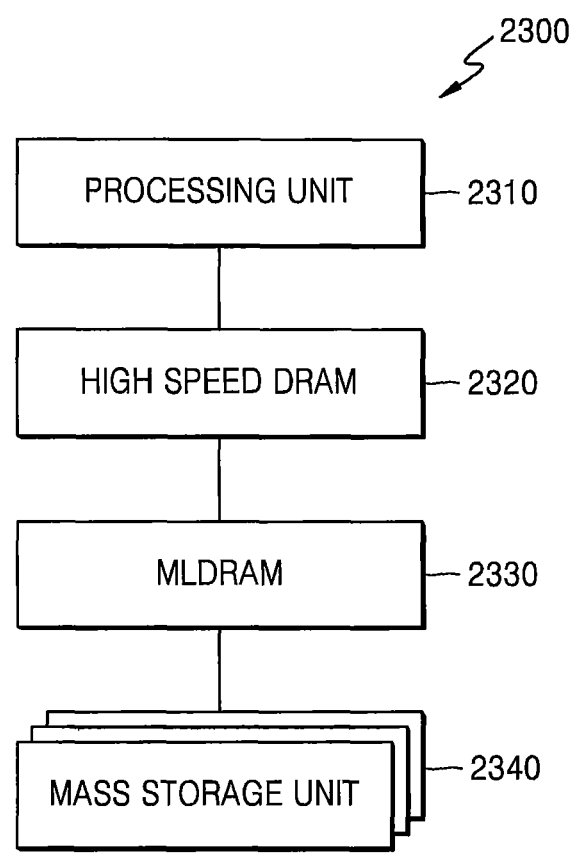
FIG. 23 is a block diagram illustrating an example in which a memory device including a sense amplifier according to each of the embodiments of the inventive concepts is applied to a system.

FIG. 23 is a block diagram illustrating an example in which a memory device including a sense amplifier according to some embodiments of the inventive concepts is applied to a system 2300.

Referring to FIG. 23, the system 2300 may include a processing unit 2310, high speed dynamic random access memory (DRAM) 2320, multilevel DRAM 2330, and a mass storage unit 2340. The system 2300 may be a general-purpose or special-purpose computer system such as a mobile device, a personal computer, a server computer, programmable home appliances, or a main frame computer.

A functional unit described in the current embodiment may be classified as a module for implementation independence. For example, the module may be implemented as a hardware circuit including an existing semiconductor such as a custom very large scale integration (VLSI) circuit, a gate array, a logic chip, a transistor, or another discrete component. The module may be implemented by a programmable hardware device, for example, a programmable gate array, a programmable gate logic, or a programmable gate device. In addition, the module may be implemented by software formed of an executable code, object, procedure, or function.

The processing unit 2310 may execute an operating system and a plurality of software systems and may perform particular calculations or tasks. The processing unit 2310 may be a microprocessor or a central processing unit (CPU).

The high speed DRAM 2320 may temporarily store data or may store data in the short run as operation memory or cache memory of the system 2300. For example, the high speed DRAM 2320 may be synchronous DRAM (SDRAM), double data rate SDRAM (DDR SDRAM), a low power double data rate SDRAM (LPDDR SDRAM), graphics double data rate SDRAM (GDDR SDRAM), DDR2 SDRAM, DDR3 SDRAM, or DDR4 SDRAM.

The multilevel DRAM 2330 may be used to function as a cache of the mass storage unit 2340. The multilevel DRAM 2330 may be the same as or similar to the memory device 100 illustrated in FIG. 1. The multilevel DRAM 2330 includes a memory cell for storing a cell voltage represented as the 2-bit data and a sense amplifier connected between a bit line and a complementary bit line, to which the memory cell is connected, to sense the cell voltage as the MSB and LSB of the 2-bit data. The sense amplifier senses the LSB of the 2-bit data and latches the sensed LSB to a pair of first sensing bit lines, senses the MSB of the 2-bit data and latches the sensed MSB to a pair of second sensing bit lines, and may restore a bit line voltage generated in accordance with the sensed MSB and LSB in the memory cell as the cell voltage. The sense amplifier includes a switching circuit for selectively connecting the holding bit line of the sense amplifier and the bit line of the memory cell. The MSB of the 2-bit data is sensed in a state in which the holding bit line and the bit line are not electrically connected to each other. The LSB of the 2-bit data is sensed in a state in which the holding bit line and the bit line are connected to each other.

The mass storage unit 2340 may be implemented by a solid state drive (SDD), a peripheral component interconnect express (PCIe) memory module, or a non-volatile memory express (NVMe). Optionally, one or more tiers of the mass storage unit 2340 may be implemented by one or more network accessible devices and/or services, for example, NVMe-over fabrics (NVMe-oF) and/or remote direct memory access (RDMA) connected various clients, various servers, server farms, server clusters, application servers, or message servers. The mass storage unit 2340 refers to a storage medium for the system 2300 to store user data in the long term. The mass storage unit 2340 may store an application program and a program data.

While the inventive concepts have been particularly shown and described with reference to examples of embodiments thereof, it will be understood that various changes in form and details may be made therein without departing from the scope of the following claims.

What is claimed is:

1. A sense amplifier comprising:
   at least one sense amplifying circuit configured to sense a least significant bit (LSB) and a most significant bit (MSB) of 2-bit data corresponding to a first cell voltage stored in a memory cell, latch the sensed LSB to a pair of first sensing bit lines, and latch the sensed MSB to a pair of second sensing bit lines; and
   a switching circuit configured to selectively connect a cell bit line to which the memory cell is connected, bit lines of the pair of first sensing bit lines, and bit lines of the pair of second sensing bit lines,
   wherein the at least one sense amplifying circuit is configured to sense the MSB of the 2-bit data using a charge stored in a holding bit line of the sense amplifier in a state in which the cell bit line is electrically disconnected from the holding bit line, and is configured to sense the LSB of the 2-bit data using charges stored in the cell bit line and the holding bit line in a state in which the cell bit line is electrically connected to the holding bit line.

2. The sense amplifier of claim 1,
   wherein the sense amplifier is configured to perform a first charge sharing operation in the sensing of the MSB of the 2-bit data,
   wherein the first charge sharing operation is performed between charges stored in the memory cell and charges stored in the cell bit line and the holding bit line, and
   wherein the first charge sharing operation results in the holding bit line having an MSB voltage level corresponding to the MSB of the 2-bit data, and results in a predetermined difference between the MSB voltage level of the holding bit line and a voltage level of a complementary holding bit line.

3. The sense amplifier of claim 2,
   wherein the at least one sense amplifying circuit comprises a first sense amplifying circuit and a second sense amplifying circuit, wherein the sense amplifier is configured to sense the MSB of the 2-bit data based on the predetermined difference between the voltage level of the holding bit line and the voltage level of the complementary holding bit line using the first sense amplifying circuit, and
   wherein a logic level of the sensed MSB of the 2-bit data is captured by a first sensing bit line of the pair of first sensing bit lines.

4. The sense amplifier of claim 3, wherein the sense amplifier is configured to equalize the pair of first sensing bit lines of the first sense amplifying circuit to a pre-charge voltage level before sensing the MSB of the 2-bit data, and wherein the pre-charge voltage level corresponds to half of a power voltage level provided to the sense amplifier.

5. The sense amplifier of claim 3, wherein the switching circuit is configured to connect bit lines of the pair of first sensing bit lines to bit lines of the pair of second sensing bit lines so that the logic level of the sensed MSB of the 2-bit data is sensed and latched by the second sense amplifying circuit.

6. The sense amplifier of claim 2,
   wherein the sense amplifier is configured to perform a second charge sharing operation in the sensing of the LSB of the 2-bit data,
   wherein the second charge sharing operation comprises charge sharing that occurs between charges stored in the cell bit line and the holding bit line and a charge stored in a first sensing bit line of the pair of first sensing bit lines, and comprises charge sharing that occurs between charges stored in a complementary bit line and a complementary holding bit line and a charge stored in a first sensing bit line of the pair of first sensing bit lines, and
   wherein, the second charge sharing operation results in the cell bit line having a LSB voltage level that corresponds to the LSB of the 2-bit data, and wherein there is a difference between the LSB voltage level of the cell bit line and a voltage level of the complementary bit line.

7. The sense amplifier of claim 6,
wherein the at least one sense amplifying circuit comprises a first sense amplifying circuit and a second sense amplifying circuit,
wherein the sense amplifier is configured to sense the LSB of the 2-bit data based on a difference between a voltage level of the cell bit line and the holding bit line and a voltage level of the complementary bit line and the complementary holding bit line using the first sense amplifying circuit, and
wherein a logic level of the sensed LSB of the 2-bit data is captured by the cell bit line.

8. The sense amplifier of claim 7, wherein the sense amplifier is configured to equalize the pair of first sensing bit lines of the first sense amplifying circuit to a pre-charge voltage level before sensing the LSB of the 2-bit data, wherein the pre-charge voltage level corresponds to half of a power voltage level provided to the sense amplifier.

9. The sense amplifier of claim 1, wherein the sense amplifier is configured to perform a restore operation comprising providing a second cell voltage corresponding to the sensed MSB and LSB of the 2-bit data to the memory cell.

10. The sense amplifier of claim 9, wherein the sense amplifier is configured to perform the restore operation by combining an MSB voltage level corresponding to the MSB of the 2-bit data latched to the second sensing bit lines with an LSB voltage level corresponding to the LSB of the 2-bit data latched to the first sensing bit lines.

11. A sense amplifier comprising:
at least one sense amplifying circuit configured to sense a least significant bit (LSB) and a most significant bit (MSB) of 2-bit data corresponding to a cell voltage stored in a memory cell, latch the sensed LSB to a pair of first sensing bit lines, and latch the sensed MSB to a pair of second sensing bit lines; and
a switching circuit connected to a cell bit line to which the memory cell is connected and the at least one sense amplifying circuit,
wherein the switching circuit comprises:
a bit line switch configured to selectively connect the cell bit line to a holding bit line;
a complementary bit line switch configured to selectively connect a complementary bit line to a complementary holding bit line;
a first switch configured to selectively connect the holding bit line to a complementary first sensing bit line;
a second switch configured to selectively connect the complementary holding bit line to a first sensing bit line;
a third switch configured to selectively connect the holding bit line to the first sensing bit line;
a fourth switch configured to selectively connect the complementary holding bit line to the first complementary sensing bit line;
a fifth switch configured to selectively connect the first complementary sensing bit line and a second complementary sensing bit line; and
a sixth switch configured to selectively connect the first sensing bit line to a second sensing bit line.

12. The sense amplifier of claim 11,
wherein the at least one sense amplifying circuit comprises a first sense amplifying circuit and a second sense amplifying circuit, and wherein the first sense amplifying circuit comprises:

a first PMOS transistor connected between a line of a first sensing driving signal and the first sensing bit line and having a gate to which the first sensing bit line is connected;
a second PMOS transistor connected between the line of the first sensing driving signal and the first complementary sensing bit line and having a gate to which the first complementary sensing bit line is connected;
a first NMOS transistor connected between a line of a second sensing driving signal and a first complementary sensing bit line and having a gate to which the holding bit line is connected; and
a second NMOS transistor connected between the line of the second sensing driving signal and a first sensing bit line and having a gate to which the holding complementary bit line is connected,
wherein the first sense amplifying circuit is turned on when a power voltage is applied to the first sensing driving signal and a ground voltage is applied to the second sensing driving signal and is turned off when a pre-charge voltage corresponding to half of the power voltage is applied to the first and second sensing driving signals.

13. The sense amplifier of claim 12, wherein the switching circuit further comprises:
a seventh switch configured to selectively connect a line of the pre-charge voltage and the first complementary sensing bit line; and
an eighth switch configured to selectively connect the first sensing bit line to the first complementary sensing bit line.

14. The sense amplifier of claim 12, wherein the second sense amplifying circuit comprises:
a third PMOS transistor connected between a line of a third sensing driving signal and the second sensing bit line and having a gate connected to the second sensing bit line;
a fourth PMOS transistor connected between the line of the third sensing driving signal and the second complementary sensing bit line and having a gate connected to the second complementary sensing bit line;
a third NMOS transistor connected between a line of a fourth sensing driving signal and a second complementary sensing bit line and having a gate connected to the second complementary sensing bit line; and
a fourth NMOS transistor connected between the line of the fourth sensing driving signal and a second sensing bit line and having a gate connected to the second sensing bit line,
wherein the second sense amplifying circuit is turned on when the power voltage is applied as the third sensing driving signal and the ground voltage is applied as the fourth sensing driving signal and is turned off when the pre-charge voltage is applied as the third and fourth sensing driving signals.

15. The sense amplifier of claim 14, wherein the switching circuit further comprises:
first column selection transistors configured to selectively connect the cell bit line and the complementary bit line to first and second data input and output lines in response to a column selection signal; and
second column selection transistors configured to selectively connect the second sensing bit line and the second complementary sensing bit line to third and fourth data input and output lines in response to the column selection signal.

16. A memory device comprising:

a memory cell configured to store a cell voltage representing 2-bit data;

a sense amplifier connected between a cell bit line to which the memory cell is connected and a complementary bit line and configured to sense from the cell voltage a most significant bit (MSB) and a least significant bit (LSB) of the 2-bit data; and data output circuitry configured to output the sensed MSB and LSB of the 2-bit data via at least one data pad, wherein the sense amplifier is configured to sense the MSB of the 2-bit data in a state in which the cell bit line is electrically disconnected from a holding bit line of the sense amplifier using a charge stored in the holding bit line, and is configured to sense the LSB of the 2-bit data in a state in which the cell bit line is electrically connected to the holding bit line using charges stored in the cell bit line and the holding bit line.

17. The memory device of claim 16, wherein the sense amplifier is configured to perform a restore operation that comprises providing a restoring cell voltage that corresponds to the sensed MSB and LSB of the 2-bit data to the memory cell.

18. The memory device of claim 16, wherein the data output circuitry serially outputs the sensed MSB and LSB, in either order, via the at least one data pad.

19. The memory device of claim 16, wherein the at least one data pad comprises two data pads, and wherein the data output circuitry outputs the sensed MSB and LSB in parallel through the two data pads.

20. The memory device of claim 16, wherein before sensing the MSB of the 2-bit data the sense amplifier is configured to equalize a pair of sensing bit lines of the sense amplifier to a pre-charge voltage level that corresponds to a half of a power voltage level provided to the sense amplifier.

* * * * *